US012618911B2

(12) United States Patent　　　　(10) Patent No.: US 12,618,911 B2
Naito et al.　　　　　　　　　　　　(45) Date of Patent: May 5, 2026

(54) BATTERY CONTROL DEVICE

(71) Applicant: Vehicle Energy Japan Inc.,
　　　　　　Hitachinaka (JP)

(72) Inventors: Shunya Naito, Tokyo (JP); Ryohhei
　　　　　　Nakao, Tokyo (JP); Daiki Komatsu,
　　　　　　Tokyo (JP)

(73) Assignee: VEHICLE ENERGY JAPAN INC.,
　　　　　　Hitachinaka (JP)

( * ) Notice:　Subject to any disclaimer, the term of this
　　　　　　patent is extended or adjusted under 35
　　　　　　U.S.C. 154(b) by 0 days.

(21) Appl. No.: 18/749,560

(22) Filed:　Jun. 20, 2024

(65)　　　　　Prior Publication Data

US 2024/0337699 A1　　Oct. 10, 2024

Related U.S. Application Data

(63)　Continuation of application No. 17/288,800, filed as
　　　application No. PCT/JP2019/038752 on Oct. 1, 2019,
　　　now abandoned.

(30)　　　Foreign Application Priority Data

Oct. 26, 2018　　(JP) ................................. 2018-201527

(51)　Int. Cl.
　　　*G01R 31/3842*　　　(2019.01)
　　　*G01R 31/374*　　　(2019.01)
　　　　　　　　(Continued)

(52)　U.S. Cl.
　　　CPC ....... *G01R 31/3842* (2019.01); *G01R 31/374*
　　　　　　(2019.01); *G01R 31/392* (2019.01);
　　　　　　　　(Continued)

(58)　Field of Classification Search
　　　CPC .............. G01R 31/3842; G01R 31/374; G01R
　　　　　　　　31/392; G01R 31/387; H01M 10/425;
　　　　　　　　(Continued)

(56)　　　　　References Cited

U.S. PATENT DOCUMENTS 10,670,659　B2　　6/2020　Kawamura et al.
2008/0297113　A1*　12/2008　Saeki ................. H01M 16/006
　　　　　　　　　　　　　　　　　　　320/128
　　　　　　　(Continued)

FOREIGN PATENT DOCUMENTS

CN　　　　104714181　A　　6/2015
CN　　　　106802394　A　　6/2017
　　　　　　　　(Continued)

OTHER PUBLICATIONS

Decision of Refusal dated Apr. 4, 2023 issued in JP Application No.
2020-553028, with English translation, 14 pages.
　　　　　　　　(Continued)

*Primary Examiner* — Catherine T. Rastovski
*Assistant Examiner* — Lal Ce Mang
(74) *Attorney, Agent, or Firm* — FOLEY & LARDNER
LLP

(57)　　　　　ABSTRACT

A battery control device which obtains a state of charge of
a secondary battery from characteristics representing a rela-
tionship of a state of charge and a voltage of the secondary
battery comprises a calling unit which calls a first charac-
teristic among a plurality of the characteristics stored in
advance based on use history information of the secondary
battery, a correction limit width designation unit which
designates a correction limit width for prescribing a toler-
ance level of correcting the first characteristic, and a direct
detection correction unit which creates a second character-
istic in which the first characteristic has been corrected
according to the correction limit width based on a current
value and a voltage value of the secondary battery, wherein
the state of charge of the secondary battery is obtained using
the second characteristic.

11 Claims, 33 Drawing Sheets

(51) Int. Cl.

| | |
|---|---|
| *G01R 31/392* | (2019.01) |
| *H01M 10/42* | (2006.01) |
| *H01M 10/48* | (2006.01) |
| *H02J 7/00* | (2006.01) |

(52) U.S. Cl.
CPC ......... *H01M 10/425* (2013.01); *H01M 10/48* (2013.01); *H01M 10/486* (2013.01); *H02J 7/0048* (2020.01); *H02J 7/005* (2020.01); *H01M 2010/4278* (2013.01)

(58) Field of Classification Search
CPC .... H01M 10/48; H01M 10/486; H01M 10/44; H01M 2010/4278; H01M 2010/4271; H02J 7/0048; H02J 7/005; H02J 2310/48; Y02E 60/10
See application file for complete search history.

(56) References Cited

U.S. PATENT DOCUMENTS

| | | | |
|---|---|---|---|
| 2009/0160403 A1 | 6/2009 | Takeno et al. | |
| 2010/0010707 A1 | 1/2010 | Izumi et al. | |
| 2012/0248873 A1* | 10/2012 | Oudalov ................... | H02J 3/32 307/52 |
| 2013/0314042 A1 | 11/2013 | Boehm et al. | |
| 2016/0179116 A1* | 6/2016 | Bacque ................... | G05F 1/625 700/298 |
| 2019/0033391 A1* | 1/2019 | Iwane .................. | G01R 31/374 |
| 2019/0044345 A1 | 2/2019 | Komiyama et al. | |
| 2019/0235030 A1 | 8/2019 | Yoshida | |

FOREIGN PATENT DOCUMENTS

| | | | | | |
|---|---|---|---|---|---|
| JP | 2005083970 A | * | 3/2005 | ............. | Y02E 60/10 |
| JP | 2013-057537 A | | 3/2013 | | |
| JP | 2015-040832 A | | 3/2015 | | |
| JP | 2016-114469 A | | 6/2016 | | |
| JP | 6187302 B2 | * | 8/2017 | ............. | Y02T 10/62 |
| JP | 2017223537 A | * | 12/2017 | ......... | G01R 31/3648 |
| JP | 2018-048913 A | | 3/2018 | | |
| WO | WO-2011/090020 A1 | | 7/2011 | | |

OTHER PUBLICATIONS

Extended European Search Report dated Dec. 14, 2022 issued in EP Application No. 19876142.1, 7 pages.
Final Office Action on U.S. Appl. No. 17/288,800 DTD Dec. 20, 2023.
International Search Report issued in International Application No. PCT/JP2019/038752 dated Dec. 10, 2019.
Non-Final Office Action on U.S. Appl. No. 17/288,800 DTD Jun. 9, 2023.
Notice of Reasons for Refusal dated May 31, 2022 issued in JP Application No. 2020-553028, with English translation, 14 pages.
Notice of Reasons for Refusal dated Nov. 22, 2022 issued in JP Application No. 2020-553028, with English translation, 12 pages.
Notification of First Office Action dated May 11, 2023 issued in CN Application No. 201980070809.2, with English translation, 11 pages.

* cited by examiner

FIG. 2

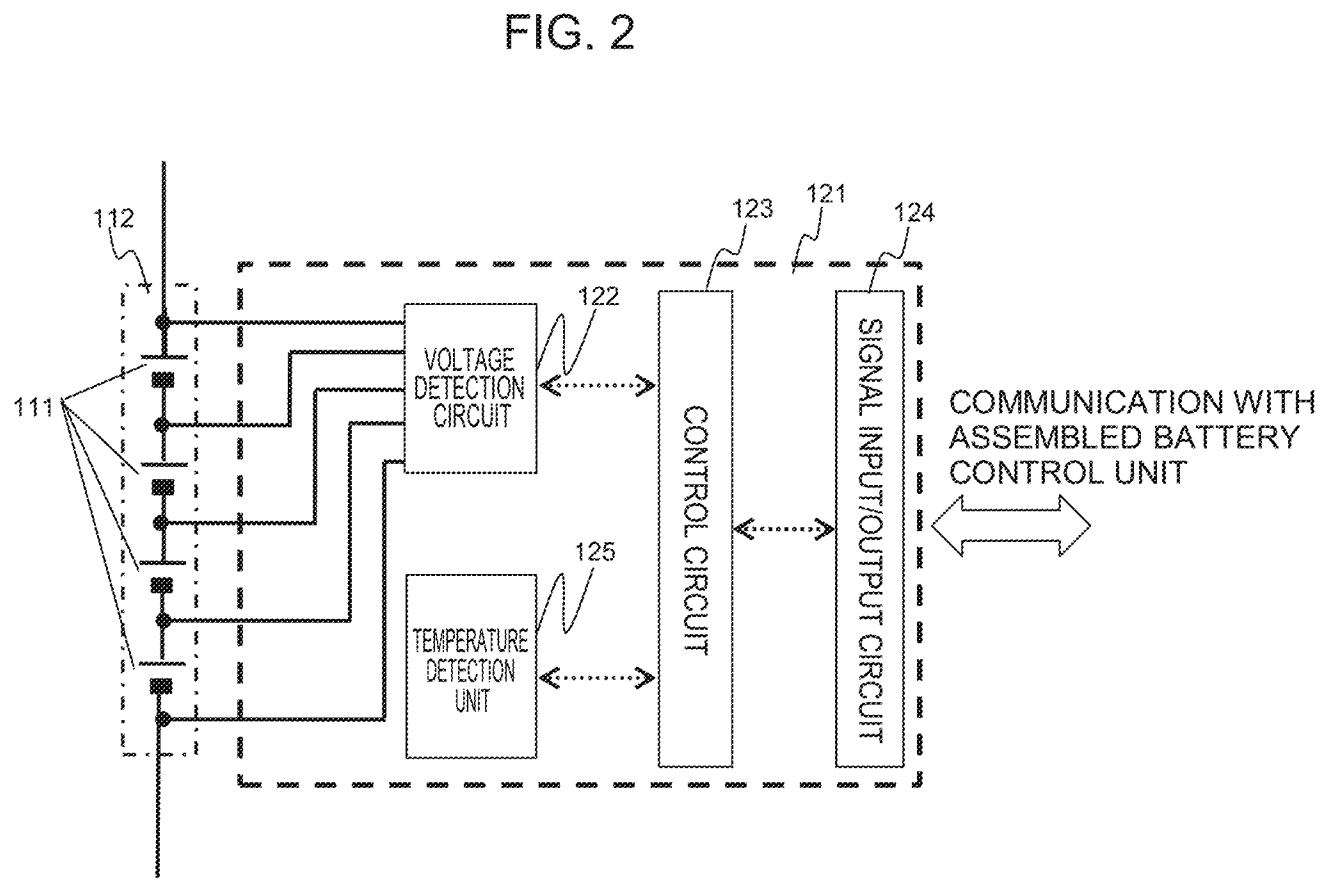

COMMUNICATION WITH ASSEMBLED BATTERY CONTROL UNIT

124 — SIGNAL INPUT/OUTPUT CIRCUIT

121

123 — CONTROL CIRCUIT

122 — VOLTAGE DETECTION CIRCUIT

125 — TEMPERATURE DETECTION UNIT

RESULT WITHIN WIDTH

RESULT OUTSIDE WIDTH

Figure 25:
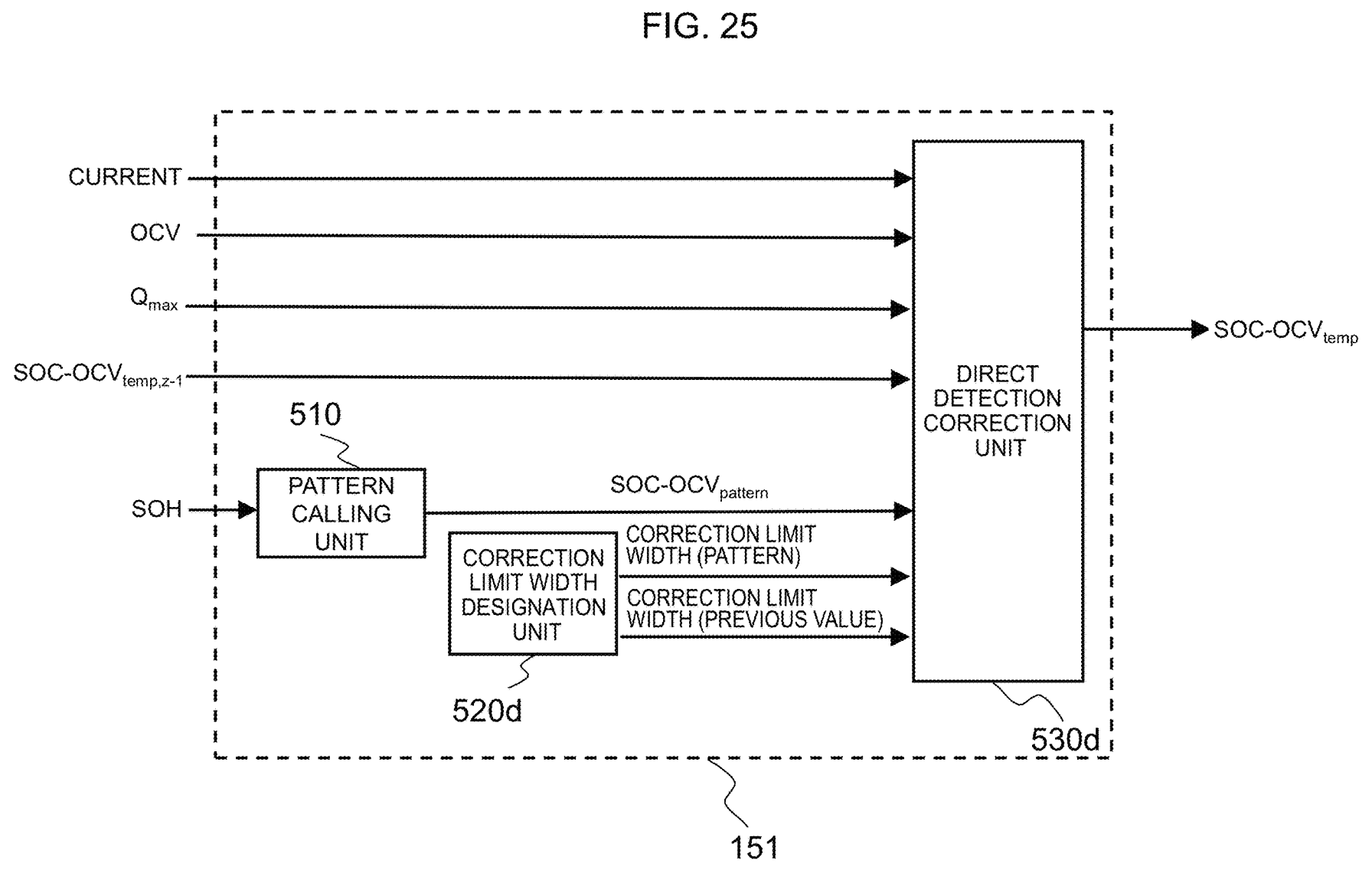

SOC-OCV$_{temp}$

CURRENT

OCV

Q$_{max}$

SOC-OCV$_{temp,z-1}$

SOH

DIRECT DETECTION CORRECTION UNIT 530d

SOC-OCV$_{pattern}$

CORRECTION LIMIT WIDTH (PATTERN)

CORRECTION LIMIT WIDTH (PREVIOUS VALUE)

CORRECTION LIMIT WIDTH DESIGNATION UNIT 520d

PATTERN CALLING UNIT 510

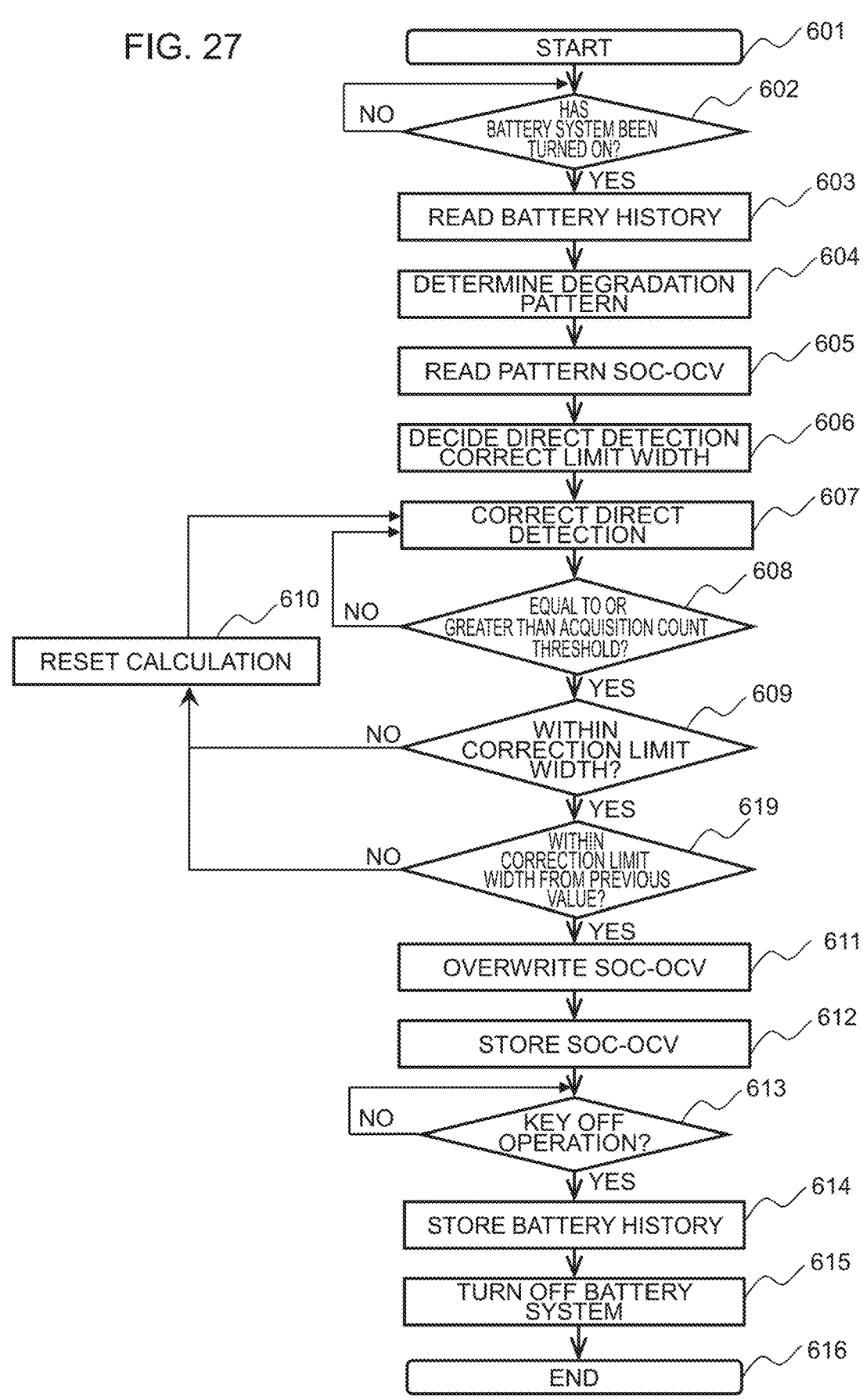

601 START

602 HAS BATTERY SYSTEM BEEN TURNED ON?     NO

603 READ BATTERY HISTORY

604 DETERMINE DEGRADATION PATTERN

605 READ PATTERN SOC-OCV

606 DECIDE DIRECT DETECTION CORRECT LIMIT WIDTH

607 CORRECT DIRECT DETECTION

608 EQUAL TO OR GREATER THAN ACQUISITION COUNT THRESHOLD?     NO

610 RESET CALCULATION

609 WITHIN CORRECTION LIMIT WIDTH?     NO

619 WITHIN CORRECTION LIMIT WIDTH FROM PREVIOUS VALUE?     NO

611 OVERWRITE SOC-OCV

612 STORE SOC-OCV

613 KEY OFF OPERATION?     NO

614 STORE BATTERY HISTORY

615 TURN OFF BATTERY SYSTEM

616 END

Figure 29:
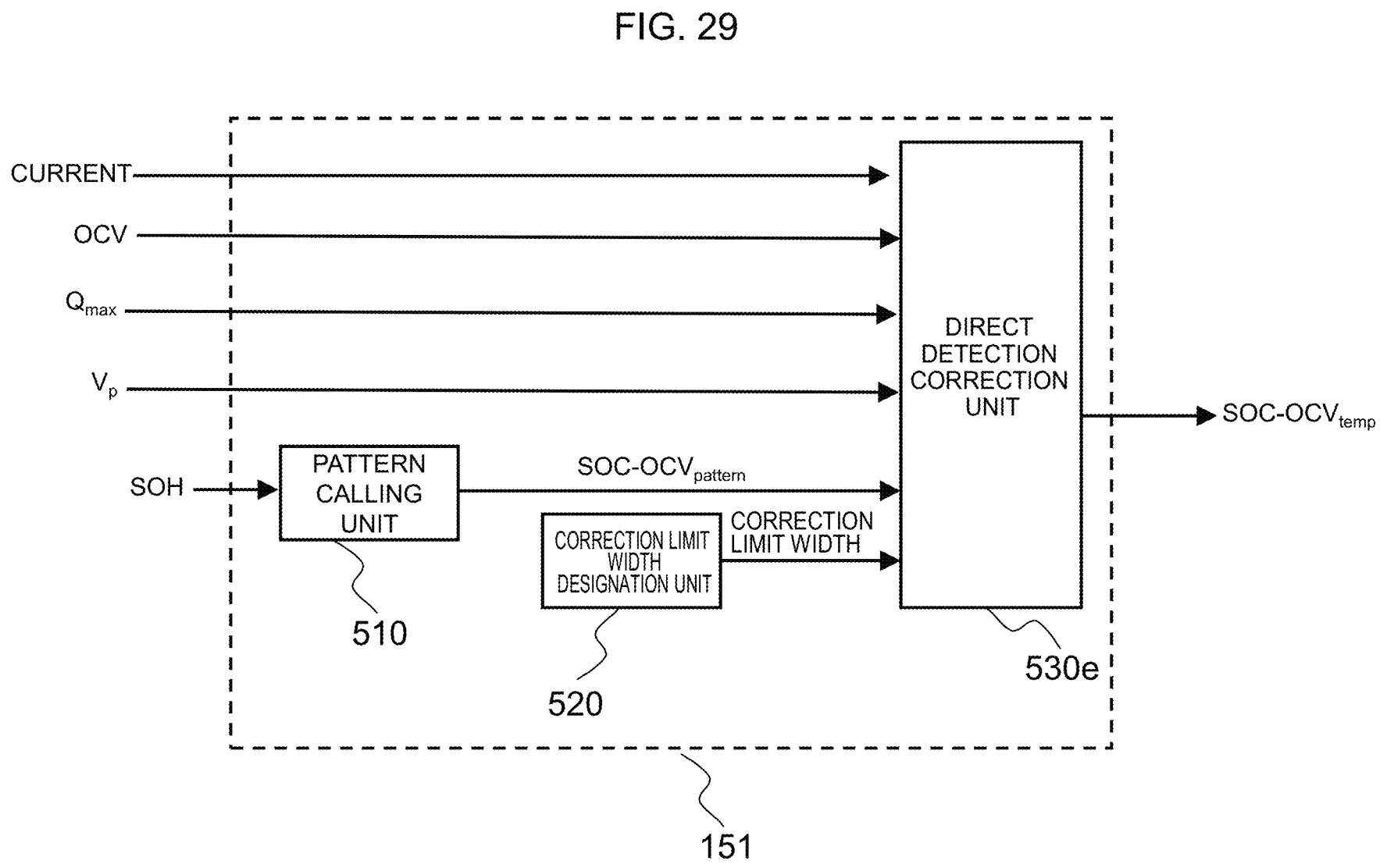

CURRENT

OCV $Q_{max}$ $V_p$

SOH

PATTERN CALLING UNIT

510

CORRECTION LIMIT WIDTH DESIGNATION UNIT

520

$SOC\text{-}OCV_{pattern}$

CORRECTION LIMIT WIDTH

DIRECT DETECTION CORRECTION UNIT

530e $SOC\text{-}OCV_{temp}$

BATTERY CONTROL DEVICE

TECHNICAL FIELD

The present invention relates to a battery control device.

BACKGROUND ART

Conventionally, chargeable/dischargeable secondary batteries have been used in a variety of fields including mobile phones and other mobile terminals, and in the stabilization of power system interconnections. Furthermore, in recent years, electric vehicles, hybrid vehicles and other vehicles that use the power of secondary batteries as its power source are attracting attention in light of global warming countermeasures, emission controls, and measures for preventing the depletion of fossil fuels. A system equipped with these secondary batteries generally comprises a battery control device for using the batteries safely and for maximizing the performance of the batteries. A battery control device detects the voltage, temperature and current of the batteries, and operates battery parameters such as the state of charge (SOC) and the state of health (SOH) of the batteries based on the results of such detection.

The state of charge (SOC) of a battery can generally be acquired using an SOC-OCV characteristic, which is the relationship between the SOC and the open circuit voltage (OCV) of the battery. Nevertheless, the SOC-OCV characteristic is known to change depending on the degradation or individual variation of the battery. In recent years, inclination of the SOC-OCV characteristic is decreasing due to the improvement of electrode materials, and the degradation or individual variation of the SOC-OCV characteristic is becoming a problem as the cause of an SOC error. Thus, in order to calculate the SOC accurately, a logic for detecting and correcting the changes in the SOC-OCV characteristic is required.

As methods of operating the SOC according to the changes in the SOC-OCV characteristic, for example, known are the technologies described in PTL 1 and PTL 2 below. PTL 1 discloses a controller of an electricity storage system which calculates, by using an average SOC and an average battery temperature of a period in which a full charge capacity has not been estimated (unestimated period) from the time that the full charge capacity was previously calculated to date and a decrease rate map in which a decrease rate that changes according to the average SOC and the average battery temperature is prescribed in advance, the decrease rate during the unestimated period, and calculates a first elapsed time of an electrical storage device when the full charge capacity was previously calculated based on the decrease rate during the unestimated period and an initial full charge capacity. PTL 1 further discloses that the controller of the electricity storage system calculates a present full charge capacity based on a present second elapsed period of the electrical storage device calculated from the first elapsed period and the unestimated period, the decrease rate during the unestimated period, and the initial full charge capacity. PTL 2 discloses a method of estimating a state of charge of a secondary battery based on an open voltage value and a current integrated value including the steps of updating an instantaneous state of charge map which prescribes a relationship of an instantaneous open voltage value when estimating a state of charge and a state of charge estimated value based on charge/discharge characteristic data after start of use of the secondary battery, calculating an instantaneous state of charge estimated value when estimating a state of charge based on the updated instantaneous state of charge map, calculating the state of charge estimated value based on an integrated value of a current flowed through the secondary battery, and calculating a control state of charge estimated value for use in controlling the secondary battery based on the instantaneous state of charge estimated value and the state of charge estimated value based on the current integrated value.

CITATION LIST

Patent Literature

[PTL 1] Japanese Unexamined Patent Application Publication No. 2015-40832
[PTL 2] Japanese Unexamined Patent Application Publication No. 2016-114469

SUMMARY OF THE INVENTION

Problems to be Solved by the Invention

With the method of PTL 1, it is not possible to deal with differences in the SOC-OCV characteristics based on individual variations that occur during the manufacture of the batteries. Moreover, when the actual conditions of use of the battery and the degradation condition prescribed in the decrease rate map stored in the controller are different, an error will occur between the prediction result of the SOC-OCV characteristic and the actual SOC-OCV characteristic. Thus, there is a problem in that the operational precision of the SOC will be low. Meanwhile, with the method of PTL 2, when there is a measurement error in the OCV or the current integrated value, there is a problem in that it is not possible to accurately update the instantaneous state of charge map corresponding to the SOC-OCV characteristic, and that a gross error will consequently occur in the operation result of the SOC. In particular, with hybrid vehicles that do not perform charge/discharge externally, since the operational range of the SOC is generally narrow, it is difficult to update the instantaneous state of charge map with a high degree of accuracy.

Means to Solve the Problems

The battery control device according to the present invention obtains a state of charge of a secondary battery from characteristics representing a relationship of a state of charge and a voltage of the secondary battery, and comprises a calling unit which calls a first characteristic among a plurality of the characteristics stored in advance based on use history information of the secondary battery, a correction limit width designation unit which designates a correction limit width for prescribing a tolerance level of correcting the first characteristic, and a direct detection correction unit which creates a second characteristic in which the first characteristic has been corrected according to the correction limit width based on a current value and a voltage value of the secondary battery, wherein the state of charge of the secondary battery is obtained using the second characteristic.

Advantageous Effects of the Invention

According to the present invention, the SOC can be operated with a high degree of accuracy even when the SOC-OCV characteristic changes due to the degradation or individual variation of a battery.

BRIEF DESCRIPTION OF DRAWINGS

FIG. 2 is a diagram showing the circuit configuration of the single battery control unit.

FIG. 4 is a diagram showing the functional configuration of the SOC-OCV correction unit according to the first embodiment of the present invention.

FIG. 6 is a diagram showing the functional configuration of the pattern calling unit according to the first embodiment of the present invention.

FIG. 8 is a diagram showing the functional configuration of the direct detection correction unit according to the first embodiment of the present invention.

FIG. 10 is a diagram explaining the overwrite timing of the SOC-OCV characteristic.

FIG. 13 is a diagram explaining the divergence inhibiting effect of the SOC-OCV characteristics according to the present invention.

FIG. 15 is a diagram showing the functional configuration of the SOC-OCV correction unit according to the second embodiment of the present invention.

FIG. 17 is a diagram explaining the effect based on the second embodiment of the present invention in comparison to the effect of the first embodiment.

FIG. 18 is a diagram showing the functional configuration of the SOC-OCV correction unit according to the third embodiment of the present invention.

FIG. 21 is a diagram showing the functional configuration of the SOC-OCV correction unit according to the fourth embodiment of the present invention.

FIG. 25 is a diagram showing the functional configuration of the SOC-OCV correction unit according to the fifth embodiment of the present invention.

FIG. 27 is a flowchart showing the processing flow of the SOC-OCV correction unit according to the fifth embodiment of the present invention.

FIG. 28 is a diagram explaining the effect based on the fifth embodiment of the present invention.

FIG. 29 is a diagram showing the functional configuration of the SOC-OCV correction unit according to the sixth embodiment of the present invention.

FIG. 30 is a diagram showing the functional configuration of the direct detection correction unit according to the sixth embodiment of the present invention.

FIG. 31 is a diagram showing the functional configuration of the SOC-OCV convergence determination unit.

FIG. 33 is a diagram explaining the effect based on the sixth embodiment of the present invention.

DESCRIPTION OF EMBODIMENTS

An embodiment of the present invention is now explained with reference to the appended drawings. In the following embodiment, explained is a case of applying the present invention to a battery system configuring a power source of a plug-in hybrid electric vehicle (PHEV). However, the present invention is not limited to the configuration of the embodiment explained below, and the present invention can also be applied to a capacitor control circuit of an electrical storage device configuring the power source of passenger vehicles such as hybrid electric vehicles (HEV) and electric vehicles (EV), and industrial vehicles such as hybrid railway vehicles.

Moreover, while the following embodiment explains a case of adopting a lithium ion battery, other batteries such as a nickel hydride battery, a lead battery, an electric double-layer capacitor, and a hybrid capacitor may also be used so long as it is a chargeable/dischargeable secondary battery. Furthermore, in the following embodiment, while an assembled battery is configured by connecting a plurality of single batteries in series, the assembled battery may also be configured by additionally connecting in series a plurality of assembled batteries configured by connecting a plurality of single batteries in parallel, or the assembled battery may also be configured by connecting in parallel a plurality of assembled batteries configured by connecting a plurality of single batteries in series.

<System Configuration>

Figure 1:
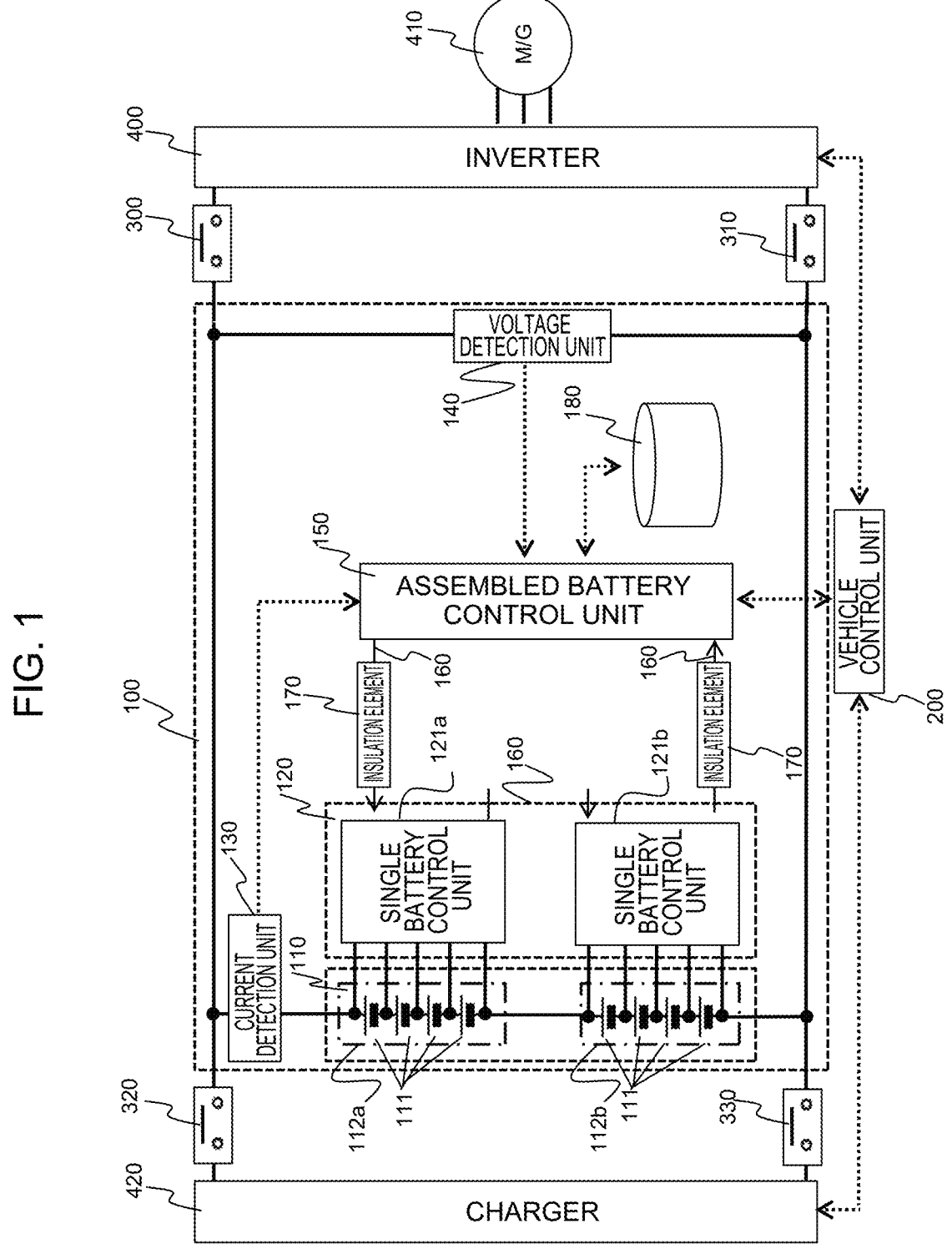
FIG. 1 is a diagram showing the battery system according to an embodiment of the present invention and the peripheral configuration thereof.

FIG. 1 is a diagram showing the battery system 100 according to an embodiment of the present invention and the peripheral configuration thereof. The battery system 100 is connected to an inverter 400 via relays 300, 310, and connected to a charger 420 via relays 320, 330. The battery system 100 comprises an assembled battery 110, a single battery management unit 120, a current detection unit 130, a voltage detection unit 140, an assembled battery control unit 150, and a storage unit 180.

The assembled battery 110 is configured from a plurality of single batteries 111. The single battery management unit 120 monitors the state of the single battery 111. The current detection unit 130 detects the current flowing through the battery system 100. The voltage detection unit 140 detects the total voltage of the assembled battery 110. The assembled battery control unit 150 detects and manages the state of the assembled battery 110.

The assembled battery control unit 150 receives the battery voltage and the temperature of the single batteries 111 sent from the single battery management unit 120, the current value flowing through the battery system 100 sent from the current detection unit 130, and the total voltage value of the assembled battery 110 sent from the voltage detection unit 140. The assembled battery control unit 150 detects the state of the assembled battery 110 based on the received information. The results of the state detected by the assembled battery control unit 150 are sent to the single battery management unit 120 and the vehicle control unit 200.

The assembled battery 110 is configured by electrically connecting in series a plurality of single batteries 111 capable of storing and releasing electrical energy (charging/discharging DC power). The single batteries 111 configuring the assembled battery 110 are grouped into a predetermined number of units upon managing and controlling the state. The grouped single batteries 111 are electrically connected in series and configure single battery groups 112a, 112b. The number of single batteries 111 configuring the single battery group 112 may be the same in all single battery groups 112, or the number of single batteries 111 may differ for each single battery group 112.

The single battery management unit 120 monitors the state of the single batteries 111 configuring the assembled battery 110. The single battery management unit 120 comprises a single battery control unit 121 provided for each single battery group 112. In FIG. 1, single battery control units 121a and 121b are provided in correspondence to the single battery groups 112a and 112b. The single battery control unit 121 monitors and controls the state of the single batteries 111 configuring the single battery group 112.

In this embodiment, in order to simplify the explanation, the single battery groups 112a and 112b are configured by electrically connecting four single batteries 111 in series, and the single battery groups 112a and 112b are further electrically connected in series to configure the assembled battery 110 comprising a total of eight single batteries 111.

The assembled battery control unit 150 and the single battery management unit 120 send and receive signals via an insulation element 170 as represented by a photocoupler and a signal communication means 160. The reason why the insulation element 170 is provided is because the assembled battery control unit 150 and the single battery management unit 120 use different operating power sources. In other words, while the single battery management unit 120 operates by using the power from the assembled battery 110, the assembled battery control unit 150 uses an in-vehicle auxiliary battery (such as a 14V-system battery) as its power source. The insulation element 170 may be mounted on a circuit board configuring the single battery management unit 120, or may be mounted on a circuit board configuring the assembled battery control unit 150. Note that the insulation element 170 may be omitted depending on the system configuration.

The communication means between the assembled battery control unit 150 and the single battery control units 121a and 121b configuring the single battery management unit 120 is now explained. The single battery control units 121a and 121b are connected in series in descending order of the potential of the single battery groups 112a and 112b that are respectively monitored by the single battery control units 121a and 121b. The signals sent by the assembled battery control unit 150 to the single battery management unit 120 are input to the single battery control unit 121a via the insulation element 170 and the signal communication means 160. The output of the single battery control unit 121a is input to the single battery control unit 121b via the signal communication means 160, and the output of the single battery control unit 121b of the lowest numerical position is transmitted to the assembled battery control unit 150 via the insulation element 170 and the signal communication means 160. In this embodiment, while the insulation element 170 is not provided between the single battery control unit 121a and the single battery control unit 121b, the signals may also be sent and received via the insulation element 170.

The storage unit 180 stores information such as the internal resistance characteristics, full charge capacity, polarization characteristics, degradation characteristics, individual difference information, and characteristics of the SOC and the OCV of the assembled battery 110, the single battery 111, and the single battery group 112. Note that, in this embodiment, while the storage unit 180 is configured to be disposed outside the assembled battery control unit 150 or the single battery management unit 120, the configuration may also be such that the assembled battery control unit 150 or the single battery management unit 120 comprises a storage unit, and the foregoing information may be stored therein.

The vehicle control unit 200 controls the inverter 400 connected to the battery system 100 via the relay 300 by using the information sent by the assembled battery control unit 150. Moreover, the vehicle control unit 200 controls the charger 420 connected to the battery system 100 via the relays 320 and 330. While the vehicle is running, the battery system 100 is connected to the inverter 400, and drives the motor generator 410 using the energy stored in the assembled battery 110. When charging the batteries, the battery system 100 is connected to the charger 420, and charged with the power supplied from a household power source or a charging station.

The charger 420 is used for charging the assembled battery 110 using an external power source as represented by a household power source or a charging station. In this embodiment, while the charger 420 is configured to control the charging voltage and the charging current based on commands from the vehicle control unit 200, the charging voltage and the charging current may also be controlled based on commands from the assembled battery control unit 150. Moreover, the charger 420 may be installed within the vehicle according to the vehicle configuration, performance or purpose of use of the charger 420, or installation condition of the external power source, or may be installed outside the vehicle.

When a vehicle system equipped with the battery system 100 is to be activated and driven, based on the management of the vehicle control unit 200, the battery system 100 is connected to the inverter 400, the motor generator 410 is driven using the energy stored in the assembled battery 110, and the assembled battery 110 is charged based on the generated power of the motor generator 410 during regeneration. When a vehicle comprising the battery system 100 is connected to an external power source as represented by a household power source or a charging station, the battery system 100 and the charger 420 are connected based on the information transmitted by the vehicle control unit 200, and the assembled battery 110 is charged until reaching a predetermined condition. The energy stored in the assembled battery 110 based on charging is used when the vehicle is subsequently driven, or used for operating the electrical components inside and outside the vehicle. Furthermore, in certain cases such energy is released to an external power source as represented by a household power source as needed.

FIG. 2 is a diagram showing the circuit configuration of the single battery control unit 121. The single battery control unit 121 comprises a voltage detection circuit 122, a control circuit 123, a signal input/output circuit 124, and a temperature detection unit 125. The voltage detection circuit 122 measures the inter-terminal voltage of each single battery 111. The control circuit 123 receives the measurement results from the voltage detection circuit 122 and the temperature detection unit 125, and sends the received measurement results to the assembled battery control unit 150 via the signal input/output circuit 124. Note that the circuit configuration that is generally equipped in the single battery control unit 121 for equalizing the voltage variation and the SOC variation between the single batteries 111 that occur pursuant to a self-discharge or consumption current variation is well known, and the explanation thereof has been omitted.

The temperature detection unit 125 equipped in the single battery control unit 121 shown in FIG. 2 includes a function of measuring the temperature of the single battery group 112. The temperature detection unit 125 measures one temperature of the single battery group 112 as a whole, and treats the representative temperature value of the single batteries 111 configuring the single battery group 112 as the temperature of the single battery group 112. The temperature measured by the temperature detection unit 125 is used for various types of operations for detecting the state of the single batteries 111, the single battery group 112, or the assembled battery 110. In FIG. 2, based on the foregoing premise, one temperature detection unit 125 is provided to the single battery control unit 121. While it is also possible to provide the temperature detection unit 125 to each single battery 111 and measure the temperature for each single battery 111 and execute various types of operations based on the temperature of each single battery 111, in the foregoing case, since the number of temperature detection units 125 will increase, the configuration of the single battery control unit 121 will become complicated.

FIG. 2 shows the temperature detection unit 125 in a simplified manner. In effect, a temperature sensor is installed on the temperature measuring object, the installed temperature sensor outputs the temperature information as a voltage, the measurement result is sent to the signal input/output circuit 124 via the control circuit 123, and the signal input/output circuit 124 outputs the measurement result outside the single battery control unit 121. The function for realizing the series of processes is mounted on the single battery control unit 121 as the temperature detection unit 125, and the voltage detection circuit 122 may also be used for measuring the temperature information (voltage).

Figure 3:
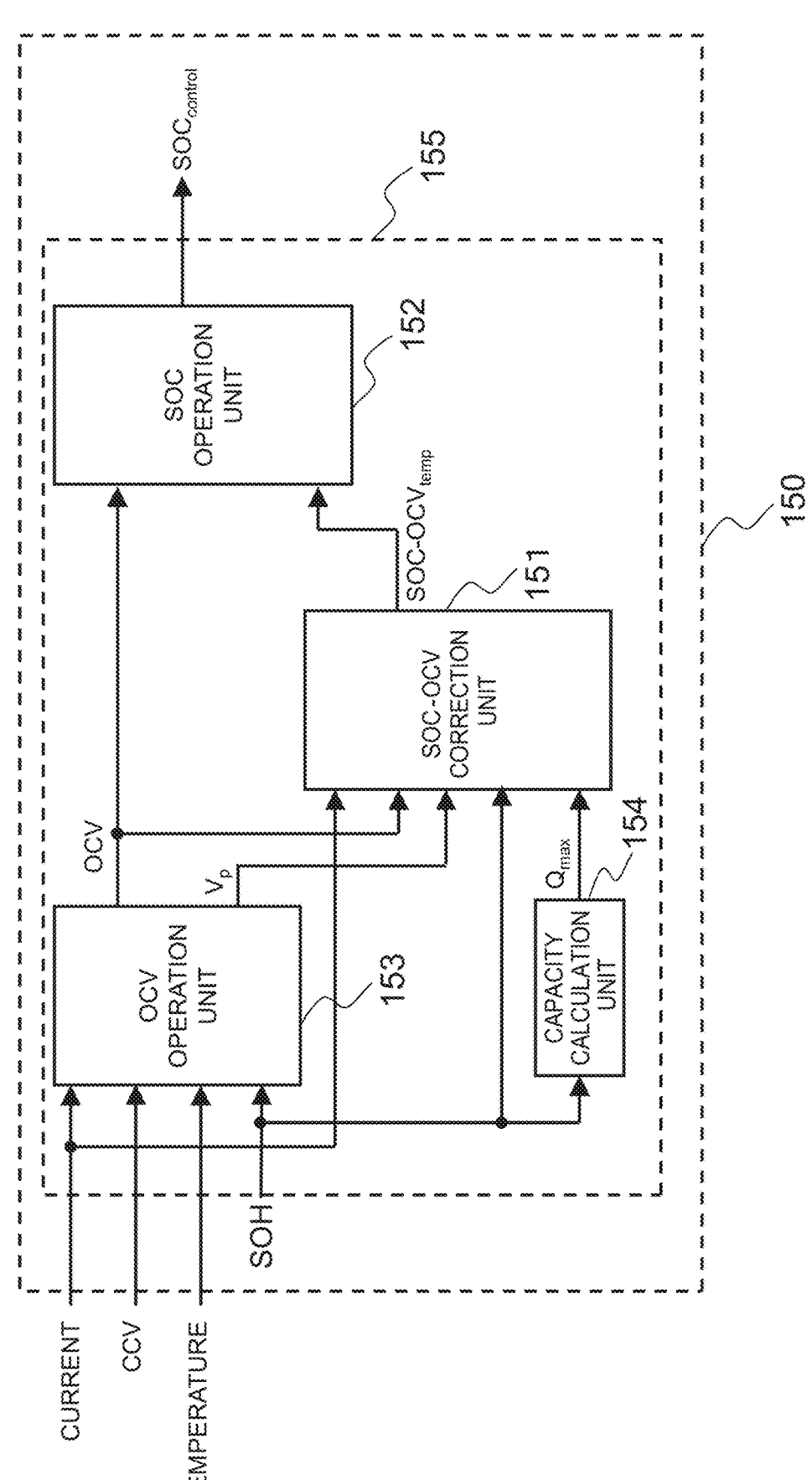
FIG. 3 is a diagram showing the functional configuration of the SOC operation system.

FIG. 3 is a diagram showing the functional configuration of the SOC operation system 155 in the assembled battery control unit 150. The assembled battery control unit 150 is the part that determines the state of each single battery 111 in the assembled battery 110 and the power that can be input to and output from each single battery 111 based on the current value and the voltage value of each single battery 111 detected while the vehicle is moving, and includes the SOC operation system 155 shown in FIG. 3 as one functional constituent element thereof. The SOC operation system 155 is the part that assumes the function corresponding to the battery control device according to an embodiment of the present invention, and has the function of operating the state of charge (SOC) of each single battery 111. Note that, while the assembled battery control unit 150 is also equipped with various functions required for controlling the assembled battery 10 in addition to the SOC operation system 155, such as the function of operating the state of health (SOH) of each single battery 111 and the function of the determining the input/output power of each single battery 111, since these functions are well known and not directly related to the present invention, the detailed explanation thereof is omitted.

The SOC operation system 155 includes, as its functions, the respective functional blocks of an OCV operation unit 153, a capacity calculation unit 154, an SOC-OCV correction unit 151, and an SOC operation unit 152. The SOC operation system 155 operates, based on these functional blocks, the SOC of each single battery 111 based on the current of the assembled battery 110, or the current of each single battery 111, detected by the current detection unit 130, and the voltage and the temperature of each single battery 111 detected by the single battery management unit 120. Specifically, the SOC operation system 155 foremost obtains, based on the OCV operation unit 153, the open circuit voltage (OCV) of each single battery 111 based on the current, the close circuit voltage (CCV), the temperature and the state of health (SOH) of each single battery 111. Note that the SOH of each single battery 111 can be obtained, for example, with the SOH operation unit (not shown) in the assembled battery control unit 150. Next, the SOC-OCV correction unit 151 corrects the predetermined characteristic representing the relationship of the SOC and the OCV (SOC-OCV characteristic) of each single battery 111 based on the OCV of each single battery 111 obtained by the OCV operation unit 153. Finally, the SOC operation unit 152 calculates the SOC of each single battery 111 using the SOC-OCV characteristic corrected by the SOC-OCV correction unit 151. The value of the thus calculated SOC of each single battery 111 is output as the $SOC_{control}$ from the SOC operation system 155 and used in the various types of control of the assembled battery 110.

Note that, while a case of the SOC operation system 155 calculating the SOC of each single battery 111 was explained above, the SOC of a plurality of single batteries 111 may also be calculated collectively. For example, the SOC may be calculated for each of the single battery groups 112a, 112b or the SOC may be calculated for the assembled battery 110 as a whole. Even in the foregoing cases, the SOC can be calculated based on the same processing as the single batteries 111. Moreover, the SOC of each single battery 111 can be calculated based on the same processing. Accordingly, in the following explanation, the operation of the SOC operation system 155 will be explained by referring to the calculation target of the SOC simply as a "battery".

The OCV operation unit 153 uses the CCV, the current I, the temperature T, and the SOH of the battery as the inputs, and outputs the OCV and the polarization voltage (overvoltage) $V_p$ of the battery based on these inputs. Specifically, the OCV operation unit 153 operates the OCV using Formula (1) below according to an equivalent circuit model of the battery. Note that the polarization voltage $V_p$ is operated as the voltage value of each equivalent circuit component when multiplying the equivalent circuit model of the battery by the current I, and is generally configured from a plurality of elements such as a direct current resistance component and a polarization component. Here, the value of each element of the equivalent circuit model of the battery is generally dependent on the temperature T and the SOH of the battery. Moreover, as the SOH of the battery, generally used is the SOHR which indicates the increase rate of the direct current resistance of the battery, or the SOHQ which indicates the decrease rate of the battery capacity. In this embodiment, while the explanation is provided by using the SOHR as the SOH, the same applies to cases where the SOHQ is used as the SOH.

[Math 1]

$$OCV = CCV - \sum V_P(I, T, SOH) \qquad (1)$$

The capacity calculation unit 154 uses the SOH as the input, and outputs the battery capacity $Q_{max}$. In this embodiment, for example, based on the known empirical rule that the battery capacity takes on an inverse relationship of the SOH, the battery capacity $Q_{max}$ corresponding to the input SOH is acquired by the capacity calculation unit 154.

The SOC-OCV correction unit 151 corrects the pre-stored SOC-OCV characteristic based on the current I and the SOH input to the SOC operation system 155, the OCV and the polarization voltage $V_p$ calculated by the OCV operation unit 153, and the battery capacity $Q_{max}$ calculated by the capacity calculation unit 154. The SOC-OCV correction unit 151 subsequently outputs the corrected SOC-OCV characteristic as the SOC-OCV$_{temp}$, which is the SOC-OCV characteristic to be temporarily used in the SOC operation unit 152.

The SOC operation unit 152 calculates the SOC corresponding to the OCV calculated by the OCV operation unit 153 using the SOC-OCV$_{temp}$ calculated by the SOC-OCV correction unit 151. The SOC operation unit 152 subsequently outputs the SOC$_{control}$ to be used for controlling the battery based on the value of the calculated SOC.

The SOC-OCV correction unit 151 is now explained in detail. The SOC-OCV correction unit 151 can be realized based on various embodiments as explained below.

First Embodiment

Figure 4:
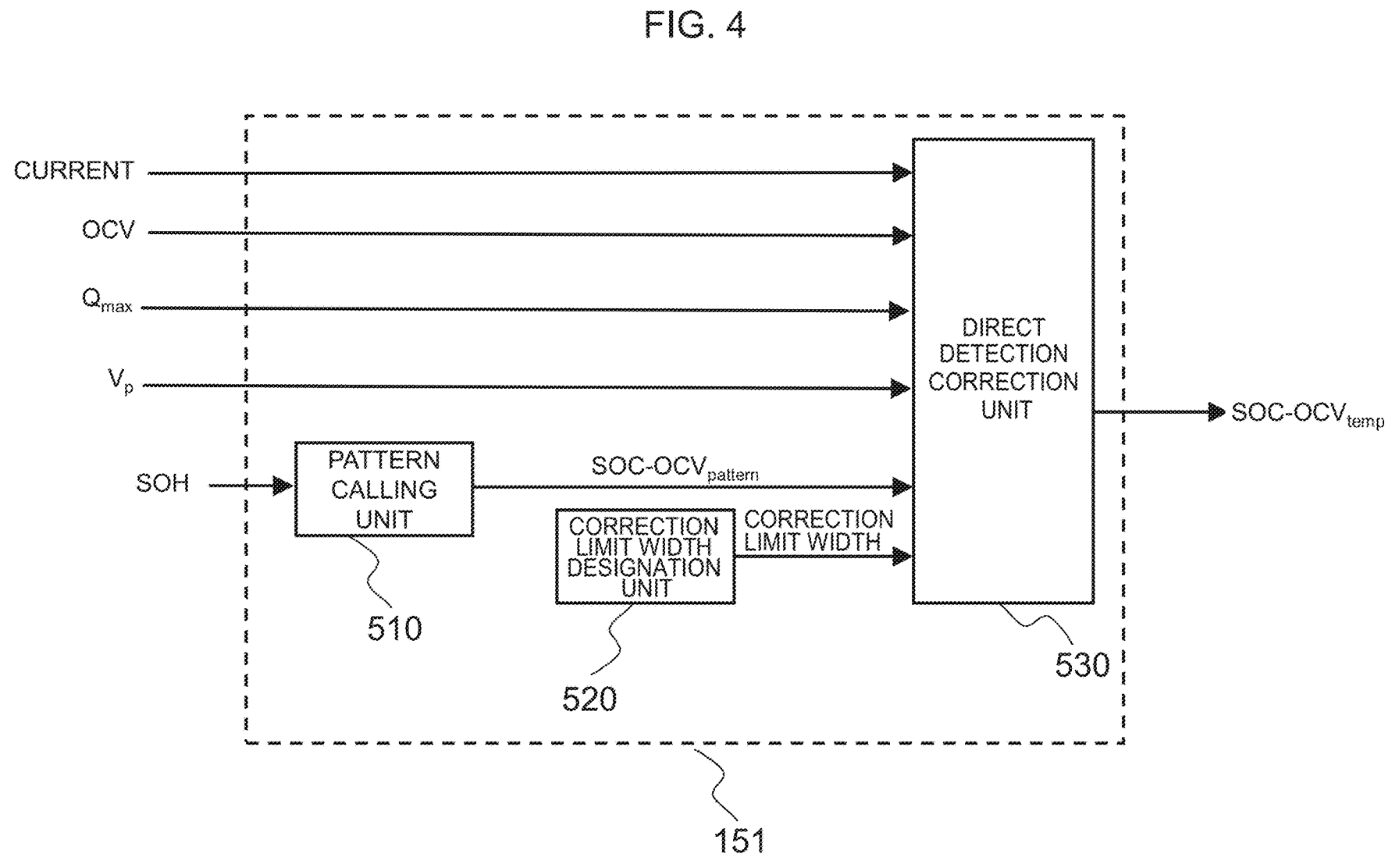

FIG. 4 is a diagram showing the functional configuration of the SOC-OCV correction unit 151 according to the first embodiment of the present invention. The SOC-OCV correction unit 151 in this embodiment includes a pattern calling unit 510, a correction limit width designation unit 520, and a direct detection correction unit 530.

The pattern calling unit 510 determines the degradation pattern of the battery based on the use history information of the battery, and calls the SOC-OCV characteristic corresponding to that degradation pattern among a plurality of SOC-OCV characteristics stored in advance. The pattern calling unit 510 subsequently outputs the information of the called SOC-OCV characteristic as the SOC-OCV$_{pattern}$. The use history information of a battery is information representing the previous use history (operating history) of the battery in the battery system 100, and is used as the index for indicating the state of health (SOH) of the battery. In this embodiment, the SOH is used as the use history information of the battery.

Figure 5:
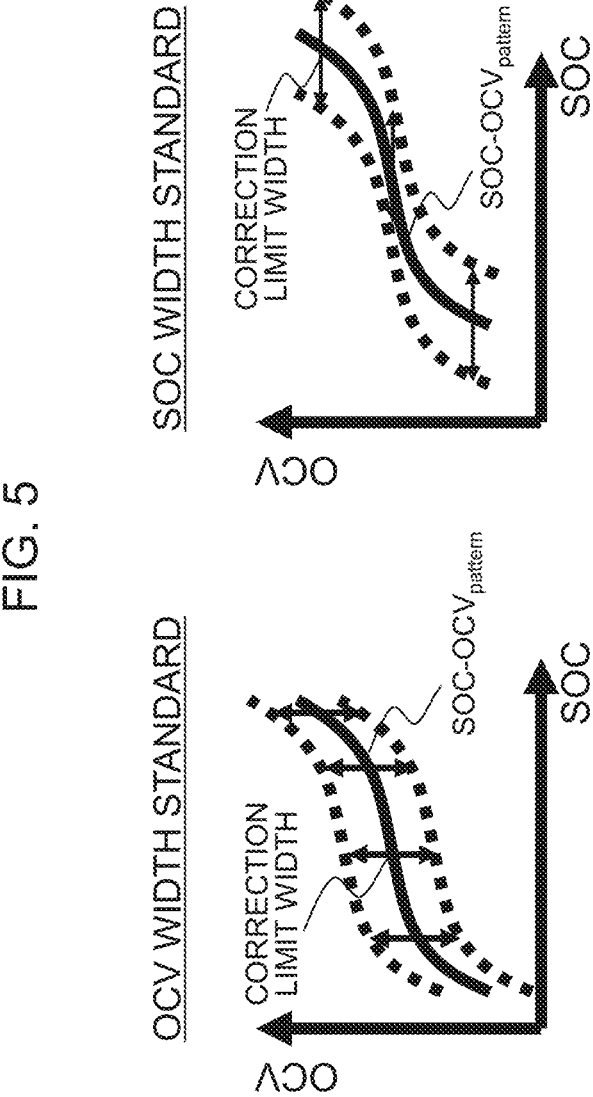
FIG. 5 is a diagram showing an example of the correction limit width designated by the correction limit width designation unit according to the first embodiment of the present invention.

The correction limit width designation unit 520 designates the correction limit width for prescribing the tolerance level of the correction to be performed by the direct detection correction unit 530 to the SOC-OCV$_{pattern}$. FIG. 5 is a diagram showing an example of the correction limit width designated by the correction limit width designation unit 520 according to the first embodiment of the present invention. In this embodiment, for example, as shown in the left diagram of FIG. 5, the correction limit width designation unit 520 designates a certain OCV width for each SOC of the SOC-OCV$_{pattern}$ as the correction limit width. This OCV width is set, for example, according to the tolerance of the OCV based on the production tolerance of the battery. In other words, when a change in the OCV that is greater than the production tolerance occurs in the battery, the correction limit width designation unit 520 designates the correction limit width so that the direct detection correction unit 530 can exclude such change as an operational error. Otherwise, for example, as shown in the right diagram of FIG. 5, the correction limit width designation unit 520 may also designate a certain SOC width for each OCV of the SOC-OCV$_{pattern}$ as the correction limit width. In the foregoing case, the range of correction to be performed by the direct detection correction unit 530 to the SOC-OCV$_{pattern}$ is limited to be within the range of the SOC width designated based on the correction limit width.

The direct detection correction unit 530 corrects the SOC-OCV$_{pattern}$ output from the pattern calling unit 510 based on the current I and the OCV according to the correction limit width designated by the correction limit width designation unit 520. The direct detection correction unit 530 subsequently outputs the correction result as the SOC-OCV$_{temp}$ explained above.

Figure 6:
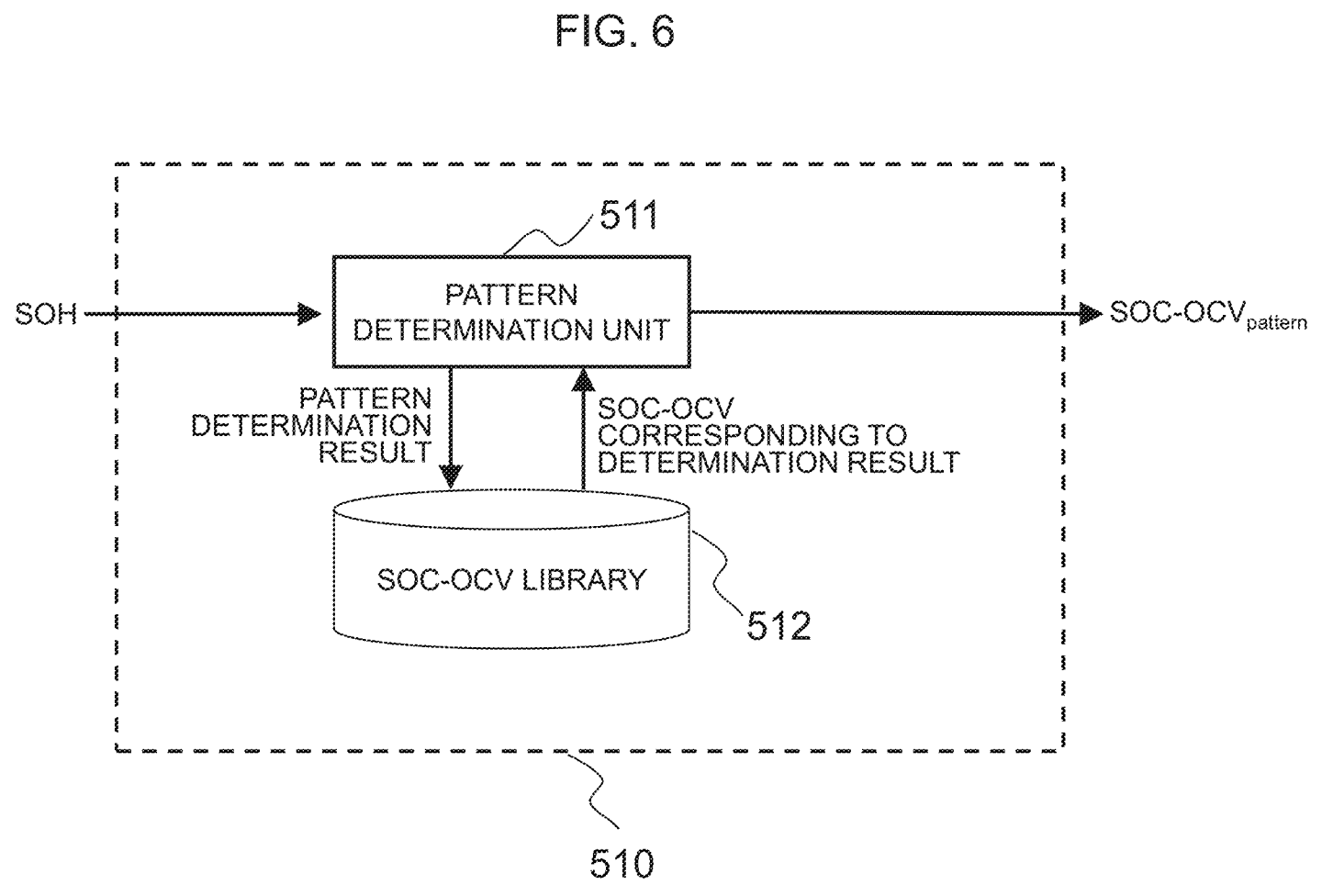

FIG. 6 is a diagram showing the functional configuration of the pattern calling unit 510 according to the first embodiment of the present invention. The pattern calling unit 510 includes a pattern determination unit 511, and an SOC-OCV library 512.

Figure 7:
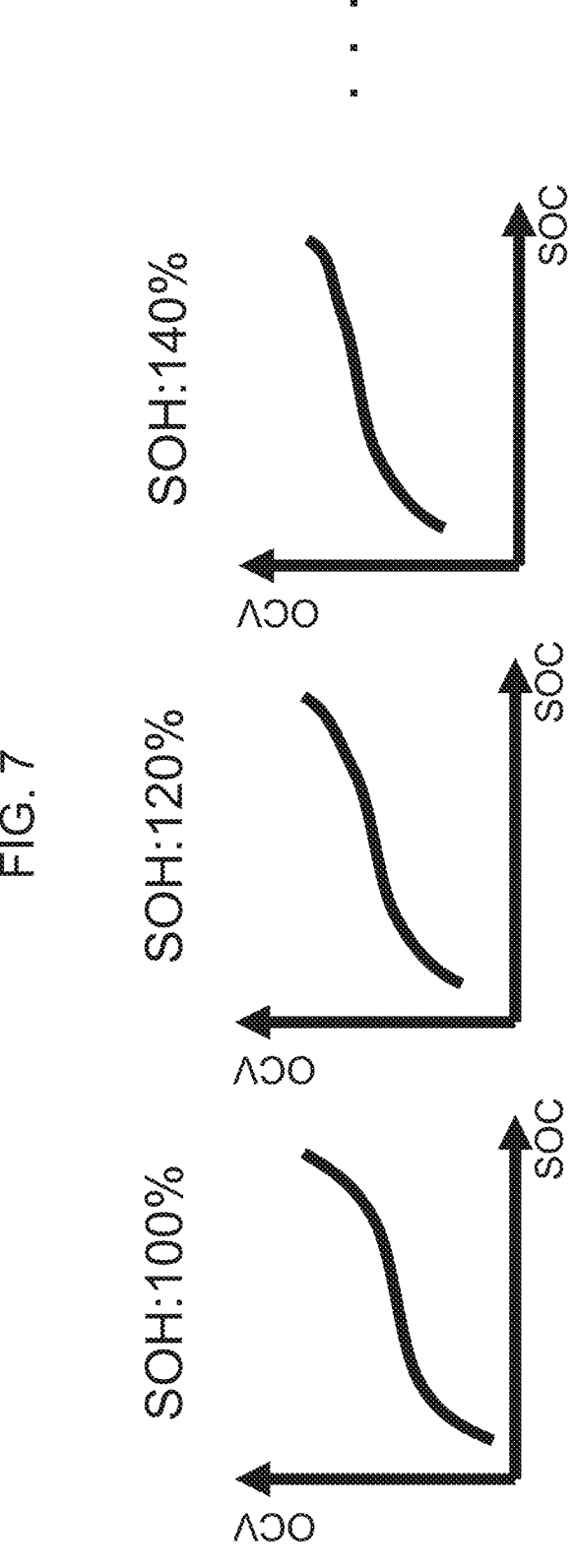
FIG. 7 is a diagram showing an example of the SOC-OCV characteristics of the SOC-OCV library according to the first embodiment of the present invention.

The SOC-OCV library 512 has a database of the SOC-OCV characteristics corresponding to various types of SOH. FIG. 7 is a diagram showing an example of the SOC-OCV characteristics of the SOC-OCV library 512 according to the first embodiment of the present invention. FIG. 7 shows that, in each case where the value of the SOH is 100%, 120%, 140%, . . . , respectively different SOC-OCV characteristics are stored in the SOC-OCV library 512. Here, the SOC-OCV library 512 can be realized, for example, by conducting a degradation test of each single battery 111 and acquiring in advance the relationship of the SOC and the OCV when the degradation of each single battery 111 advances and the value of the SOH changes, and compiling a database of the relationship.

The pattern determination unit 511 performs pattern determination to the input SOH, and calls the SOC-OCV characteristic corresponding to that pattern determination result by searching the SOC-OCV library 512. The pattern determination unit 511 subsequently generates the SOC-OCV$_{pattern}$ from the called SOC-OCV characteristic and outputs the generated SOC-OCV$_{pattern}$. Here, it is also possible to call the SOC-OCV characteristic of the SOH condition that is closest to the input SOH, and directly output the called SOC-OCV characteristic as the SOC-OCV$_{pattern}$. Otherwise, it is also possible to identify two mutually adjacent SOH values ($SOH_1$, $SOH_2$) that become $SOH_1 < SOH < SOH_2$ in relation to the input SOH, call the SOC-OCV characteristics respectively corresponding to such SOH values from the SOC-OCV library 512 and operate the SOC-OCV characteristic based on interpolation, and output the obtained SOC-OCV characteristic as the SOC-OCV$_{pattern}$. The SOC-OCV$_{pattern}$ output from the pattern determination unit 511 is stored, for example, in a memory not shown, and read by the direct detection correction unit 530.

Figure 8:
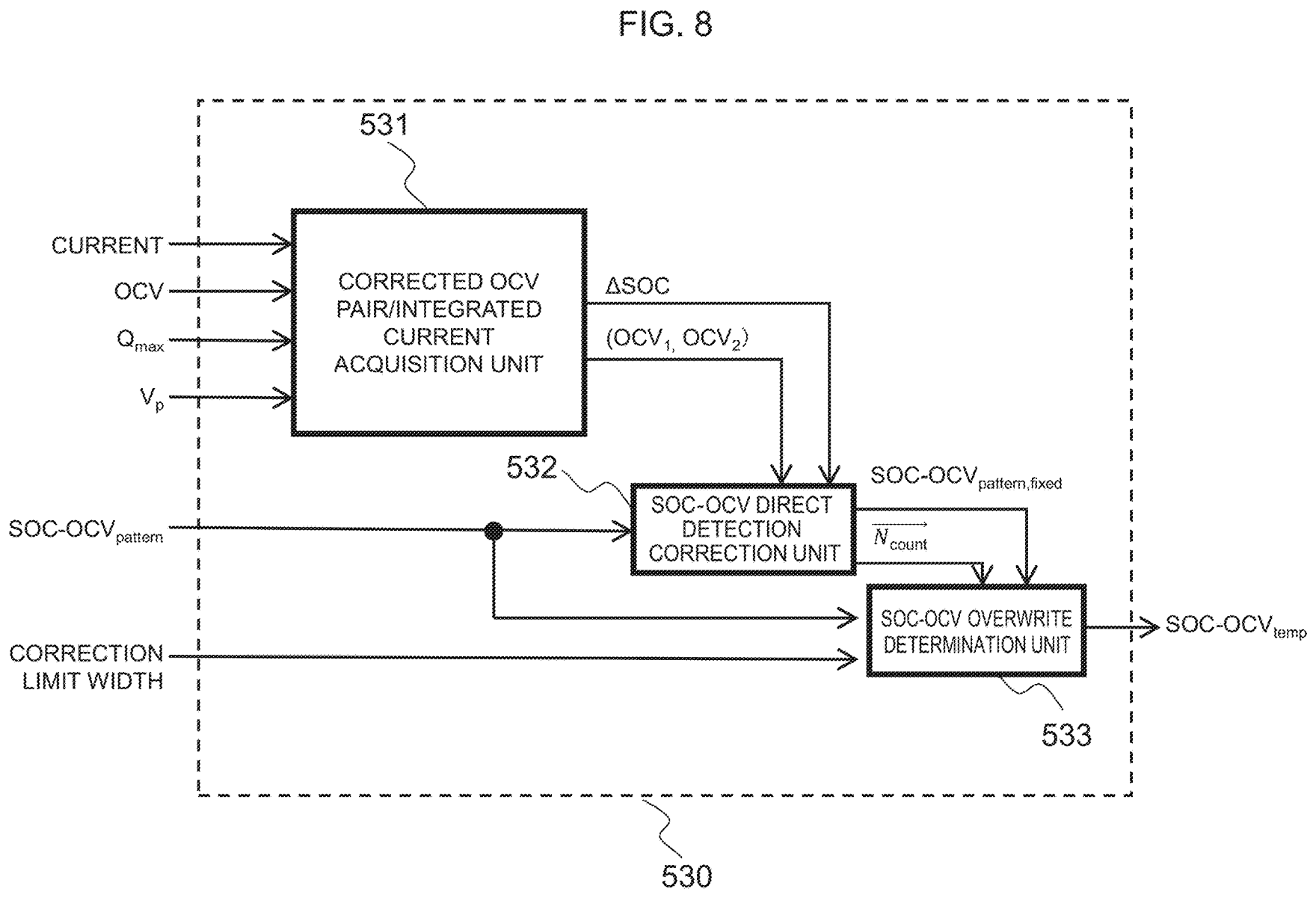

FIG. 8 is a diagram showing the functional configuration of the direct detection correction unit 530 according to the first embodiment of the present invention. The direct detection correction unit 530 includes a corrected OCV pair/integrated current acquisition unit 531, an SOC-OCV direct detection correction unit 532, and an SOC-OCV overwrite determination unit 533.

The corrected OCV pair/integrated current acquisition unit 531 uses the current I, the OCV, the battery capacity $Q_{max}$ and the polarization voltage $V_p$ that respectively change with time according to the battery state as the inputs, and outputs a difference $\Delta SOC$ of the SOC based on direct detection and a pair ($OCV_1$, $OCV_2$) of the OCV based on these inputs. Specifically, the corrected OCV pair/integrated current acquisition unit 531 acquires the OCV pair ($OCV_1$, $OCV_2$) by acquiring two points of an OCV value which is stable within a range of a predetermined duration. The corrected OCV pair/integrated current acquisition unit 531 subsequently uses Formula (2) below to calculate a difference $\Delta SOC$ of the SOC based on direct detection by obtaining a current integrated value in a period from the acquisition of the $OCV_1$ to the acquisition of the $OCV_2$ and dividing the obtained current integrated value by the battery capacity $Q_{max}$. Note that, in Formula (1), $t(OCV_1)$ and $t(OCV_2)$ represent the time that the $OCV_1$ was acquired and the time that the $OCV_2$ was acquired, respectively.

[Math 2]

$$\Delta SOC = \frac{\int_{t(OCV_1)}^{t(OCV_2)} I dt}{Q_{max}} \quad (2)$$

Figure 9:
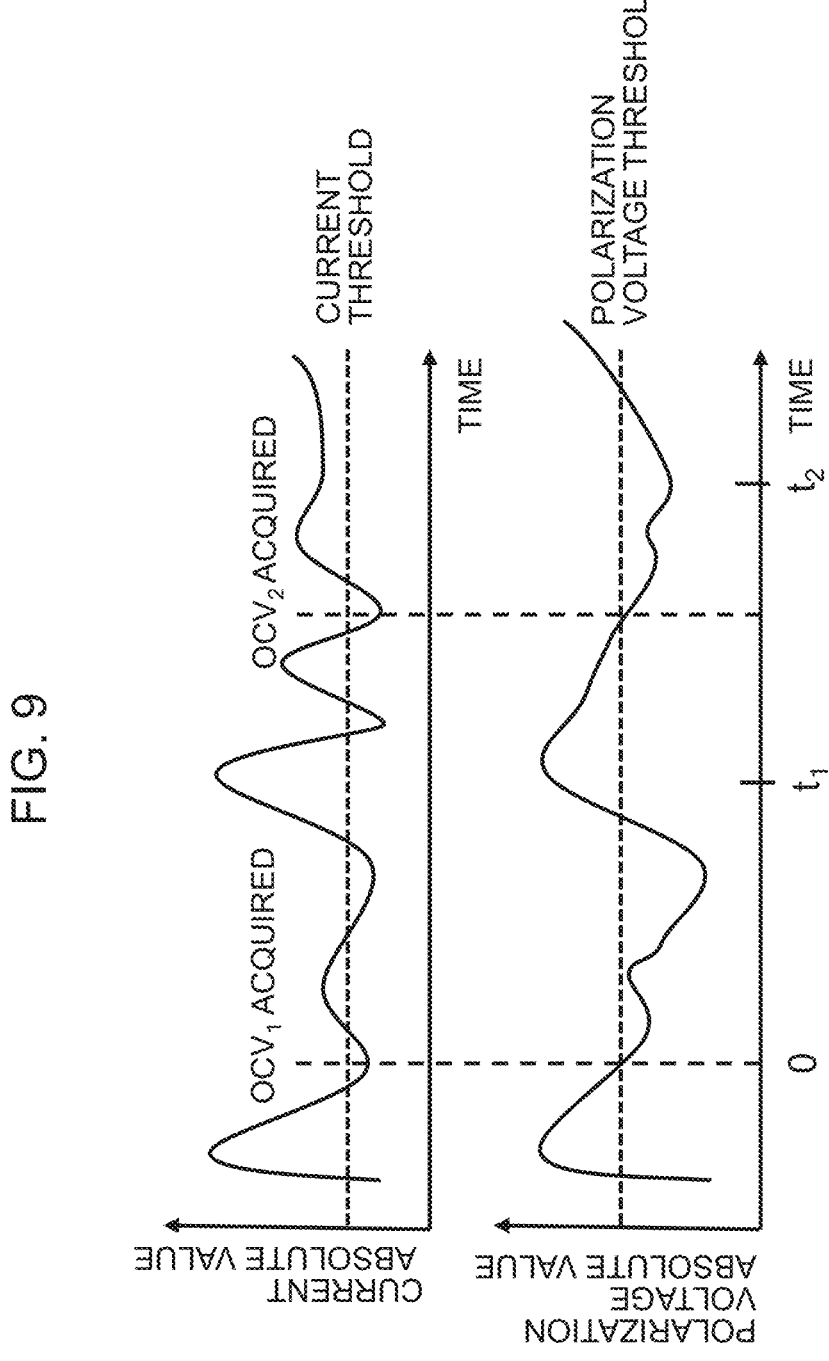
FIG. 9 is a diagram explaining the acquisition method of a stable OCV pair.

FIG. 9 is a diagram explaining the acquisition method of a stable OCV pair ($OCV_1$, $OCV_2$). The corrected OCV pair/integrated current acquisition unit 531 determines that the OCV value is stable, for example, as shown in FIG. 9, when the absolute value of the current I is smaller than a predetermined current threshold, and the absolute value of the polarization voltage $V_p$ is smaller than a predetermined polarization voltage threshold. When the period between two points of time $t(OCV_1)$ and $t(OCV_2)$ which satisfy these stable conditions is equal to or greater than a predetermined time threshold t1 and equal to or less than a predetermined time threshold t2 (t1 < t2), the two OCV values at time $t(OCV_1)$ and time $t(OCV_2)$ are acquired as the $OCV_1$ and the $OCV_2$. Note that three or more OCV values that satisfy these conditions may also be acquired as a combination of stable OCVs.

The SOC-OCV direct detection correction unit 532 corrects the SOC-OCV$_{pattern}$ based on the OCV pair ($OCV_1$, $OCV_2$) detected by the corrected OCV pair/integrated current acquisition unit 531 and the $\Delta SOC$ calculated based thereon, and outputs the correction result as the SOC-OCV$_{pattern, fixed}$. Specifically, in this embodiment, the SOC-OCV direct detection correction unit 532 uses at least one point on the SOC-OCV characteristic indicated by the input SOC-OCV$_{pattern}$ as the origin (reference point), and, each time that it acquires the $\Delta SOC$ and the $OCV_1$, $OCV_2$ from the corrected OCV pair/integrated current acquisition unit 531, the SOC-OCV direct detection correction unit 532 corrects the SOC-OCV$_{pattern}$ based thereon and creates the SOC-OCV$_{pattern, fixed}$.

For example, when the point ($OCV_1$, $SOC_1$) corresponding to the $OCV_1$ in the SOC-OCV characteristic indicated by the SOC-OCV$_{pattern}$ is used as the reference point, the value of the SOC in the directly detected $OCV_2$ can be obtained based on Formula (3) below.

[Math 3]

$$SOC(OCV_2) = SOC_1 + \Delta SOC \quad (3)$$

Similarly, the SOC-OCV$_{pattern, fixed}$ can also be created by correcting the SOC-OCV characteristic indicated by the SOC-OCV$_{pattern}$ one point at a time using a plurality of combinations of the OCV and the SOC respectively obtained based on direct detection. Specifically, when the SOC-OCV characteristic indicated by the SOC-OCV$_{pattern}$ is divided into k-number of SOC-OCV characteristics on the SOC axis and the n-th acquisition point is located at the k-th point, the SOC-OCV$_{pattern, fixed}$ can be obtained by correcting the SOC-OCV characteristic using the recurrence formula shown in Formula (4) below. In Formula (4), k represents the fineness of the interval for expressing the SOC-OCV characteristic as a sequence, and the SOC-OCV characteristic will be smoother as the k is greater. Moreover, the $OCV_{k, 0}$ and the $SOC_{k, 0}$ respectively represent the OCV value and the SOC value at the reference point set on the SOC-OCV characteristic indicated by the SOC-OCV$_{pattern}$. Moreover, $n_0$ represents the weight when the SOC-OCV$_{pattern}$ takes on an initial value, and is a value that is equal to or greater than 0. When $n_0=0$, the SOC-OCV$_{pattern, fixed}$ is created by using the SOC-OCV$_{pattern}$ only at the origin. In this embodiment, as a result of creating the SOC-OCV$_{pattern, fixed}$ by using this kind of recurrence formula, it is possible to reduce the memory for storing the point (OCV, SOC) obtained based on direct detection.

[Math 4]

$$\overline{OCV}_{k,n} = \frac{n_0 + n - 1}{n_0 + n} \overline{OCV}_{n-1} + \frac{1}{n_0 + n} OCV_n \quad (4)$$

$$\overline{SOC}_{k,n} = \frac{n_0 + n - 1}{n_0 + n} \overline{SOC}_{n-1} + \frac{1}{n_0 + n} SOC_n$$

Note that the SOC-OCV direct detection correction unit 532 may also create the SOC-OCV$_{pattern, fixed}$ based on the SOC-OCV characteristic expressed as the sum average of a plurality of points obtained based on direct detection rather than using the recurrence formula of Formula (4) above. Specifically, for example, the SOC-OCV$_{pattern, fixed}$ can be obtained by correcting the SOC-OCV characteristic indicated by the SOC-OCV$_{pattern}$ using Formula (5) below. In the foregoing case, while the number of calculations performed is less in comparison to the case of using Formula (4), the data volume of the point (OCV, SOC) to be stored in the memory will increase. It would be preferable to use this calculation method when it is desirable to concentrate the calculation load in a single time step.

[Math 5]

$$\overline{OCV}_{k,n} = \frac{n_0 OCV_0 + \sum_{i=1}^{i=n} OCV_i}{n_0 + n} \qquad (5)$$

$$\overline{SOC}_{k,n} = \frac{n_0 SOC_0 + \sum_{i=1}^{i=n} SOC_i}{n_0 + n}$$

The SOC-OCV direct detection correction unit 532 outputs the SOC-OCV$_{pattern, \, fixed}$ obtained by correcting the SOC-OCV$_{pattern}$ in the manner described above, and additionally outputs a sequence N$_{count}$ representing the correction count at each point k on the SOC-OCV characteristic.

The SOC-OCV overwrite determination unit 533 determines the timing of overwriting the SOC-OCV$_{temp}$ (overwrite timing of the SOC-OCV characteristic) based on the SOC-OCV$_{pattern, \, fixed}$ by using the correction limit width input from the correction limit width designation unit 520. The SOC-OCV overwrite determination unit 533 determines the overwrite timing of the SOC-OCV characteristic, for example, in the following manner based on the sequence N$_{count}$ output from the SOC-OCV direct detection correction unit 532.

Figure 10:
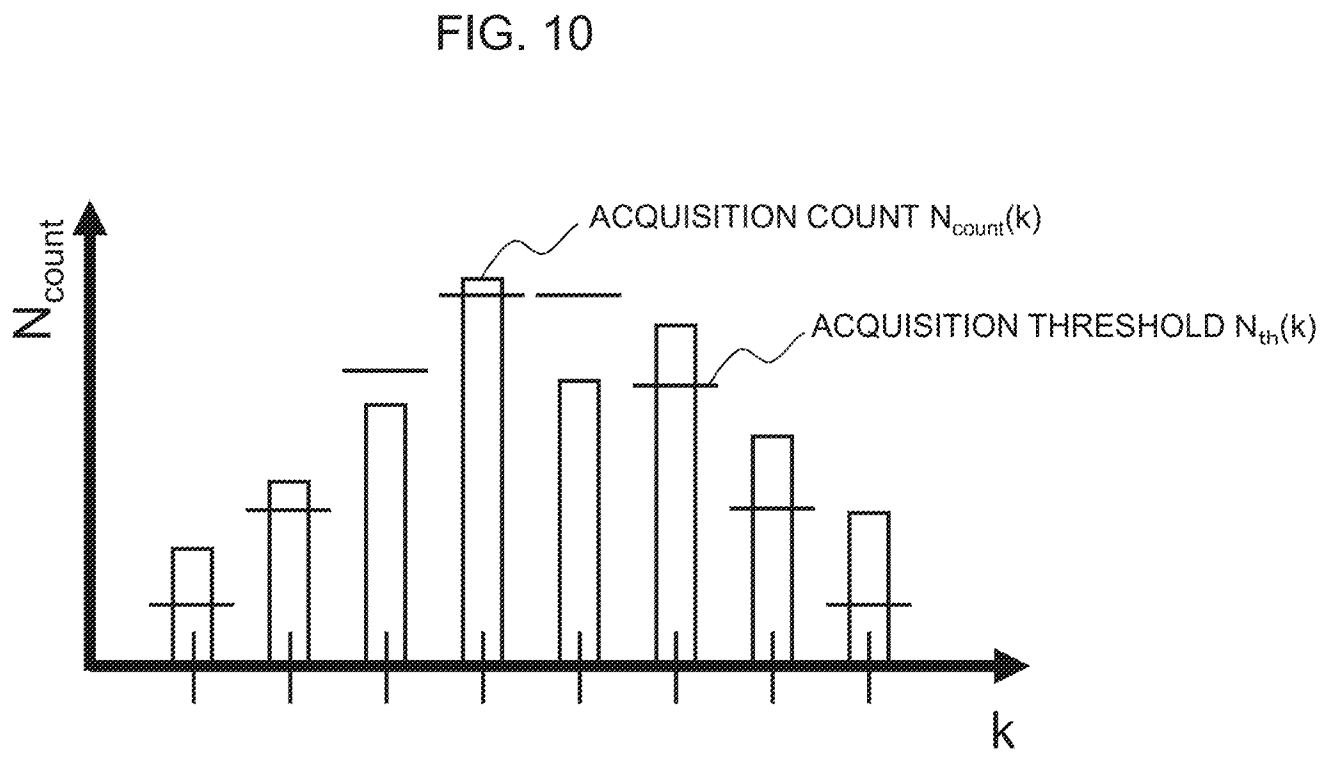

FIG. 10 is a diagram explaining the overwrite timing of the SOC-OCV characteristic. Foremost, as shown in FIG. 10, the SOC-OCV overwrite determination unit 533 determines whether the sequence N$_{count}$ is equal to or greater than a predetermined threshold sequence N$_{th}$ at all points k. Note that, in FIG. 10, N$_{count}$(k) represents the value of the sequence N$_{count}$ at each point k, and N$_{th}$(k) represents the value of the threshold sequence N$_{th}$ at each point k. Consequently, the SOC-OCV overwrite determination unit 533 continues to correct the SOC-OCV$_{pattern}$ without overwriting the SOC-OCV$_{temp}$ when the sequence N$_{count}$ is less than the threshold sequence N$_{th}$ in at least one point k, and determines whether the SOC-OCV$_{pattern, \, fixed}$ is within the correction limit width when the sequence N$_{count}$ becomes equal to or greater than the threshold sequence N$_{th}$ at all points k. Here, the value of the threshold sequence N$_{th}$ can be set according to the frequency that the SOC and the OCV are acquired while the vehicle is actually moving, or the likelihood of the individual variation of the battery. Consequently, when the SOC-OCV$_{pattern, \, fixed}$ is within the correction limit width, the SOC-OCV overwrite determination unit 533 determines that it is the overwrite timing of the SOC-OCV characteristic, overwrites the SOC-OCV$_{temp}$ with the SOC-OCV$_{pattern, fixed}$, and outputs the result. Meanwhile, when the SOC-OCV$_{pattern, \, fixed}$ is exceeding the correction limit width, the SOC-OCV overwrite determination unit 533 resets the previously stored SOC-OCV$_{pattern, fixed}$, and re-performs the operation.

Figure 11:
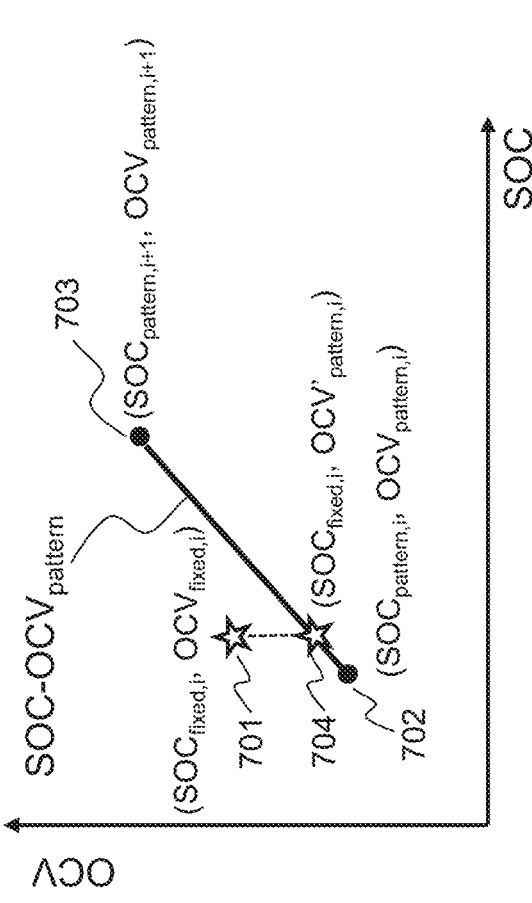
FIG. 11 is a diagram explaining the method of determining whether the corrected SOC-OCV characteristic is within the correction limit width.

FIG. 11 is a diagram explaining the method of determining whether the SOC-OCV$_{pattern, fixed}$, which is the corrected SOC-OCV characteristic, is within the correction limit width based on the SOC-OCV overwrite determination unit 533. When obtaining the SOC-OCV$_{pattern, fixed}$ by correcting the SOC-OCV$_{pattern}$, each point may move in both the SOC axis direction and the OCV axis direction. Thus, as shown in FIG. 11, when a point 701 on the SOC-OCV$_{pattern, fixed}$ is located between two points 702, 703 on the SOC-OCV$_{pattern}$, a perpendicular line is drawn downward from the point 701 relative to the line segment that connects these two points, and an intersection point 704 of the perpendicular line and the line segment is obtained. In other words, when the values of the SOC and the OCV at the point 701 are expressed as (SOC$_{fixed, \, i}$, OCV$_{fixed, \, i}$), the values of the SOC and the OCV at the point 702 are expressed as (SOC$_{pattern, \, i}$, OCV$_{pattern, \, i}$), and the values of the SOC and the OCV at the point 703 are expressed as (SOC$_{pattern, \, i+1}$, OCV$_{pattern, \, i+1}$), the values of the SOC and the OCV on the intersection point 704 can be expressed as (SOC$_{fixed, \, i}$, OCV'$_{pattern, \, i}$). Here, the value of the OCV'$_{pattern, \, i}$ exists between the OCV$_{pattern, \, i}$ and the OCV$_{pattern, \, i+1}$, and can be decided according to the ratio of the difference between the SOC$_{fixed, \, i}$ and the SOC$_{pattern, \, i}$ and the difference between the SOC$_{fixed, \, i}$ and the SOC$_{pattern, \, i+1}$.

Once the values of the SOC and the OCV on the intersection point 704 have been acquired in the manner described above, the squared difference of the OCV at the point 701 and the intersection point 704 is evaluated by being compared with the correction limit width based on Evaluation Formula (6) below. Consequently, it is determined that the point 701 is within the correction limit width when Evaluation Formula (6) is satisfied, and it is determined that the point 701 is exceeding the correction limit width when Evaluation Formula (6) is not satisfied. As a result of performing the foregoing evaluation to all points k on the SOC-OCV$_{pattern, \, fixed}$, it is possible to determine whether the SOC-OCV$_{pattern, \, fixed}$ is within the correction limit width.

[Math 6]

$$\sqrt{\left(OCV_{fixed,i} - OCV'_{pattern,i}\right)^2} \le \text{correction limit width} \qquad (6)$$

Note that the determination method explained above is an example of a determination method in a case where, as shown in the left diagram of FIG. 5 explained above, a certain OCV width for each SOC of the SOC-OCV$_{pattern}$ has been designated as the correction limit width. When a certain SOC width for each OCV of the SOC-OCV$_{pattern}$ has been designated as the correction limit width as shown in the right diagram of FIG. 5, it is possible to determine whether the SOC-OCV$_{pattern, fixed}$ is within the correction limit width based on a similar method by switching the SOC and the OCV in the foregoing determination method.

Figure 12:
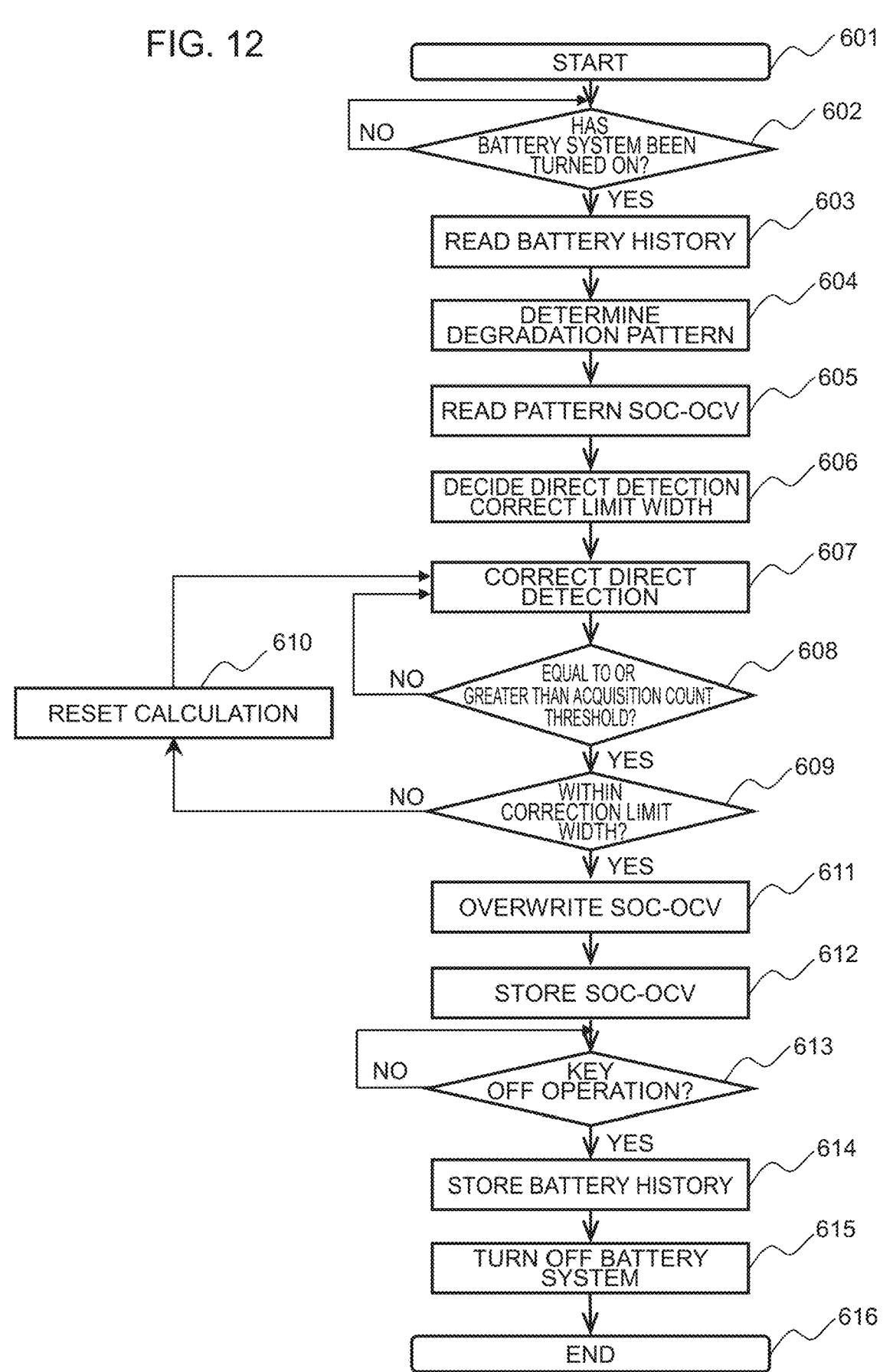
FIG. 12 is a flowchart showing the processing flow of the SOC-OCV correction unit according to the first embodiment of the present invention.

The overall operation of the SOC-OCV correction unit 151 is now explained with reference to the flowchart of FIG. 12. FIG. 12 is a flowchart showing the processing flow of the SOC-OCV correction unit 151 according to the first embodiment of the present invention. As the previous step of the processing flow of FIG. 12, let it be assumed that the SOC-OCV correction unit 151 has acquired the SOC-OCV characteristic for each state of health corresponding to the operating history of the battery (SOH in this embodiment) from the results of the degradation test of the battery conducted in advance, and such acquired SOC-OCV characteristics are stored in the SOC-OCV library 512.

In initial START step 601 of FIG. 12, the processing of step 602 onward is performed by causing the SOC-OCV correction unit 151 to start a predetermined SOC-OCV characteristic correction logic.

In battery system ON determination step 602, whether the key of the vehicle has been turned ON and the battery system 100 has been consequently turned ON is determined. Step 602 is repeated when the battery system 100 is OFF, and the processing is advanced to subsequent step 603 when it is confirmed that the battery system 100 has been turned ON.

In battery history reading step 603, the use history information of the battery is read. Here, the values of the $SOC_{control}$, the $SOC\text{-}OCV_{temp}$, the SOH and the like at the time that the previous processing was ended are read from the storage unit 180 as the use history information of the battery, and read into the memory.

In degradation pattern determination step 604, the degradation pattern is determined from the battery history read in step 603. Here, the pattern determination unit 511 of the pattern calling unit 510 determines the degradation pattern according to the SOH read in step 603 based on the method described above.

In pattern SOC-OCV reading step 605, the SOC-OCV characteristic corresponding to the degradation pattern obtained in step 604 is read. Here, the SOC-OCV characteristic corresponding to the degradation pattern determined in step 604 is called among the various SOC-OCV characteristics stored in the SOC-OCV library 512 of the pattern calling unit 510, and stored in the memory as the SOC-$OCV_{pattern}$.

In direct detection correction limit width decision step 606, the correction limit width designation unit 520 decides the correction limit width for the SOC-$OCV_{pattern}$ read from the SOC-OCV library 512 in step 605.

In direct detection correction step 607, the direct detection correction unit 530 corrects the SOC-$OCV_{pattern}$ based on direct detection by using the respective state measurement values of the battery capacity $Q_{max}$, the current I, the OCV, and the polarization voltage $V_p$ obtained from the battery system 100, and the SOC-$OCV_{pattern}$ read from the SOC-OCV library 512 in step 605. Here, foremost, the corrected OCV pair/integrated current acquisition unit 531 of the direct detection correction unit 530 acquires a stable OCV pair ($OCV_1$, $OCV_2$) as described above based on the respective state measurement values of the battery, and obtains the difference $\Delta SOC$ of the SOC therebetween. Subsequently, based on these values, the SOC-OCV direct detection correction unit 532 calculates the SOC-$OCV_{pattern, fixed}$, which is the SOC-OCV characteristic obtained by correcting the SOC-$OCV_{pattern}$, and the sequence $N_{count}$ representing the correction count at each point based on the method described above.

In direct detection correction count determination step 608, the acquisition count of the SOC and the OCV based on direct detection; that is, whether the correction count of the SOC-OCV characteristic based thereon is equal to or greater than a predetermined threshold is determined. Here, the SOC-OCV overwrite determination unit 533 of the direct detection correction unit 530 determines whether the sequence $N_{count}$ of the correction count calculated in step 607 is equal to or greater than a predetermined threshold sequence $N_{th}$ at all points. If the $N_{count}$ is consequently less than the $N_{th}$ in at least one point, the processing is returned to step 607 and the correction of the SOC-$OCV_{pattern}$ based on direct detection is continued. Meanwhile, the processing is advanced to step 609 when the $N_{count}$ is equal to or greater than the $N_{th}$ at all points.

In correction limit width determination step 609, whether the SOC-$OCV_{pattern, fixed}$ obtained as the corrected SOC-OCV characteristic in step 607 is within the range of the correction limit width decided in step 606 is determined. Here, the SOC-OCV overwrite determination unit 533 determines whether the SOC-$OCV_{pattern, fixed}$ is within the correction limit width based on the method described above. The processing is advanced to calculation reset step 610 when the SOC-$OCV_{pattern, fixed}$ is outside the correction limit width, the previously obtained values of the SOC- $OCV_{pattern, fixed}$ and the $N_{count}$ are reset in step 610, and the operation is thereafter re-performed from step 607. Meanwhile, the processing is advanced to step 611 when the SOC-$OCV_{pattern, fixed}$ is within the correction limit width.

In SOC-OCV characteristic overwrite step 611, the SOC-OCV overwrite determination unit 533 overwrites the SOC-$OCV_{temp}$ to be used for the operation of the $SOC_{control}$ with the SOC-$OCV_{pattern, fixed}$ obtained in step 607, and outputs the result.

In SOC-OCV characteristic storage step 612, the SOC-$OCV_{temp}$ overwritten in step 611 is stored in the storage unit 180.

In key OFF determination step 613, whether the key OFF operation of the vehicle has been performed is determined. When the key OFF operation has not been performed and the key of the vehicle is still ON, this step is repeated. When key OFF operation is detected, the processing is advanced to subsequent step 614.

In battery history storage step 614, the values of the $SOC_{control}$, the SOC-$OCV_{temp}$, the SOH and the like when the key OFF operation was performed are stored in the storage unit 180 as the use history information of the battery.

In battery system OFF step 615, the power source of the battery system 100 is turned OFF.

In final END step 616, the operation of FIG. 12 is ended, and the operation of the SOC-OCV correction unit 151 is stopped.

Note that, in this embodiment, the correction of the SOC-OCV characteristic performed by the SOC-OCV correction unit 151 may be performed to one SOC-OCV characteristic representing the overall assembled battery 110 as described above, or may be performed individually to all single batteries 111 in the assembled battery 110. With the assembled battery 110, generally speaking, since the internal temperature distribution is not uniform and the temperature of the center part becomes highest, differences in the progress of degradation will occur for each single battery 111. Accordingly, by correcting the SOC-OCV characteristic for each single battery 111, it is possible to obtain an accurate SOC-OCV characteristic according to the temperature distribution.

The effect of the present invention is now explained with reference to FIG. 13 and FIG. 14.

Figure 13:
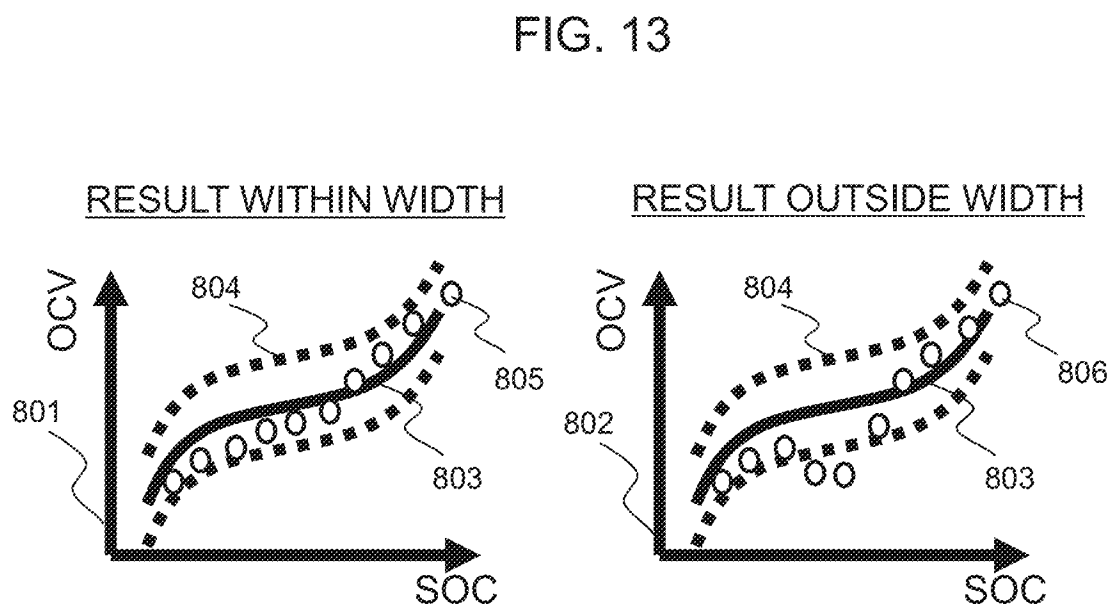

FIG. 13 is a diagram explaining the divergence inhibiting effect of the SOC-OCV characteristics according to the present invention. In FIG. 13, a conceptual diagram 801 on the left side shows a case where the SOC-$OCV_{pattern, fixed}$ is within the range of the correction limit width. In this conceptual diagram 801, the SOC-$OCV_{pattern}$ before correction is shown with a curved line 803, and the correction limit width designated for this SOC-$OCV_{pattern}$ is shown with two broken lines 804. Moreover, each point on the SOC-$OCV_{pattern, fixed}$ is shown with each point as represented by a point 805. In the foregoing case, since all points on the SOC-$OCV_{pattern, fixed}$ exist within the range of the correction limit width shown with the broken lines 804, in correction limit width determination step 609 of the processing flow of FIG. 12, it is determined that the SOC-$OCV_{pattern, fixed}$ is within the correction limit width. Consequently, the processing is advanced to SOC-OCV characteristic overwrite step 611, and the SOC-$OCV_{temp}$ is overwritten with the SOC-$OCV_{pattern, fixed}$ in this step. It is thereby possible to perform battery control based on a SOC-OCV characteristic that is close to the true value which reflects the individual variation and the degradation variation of the battery.

Meanwhile, when a measurement data error is included in the values of the OCV and the SOC obtained based on direct detection, a part or all of the SOC-OCV$_{pattern, fixed}$ may fall outside the range of the correction limit width. In FIG. 13, a conceptual diagram 802 on the right side shows a case where the SOC-OCV$_{pattern, fixed}$ is outside the correction limit width. In this conceptual diagram 802, similar to the conceptual diagram 801 on the left side, the SOC-OCV$_{pattern}$ before correction is shown with a curved line 803, and the correction limit width designated for this SOC-OCV$_{pattern}$ is shown with two broken lines 804. Moreover, each point on the SOC-OCV$_{pattern, fixed}$ is shown with each point as represented by a point 806. In the foregoing case, since certain points on the SOC-OCV$_{pattern, fixed}$ exist outside the range of the correction limit width shown with the broken lines 804, in correction limit width determination step 609 of the processing flow of FIG. 12, it is determined that the SOC-OCV$_{pattern, fixed}$ is outside the correction limit width. Consequently, the processing is not advanced to SOC-OCV characteristic overwrite step 611, and the value of the SOC-OCV$_{pattern, fixed}$ is reset in calculation reset step 610.

In cases where the SOC-OCV characteristic is corrected by overwriting the SOC-OCV$_{temp}$ with the SOC-OCV$_{pattern, fixed}$ containing an error, when the error of the SOC obtained based on direct detection relative to the actual SOC of the battery is great, there is a possibility that such error may contrarily expand. Nevertheless, as shown in the conceptual diagram 802, the present invention compares the corrected SOC-OCV characteristic with the correction limit width, and does not reflect the correction result in the calculation of the SOC when the corrected SOC-OCV characteristic is outside the range of the correction limit width. Accordingly, it is possible to suppress the divergence of the SOC-OCV characteristic.

Figure 14:
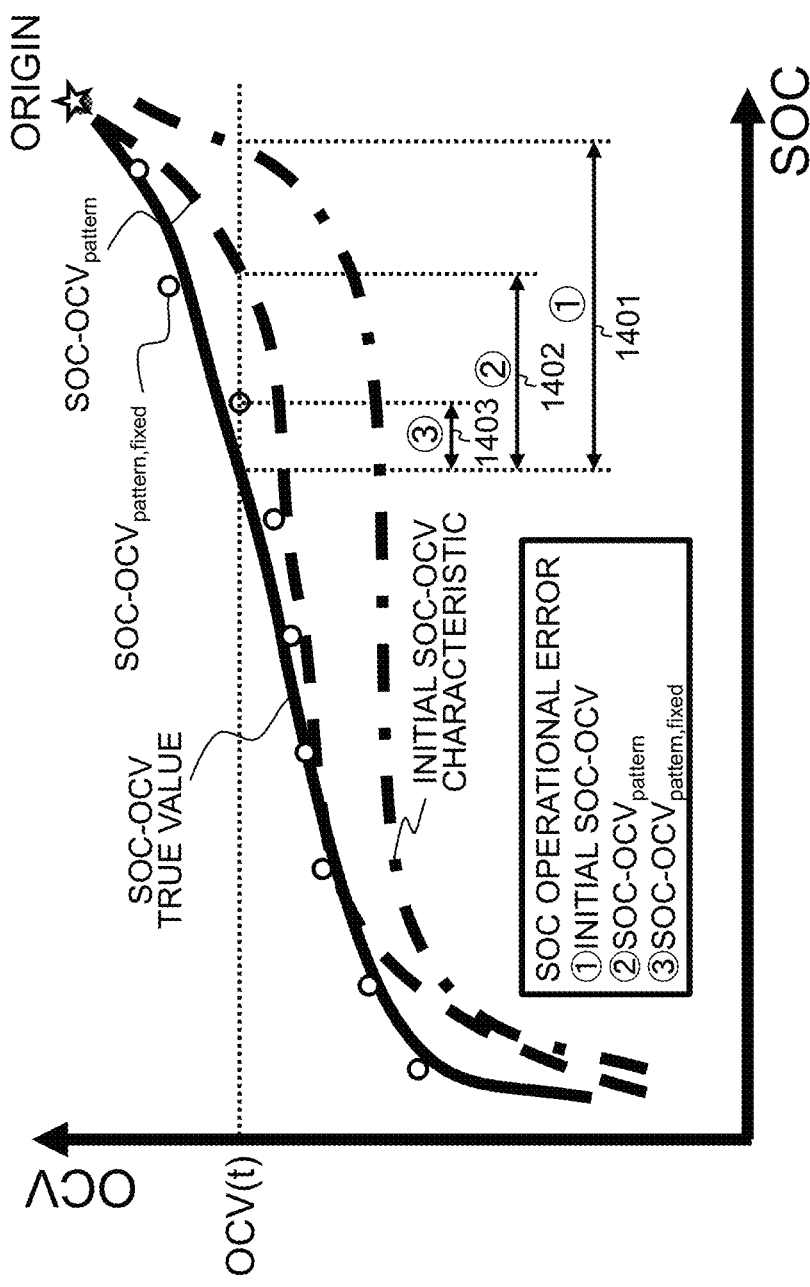
FIG. 14 is a diagram explaining the improvement of the SOC operational precision according to the present invention.

FIG. 14 is a diagram explaining the improvement of the SOC operational precision according to the present invention. The assembled battery control unit 150 calculates the OCV of the battery in a predetermined operation period from the respective state values of the current, the voltage, the temperature, the SOH and the like according to the state of the battery, and the SOC$_{control}$ is output using the SOC-OCV$_{temp}$. Here, as shown in FIG. 14, let it be assumed that the true value of the SOC-OCV characteristic has changed from the initial SOC-OCV characteristic shown with the dashed-dotted line to that of the solid line in the diagram due to the degradation or individual variation of the battery. When the value of the OCV acquired here is expressed as OCV(t), the SOC operational error in cases where the SOC-OCV characteristic is not corrected and the initial SOC-OCV characteristic is directly used as the SOC-OCV$_{temp}$ will be the value of the range shown with reference numeral 1401 in the diagram. In other words, in the foregoing case, the degradation and variation of the SOC-OCV characteristic are not dealt with, and a gross error will occur in the operation result of the SOC.

Moreover, the SOC operational error in cases where the SOC-OCV$_{pattern}$ read according to the SOH among the SOC-OCV characteristics stored in advance in the SOC-OCV library 512 is used as the SOC-OCV$_{temp}$ will be the value of the range shown with reference numeral 1402 in the diagram. In other words, in the foregoing case, while the operational error of the SOC will be smaller in comparison to the case of directly using the initial SOC-OCV characteristic as a result of using the SOC-OCV characteristic which gives consideration to the degradation of the battery, the error resulting from the prediction error of the individual variation and degradation pattern of the battery will remain.

Meanwhile, as explained in this embodiment, the SOC operational error in cases where the SOC-OCV$_{pattern, fixed}$, which was obtained by correcting the SOC-OCV$_{pattern}$ based on the values of the SOC and the OCV obtained based on direct detection, is used as the SOC-OCV$_{temp}$ will be the value of the range shown with reference numeral 1403 in the diagram. In other words, in the foregoing case, since the error resulting from the prediction error of the individual variation and degradation pattern of the battery is corrected, the value of the SOC operational error can be further reduced in comparison to the case of directly using the read SOC-OCV$_{pattern}$ as the SOC-OCV$_{temp}$.

Note that, when correcting the SOC-OCV$_{pattern}$ based on direct detection, a point to become the origin (reference point) of the ΔSOC is required as described above, and in this embodiment a point on the SOC-OCV$_{pattern}$ is used as the origin. Thus, it is possible to reduce the offset error in the corrected SOC-OCV characteristic in comparison to the case of obtaining the origin from the initial SOC-OCV characteristic.

According to the first embodiment of the present invention explained above, the pattern of the SOC-OCV characteristic according to the state of health of the battery is called, the corresponding correction limit width is prescribed, and the SOC-OCV characteristic is corrected from the actual measurement data of the battery. It is thereby possible to resolve the conventional problem of not being able to deal with the pattern calling of the SOC-OCV characteristic according to the state of health in the following manner.

First, the present invention can deal with errors caused by the individual variation and degradation prediction of the battery. The degradation prediction of a secondary battery is generally obtained by subjecting a certain charge/discharge pattern to cycle testing in a thermostatic bath. Nevertheless, it is known that the SOC-OCV characteristics of secondary batteries differ due to variations during the manufacture thereof, and it is not possible to deal with this problem based on conventional pattern calling. Moreover, since the actual use history (temperature, SOC, current and the like) of the battery will never coincide with the conditions of the cycle testing, an error will invariably occur in the degradation prediction of the battery. Meanwhile, the present invention can obtain a SOC-OCV characteristic that coincides with the actual characteristic of the secondary battery by combining direct detection with pattern calling.

Second, the present invention can determine the divergence of the SOC-OCV characteristic by using the pattern calling and correction limit width based on the operating history that is not influenced by direct detection or indirect detection. Thus, it is possible to correct the SOC-OCV characteristic only based on the signals of the battery system while the vehicle is being driven without having to use a power source or sensors outside the vehicle.

According to the first embodiment of the present invention explained above, the following operation and effect are yielded.

(1) An SOC operation system 155 functions as a battery control device which obtains a state of charge (SOC) of a single battery 111, which is a secondary battery, and an assembled battery 110 based on a SOC-OCV characteristic representing a relationship of the SOC and a voltage of these batteries. An SOC-OCV correction unit 151 in the SOC operation system 155 comprises a pattern calling unit 510 which calls a first characteristic (SOC-OCV$_{pattern}$) among a plurality of SOC-OCV characteristics stored in advance based on use history information of the battery, a correction limit width designation unit 520 which designates a correction limit width for prescribing a tolerance level of correcting the $SOC\text{-}OCV_{pattern}$, and a direct detection correction unit 530 which creates a second characteristic $(SOC\text{-}OCV_{temp})$ in which the $SOC\text{-}OCV_{pattern}$ has been corrected according to the correction limit width based on a current value I and a voltage value OCV of the battery. An operation unit 152 in the SOC operation system 155 obtains the SOC of the battery using the $SOC\text{-}OCV_{temp}$. As a result of adopting the foregoing configuration, the SOC can be operated with a high degree of accuracy even when the SOC-OCV characteristic changes due to the degradation or individual variation of a battery.

(2) The pattern calling unit 510 calls the $SOC\text{-}OCV_{pattern}$ by using the state of health (SOH) of the battery as the use history information of the battery. As a result of adopting the foregoing configuration, an appropriate $SOC\text{-}OCV_{pattern}$ can be easily called according to the state of health of the battery.

(3) As shown in FIG. 5, the correction limit width designation unit 520 designates, as the correction limit width, a certain OCV width for each SOC or a certain SOC width for each OCV. As a result of adopting the foregoing configuration, the correction limit width can be easily designated according to the production tolerance of the battery or the variation in the state of health.

(4) The SOC operation system 155 additionally comprises an OCV operation unit 153 which calculates an open voltage value OCV and a polarization voltage value $V_p$ of the battery based on the current value I and the voltage value CCV of the battery. As explained in FIG. 9, the direct detection correction unit 530 acquires, a plurality of times within a predetermined time range, an open voltage value OCV ($OCV_1$, $OCV_2$) of the battery when the current value I and the polarization voltage value $V_p$ are respectively smaller than a predetermined threshold, obtains the SOC based on Formula (2) and Formula (3) described above by using each of the acquired open voltage values $OCV_1$, $OCV_2$, a current integrated value in an acquisition period of each of the open voltage values, and the $SOC\text{-}OCV_{pattern}$, creates the $SOC\text{-}OCV_{pattern,\ fixed}$ based thereon, and thereby creates the $SOC\text{-}OCV_{temp}$. As a result of adopting the foregoing configuration, it is possible to correct the $SOC\text{-}OCV_{pattern}$ from the values of the OCV and the SOC acquired based on direct detection, and create an appropriate $SOC\text{-}OCV_{temp}$ according to the state of the battery.

(5) Based on the configuration shown in FIG. 8, the direct detection correction unit 530 corrects the $SOC\text{-}OCV_{pattern}$ based on the current value I and the voltage value OCV of the battery, and creates the $SOC\text{-}OCV_{temp}$ by limiting the $SOC\text{-}OCV_{pattern,\ fixed}$, which represents the corrected $SOC\text{-}OCV_{pattern}$, to be within a range of the correction limit width. As a result of adopting the foregoing configuration, it is possible to suppress the divergence of the correction result while appropriately correcting the $SOC\text{-}OCV_{pattern}$ according to the state of the battery.

Second Embodiment

The second embodiment of the present invention is now explained. The foregoing first embodiment explained an example where the correction limit width designation unit 520 designates a certain OCV width for all SOCs or designates a certain SOC width for all OCVs as the correction limit width. Meanwhile, the following second embodiment explains an example where an OCV width which is different for each SOC or an SOC width which is different for each OCV is designated as the correction limit width.

Figure 15:
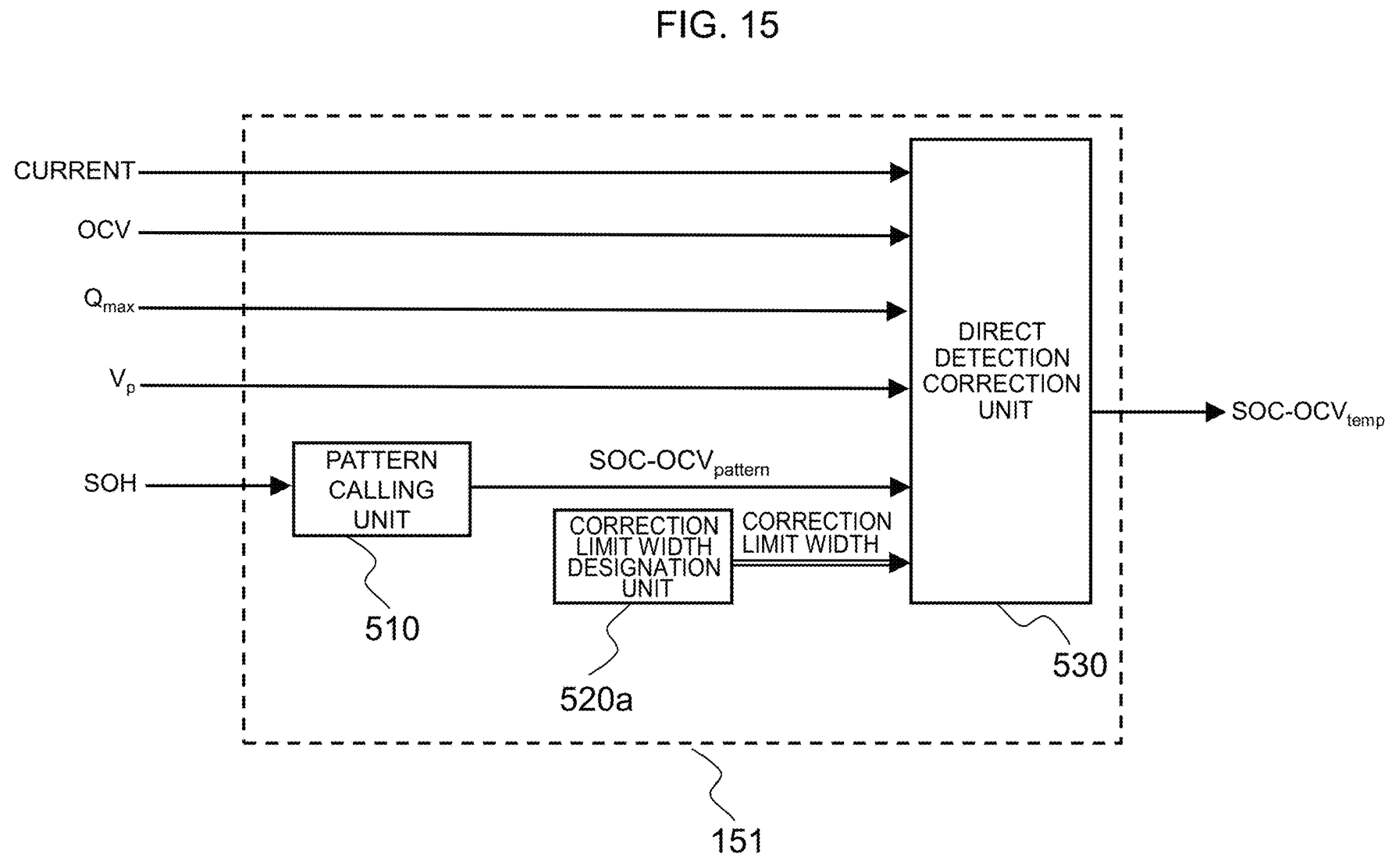

FIG. 15 is a diagram showing the functional configuration of the SOC-OCV correction unit 151 according to the second embodiment of the present invention. The SOC-OCV correction unit 151 in this embodiment is configured in the same manner as the first embodiment other than the point of comprising a correction limit width designation unit 520a in substitute for the correction limit width designation unit 520.

Figure 16:
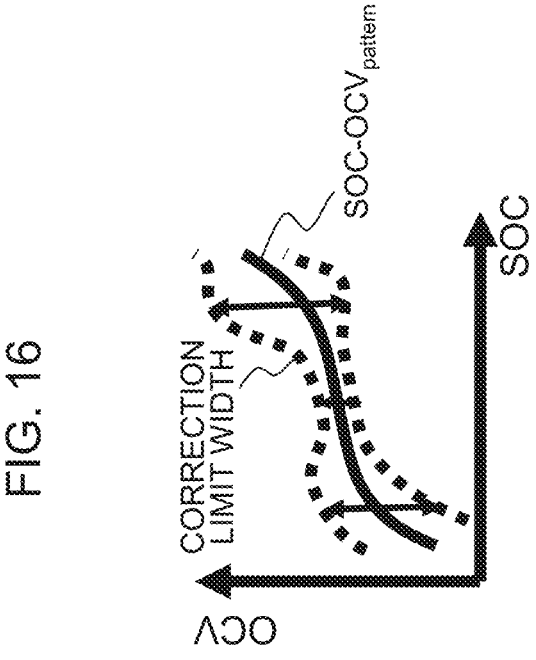
FIG. 16 is a diagram showing an example of the correction limit width designated by the correction limit width designation unit according to the second embodiment of the present invention.

The correction limit width designation unit 520a designates the correction limit width for prescribing the tolerance level of the correction to be performed by the direct detection correction unit 530 to the $SOC\text{-}OCV_{pattern}$. FIG. 16 is a diagram showing an example of the correction limit width designated by the correction limit width designation unit 520a according to the second embodiment of the present invention. In this embodiment, the correction limit width designation unit 520a designates as the correction limit width, for example, as shown in FIG. 16, an OCV width that differs for each value of the SOC for each SOC of the $SOC\text{-}OCV_{pattern}$. This OCV width is set, for example, by acquiring in advance the SOC-OCV characteristics of a plurality of batteries in their brand new state and based on their state of health, and setting the OCV width in correspondence with the individual difference thereof. It is thereby possible to set a relatively large correction limit width in an SOC region where variation is likely to occur and appropriately correct the $SOC\text{-}OCV_{pattern}$ in correspondence with the actual variation, and set a relatively small correction limit width in an SOC region where the variation is small and more finely prevent the divergence of the correction result of the $SOC\text{-}OCV_{pattern}$ caused by the various errors.

Note that, while FIG. 16 shows an example of designating an OCV width that differs for each value of the SOC as the correction limit width, as shown in the right diagram of FIG. 5 in the first embodiment, it is also possible to designate an SOC width that differs for each value of the OCV as the correction limit width upon designating the range of the SOC relative to each OCV of the $SOC\text{-}OCV_{pattern}$ as the correction limit width. Even in the foregoing case, it is also possible to appropriately correct the $SOC\text{-}OCV_{pattern}$ in correspondence with the actual variation, and more finely prevent the divergence of the correction result of the $SOC\text{-}OCV_{pattern}$ caused by the various errors.

Figure 17:
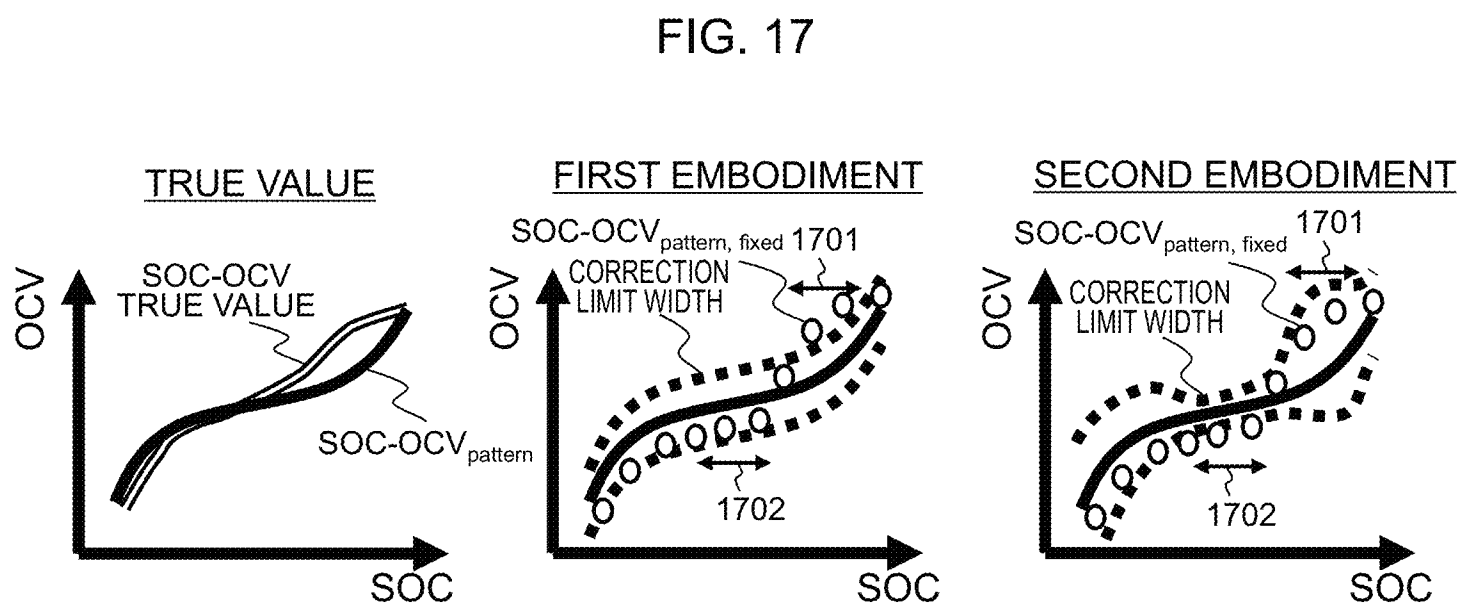

FIG. 17 is a diagram explaining the effect based on the second embodiment of the present invention in comparison to the effect of the first embodiment. Here, as shown in the left diagram of FIG. 17, considered is a case where the $SOC\text{-}OCV_{pattern}$ as shown with a solid line in the first embodiment and this embodiment is each called relative to the SOC-OCV true value shown with a double line, and the same $SOC\text{-}OCV_{pattern,\ fixed}$ is operated.

In the first embodiment, as shown in the center diagram of FIG. 17, the correction limit width is assigned based on a certain OCV width. Here, let it be assumed that the region having a high SOC shown with reference numeral 1701 is a region where the variation in the SOC-OCV characteristic caused by degradation or manufacturing errors is great. In this region 1701, considered is a case where the points on the $SOC\text{-}OCV_{pattern,\ fixed}$ in the diagram have fallen outside the $SOC\text{-}OCV_{pattern}$. In the foregoing case, since the correction limit width is assigned based on a fixed OCV width in the first embodiment, when the correction limit width is small, the points on the SOC-OCV$_{pattern,\ fixed}$ in the region 1701 will fall outside the range of the correction limit width, and the correction of the SOC-OCV$_{pattern}$ is not performed. Accordingly, it is not possible to overwrite the SOC-OCV$_{temp}$.

Meanwhile, in this embodiment, as shown in the right diagram of FIG. 17, the correction limit width is assigned based on an OCV width corresponding to the variation in the SOC-OCV characteristics of each SOC. Thus, as a result of the points on the SOC-OCV$_{pattern,\ fixed}$ in the region 1701 falling within the range of the correction limit width, it is possible to correct the SOC-OCV$_{pattern}$ and obtain the SOC-OCV$_{temp}$. Consequently, it is possible to obtain the SOC-OCV characteristic, which more accurately reflects the state of battery, as the overwritten SOC-OCV$_{temp}$, and the SOC can be operated accurately.

Moreover, let it be assumed that the region where the SOC is midrange as shown with reference numeral 1702 is a region where the variation in the SOC-OCV characteristics is small. Since the correction limit width is assigned based on a fixed OCV width in the first embodiment, in order for the correction of the SOC-OCV$_{pattern}$ to be performed in the region 1701 described above, the correction limit width also needs to be set broadly in this region 1702. Accordingly, there is a possibility that the SOC-OCV$_{pattern}$ may be corrected excessively.

Meanwhile, in this embodiment, as shown in the right diagram of FIG. 17, the correction limit width is assigned based on an OCV width corresponding to the variation in the SOC-OCV characteristics of each SOC. Thus, it is possible to set the correction limit width broadly in the region 1701 and set the correction limit width narrowly in the region 1702, and the possibility of the SOC-OCV$_{pattern}$ being corrected excessively can be eliminated. In other words, when the relationship of the OCV and the SOC that deviates from the true value is acquired based on direct detection due to measurement errors or other reasons, it is possible to eliminate the possibility of the SOC-OCV characteristic being corrected based thereon. Consequently, it is possible to prevent an SOC-OCV characteristic containing a gross error from being used as the SOC-OCV$_{temp}$, and the SOC can be operated accurately.

In this embodiment, the two effects explained above are obtained and, consequently, the SOC-OCV$_{temp}$ can be overwritten using the SOC-OCV$_{pattern,fixed}$ which is closer to the true value of the SOC-OCV in comparison to the first embodiment.

According to the second embodiment of the present invention explained above, the following operation and effect are yielded in addition to those explained in the first embodiment.

(6) As shown in FIG. 16 and FIG. 17, the correction limit width designation unit 520$a$ designates, as the correction limit width, an OCV width which differs for each predetermined SOC or an SOC width which differs for each predetermined OCV. As a result of adopting the foregoing configuration, since it is possible to designate the correction limit width in detail according to the actual production tolerance of the battery or the variation in the actual state of health of the battery, the SOC can be operated with a higher degree of accuracy.

Third Embodiment

The third embodiment of the present invention is now explained. The foregoing first and second embodiments explained an example where the correction limit width designation units 520, 520$a$ respectively designate a certain correction limit width without depending on the state of health of the battery. Meanwhile, the following third embodiment explains an example where the correction limit width is changed according to the operating history of the battery.

Figure 18:
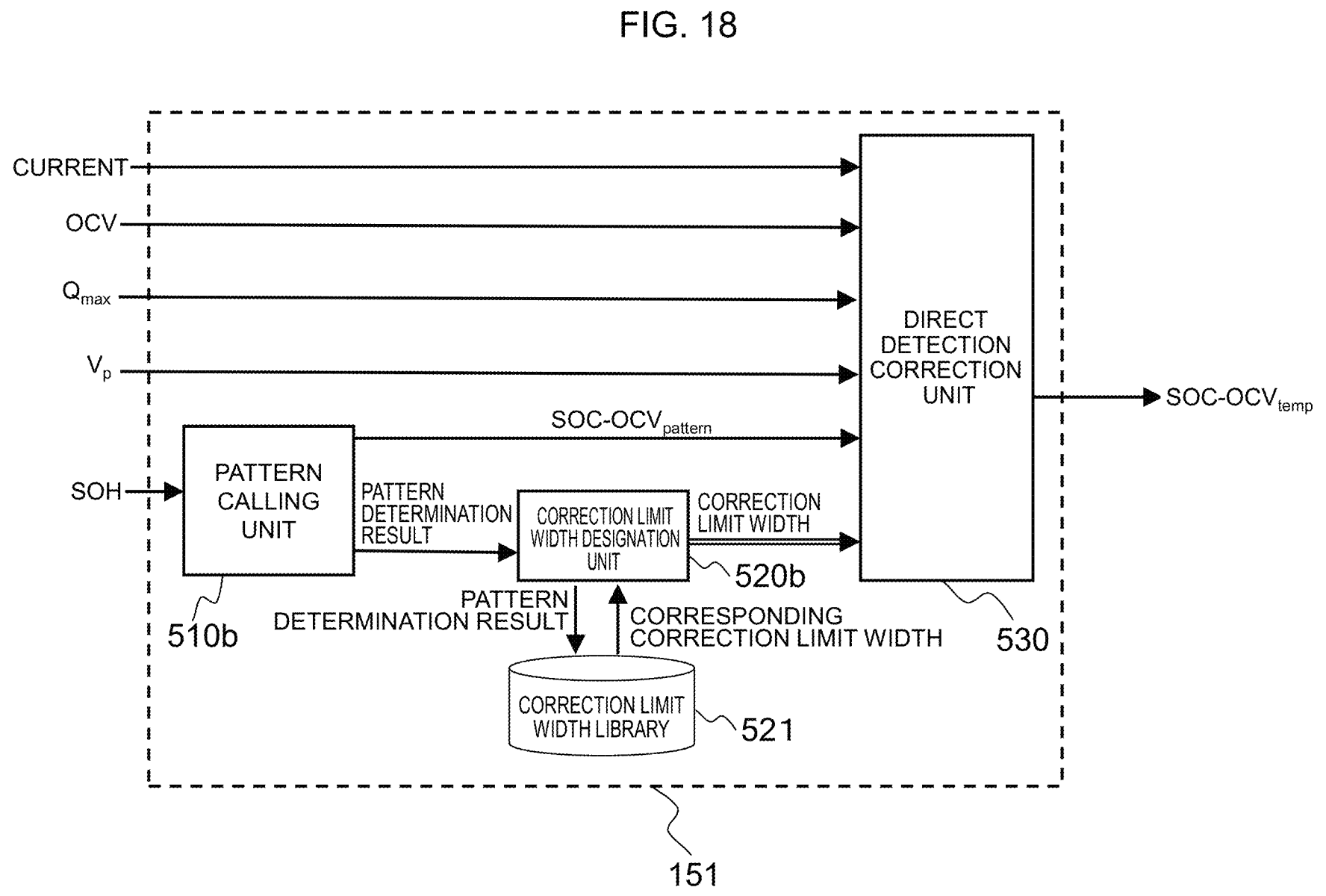

FIG. 18 is a diagram showing the functional configuration of the SOC-OCV correction unit 151 according to the third embodiment of the present invention. The SOC-OCV correction unit 151 in this embodiment is configured in the same manner as the first embodiment other than the point of comprising a pattern calling unit 510$b$ and a correction limit width designation unit 520$b$ in substitute for the pattern calling unit 510 and the correction limit width designation unit 520, respectively, and the point of additionally comprising a correction limit width library 521.

The pattern calling unit 510$b$ outputs the SOC-OCV$_{pattern}$ in the same manner as the pattern calling unit 510 in the first embodiment. In addition, the pattern calling unit 510$b$ outputs, as the pattern determination result, the determination result of the degradation pattern of the battery when the SOC-OCV$_{pattern}$ was called from the SOC-OCV library 512.

The correction limit width designation unit 520$b$ inputs the foregoing pattern determination result, and calls and acquires the correction limit width corresponding to that degradation pattern among a plurality of correction limit widths stored in advance in the correction limit width library 521 based thereon. The correction limit width designation unit 520$b$ subsequently designates the acquired correction limit width in the direct detection correction unit 530.

The correction limit width library 521 has a database of the correction limit widths corresponding to various degradation patterns of the battery. For example, the correction limit width library 521 can be built by acquiring in advance the correction limit width according to the degradation pattern as a result of conducting a degradation test of different conditions to a plurality of batteries and obtaining the difference between the SOC-OCV characteristics of the batteries having the same SOH, and compiling a database of the relationship. In other words, the contents of the correction limit width library 521 can be decided by acquiring in advance the variation of the SOC, which can be acquired relative to the same OCV based on the actual degradation and individual variation of the battery, according to the state of health of the battery.

The correction limit width is decided as the error that is anticipated between the SOC-OCV$_{pattern}$ and the true SOC-OCV characteristic. This error occurs due to the determination error of the manufacturing variation and degradation pattern of the battery. Since the determination error of the degradation pattern will expand as the operating history of the battery becomes longer, in the first and second embodiments, the estimation error margin of the degradation pattern needs to be included in the correction limit width so that the correction limit width will properly function under both conditions where the operating history is short and where the operating history is long.

Figure 19:
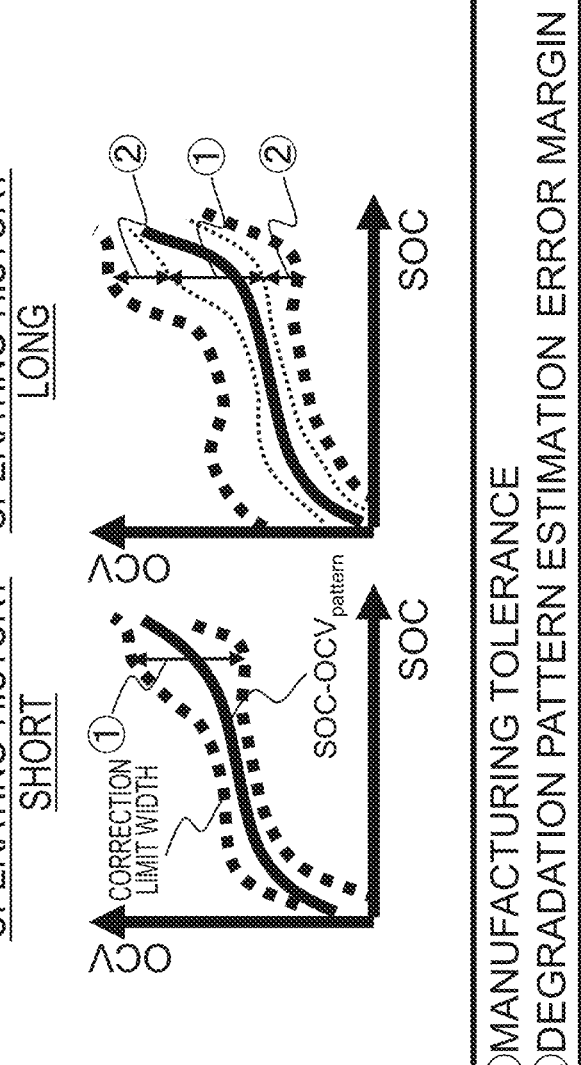
FIG. 19 is a diagram showing an example of the correction limit width designated by the correction limit width designation unit according to the third embodiment of the present invention.

Meanwhile, the correction limit width decided by the correction limit width designation unit 520$b$ in this embodiment changes according to the operating history of the battery. FIG. 19 is a diagram showing an example of the correction limit width designated by the correction limit width designation unit 520$b$ according to the third embodiment of the present invention. In this embodiment, as shown in FIG. 19, in order to deal with the estimation error margin of the degradation pattern that expands according to the progress of the degradation of the battery, the correction limit width designated by the correction limit width designation unit 520b is gradually expanded according to the operating history of the battery. Consequently, it is possible to reduce the correction limit width and suppress the divergence of the SOC-OCV characteristics in a state where the battery is basically brand new where the difference in the SOC-OCV characteristics among the batteries is small, and increase the correction limit width and perform control corresponding to the variation of each battery in a state of health where the difference in the SOC-OCV characteristics among the batteries is great.

Figure 20:
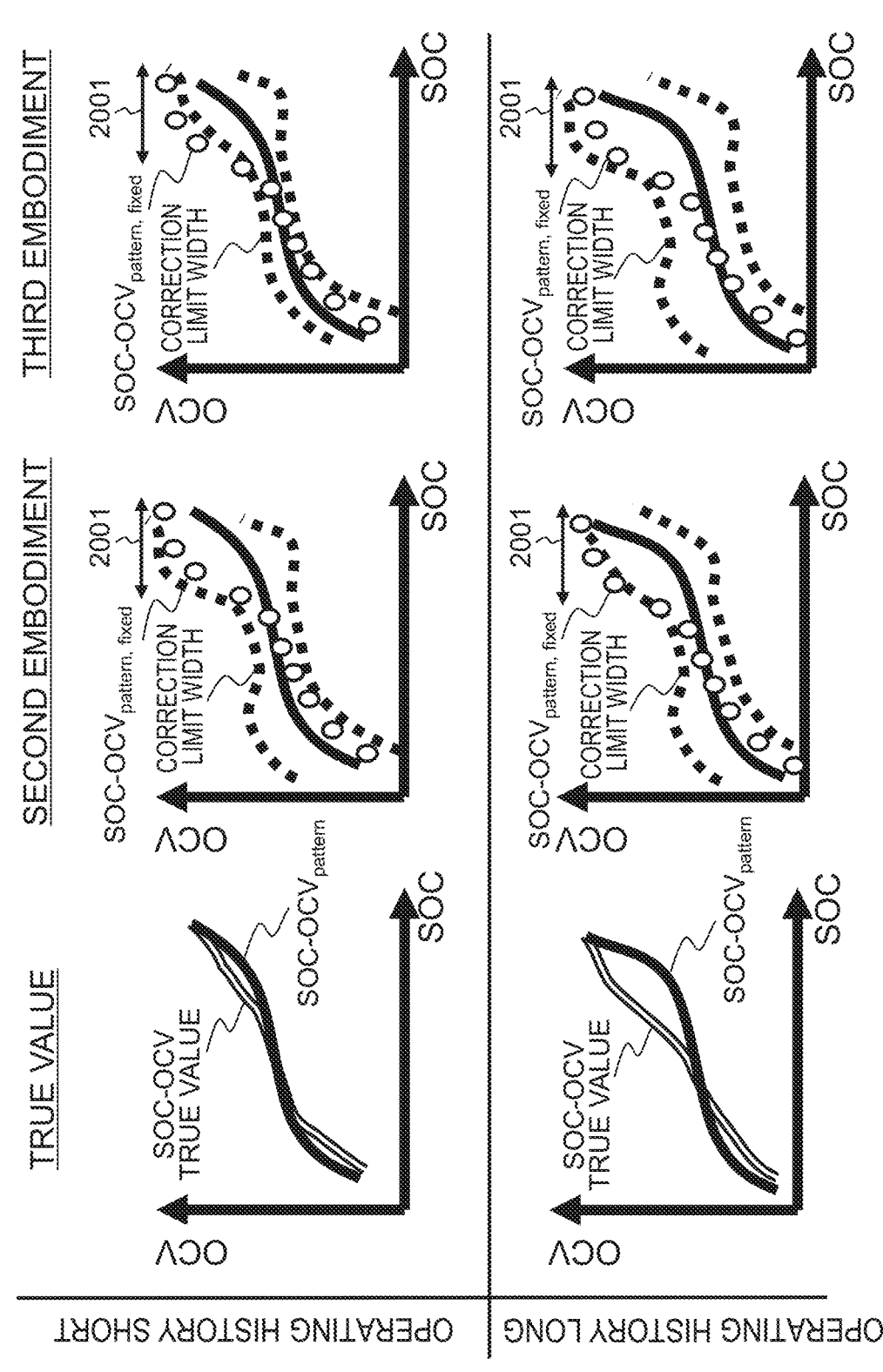
FIG. 20 is a diagram explaining the effect based on the third embodiment of the present invention in comparison to the effect of the second embodiment.

FIG. 20 is a diagram explaining the effect based on the third embodiment of the present invention in comparison to the effect of the second embodiment. Here, as shown respectively in the upper left diagram and the lower left diagram of FIG. 20, considered is a case where the $SOC\text{-}OCV_{pattern}$ as shown with a solid line in the second embodiment and this embodiment is each called relative to the SOC-OCV true value shown with a double line, and the same $SOC\text{-}OCV_{pattern,\,fixed}$ is operated. Here, let it be assumed that the $SOC\text{-}OCV_{pattern,\,fixed}$, due to some kind of error factor, has an OCV that is higher than the SOC-OCV true value in a region having a high SOC respectively shown with reference numeral 2001 in the upper and lower center diagram and right diagram of FIG. 20. Thus, in the region 2001, it is necessary to set the correction limit width by increasing the estimation error margin of the degradation pattern.

In the second embodiment, the correction limit width is set by fixing the estimation error margin of the degradation pattern irrespective of the operating history of the battery. Thus, when the operating history of the battery is short, as shown in the upper center diagram of FIG. 20, the correction limit width is set relatively broadly in the region 2001, and the points on the $SOC\text{-}OCV_{pattern,\,fixed}$ shown in the diagram fall within the range of the correction limit width. Consequently, the correction of the $SOC\text{-}OCV_{pattern}$ is performed and the $SOC\text{-}OCV_{temp}$ is overwritten.

Meanwhile, in this embodiment, when the operating history of the battery is short, the correction limit width is set by reducing the estimation error margin of the degradation pattern. Thus, in the foregoing case, as shown in the upper right diagram of FIG. 20, the correction limit width is set in the region 2001 to be narrower than the second embodiment, and the points on the $SOC\text{-}OCV_{pattern,\,fixed}$ shown in the diagram will fall outside the range of the correction limit width. Consequently, the correction of the $SOC\text{-}OCV_{pattern}$ is not performed, and the $SOC\text{-}OCV_{temp}$ is not overwritten. Accordingly, this embodiment is able to obtain a more accurate SOC.

Moreover, in the second embodiment, when the operating history of the battery is sufficiently long, as shown in the lower center diagram of FIG. 20, the correction limit width is set to be relatively narrow in the region 2001, and the points on the $SOC\text{-}OCV_{pattern,\,fixed}$ shown in the diagram will fall outside the correction limit width. Consequently, the correction of the $SOC\text{-}OCV_{pattern}$ is not performed, and the $SOC\text{-}OCV_{temp}$ is not overwritten.

Meanwhile, in this embodiment, when the operating history of the battery is sufficiently long, the correction limit width is set by increasing the estimation error margin of the degradation pattern. Thus, in the foregoing case, as shown in the lower right diagram of FIG. 20, the correction limit width is set in the region 2001 to be broader than the second embodiment, and the points on the $SOC\text{-}OCV_{pattern,\,fixed}$ shown in the diagram will fall within the range of the correction limit width. Consequently, the correction of the $SOC\text{-}OCV_{pattern}$ is performed, and the $SOC\text{-}OCV_{temp}$ is overwritten. Accordingly, this embodiment is able to obtain a more accurate SOC.

According to the third embodiment of the present invention explained above, the following operation and effect are yielded in addition to those explained in the first and second embodiments.

(7) As shown in FIG. 19 and FIG. 20, the correction limit width designation unit 520b changes the correction limit width according to the use history of the battery. Specifically, the correction limit width designation unit 520b changes the correction limit width according to the use history of the battery by selecting one among a plurality of correction limit widths stored in advance in the correction limit width library 521 based on the $SOC\text{-}OCV_{pattern}$. As a result of adopting the foregoing configuration, since it is possible to change the correction limit width according to changes in the determination error of the degradation pattern that occurs according to the operating history of the battery, the SOC can be operated with a higher degree of accuracy.

Fourth Embodiment

The fourth embodiment of the present invention is now explained. The foregoing first to third embodiments explained an example of the pattern calling unit 510 determining the degradation pattern of the battery by using the SOH as the use history information of the battery, calling the SOC-OCV characteristic corresponding to that degradation pattern, and outputting the $SOC\text{-}OCV_{pattern}$. Meanwhile, the following fourth embodiment explains an example of determining the degradation pattern by using a plurality of pieces of information, and not only the SOH, as the use history information of the battery.

Figure 21:
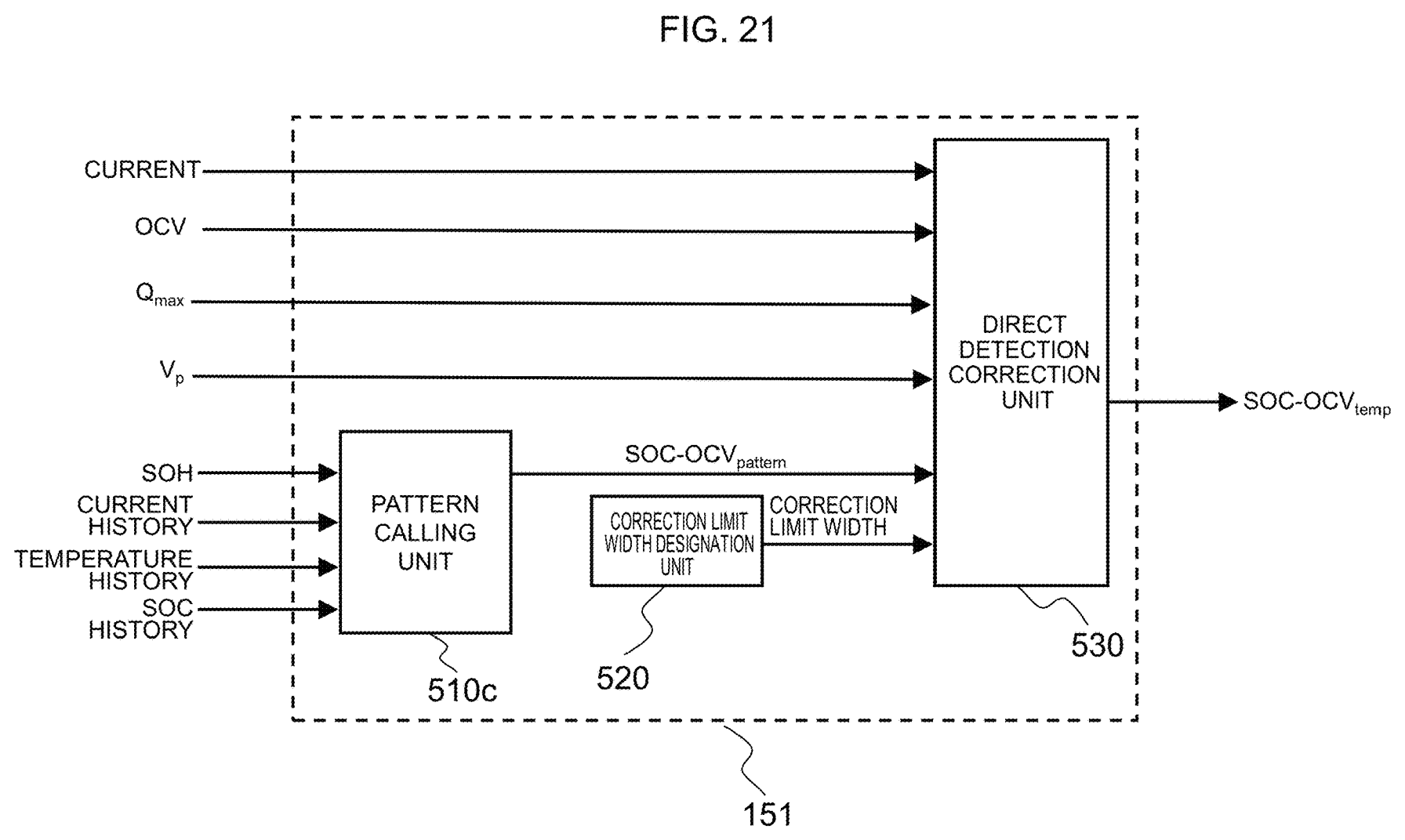

FIG. 21 is a diagram showing the functional configuration of the SOC-OCV correction unit 151 according to the fourth embodiment of the present invention. The SOC-OCV correction unit 151 in this embodiment is configured in the same manner as the first embodiment other than the point of comprising a pattern calling unit 510c in substitute for the pattern calling unit 510.

The pattern calling unit 510c uses a plurality of pieces of information, such as the SOH, the current history, the temperature history and the SOC history, as the user history information of the battery as the inputs, determines the degradation pattern of the battery based on the foregoing information, and calls the SOC-OCV characteristic corresponding to that degradation pattern among a plurality of SOC-OCV characteristics stored in advance. The pattern calling unit 510c subsequently outputs the information of the called SOC-OCV characteristic as the $SOC\text{-}OCV_{pattern}$.

Figure 22:
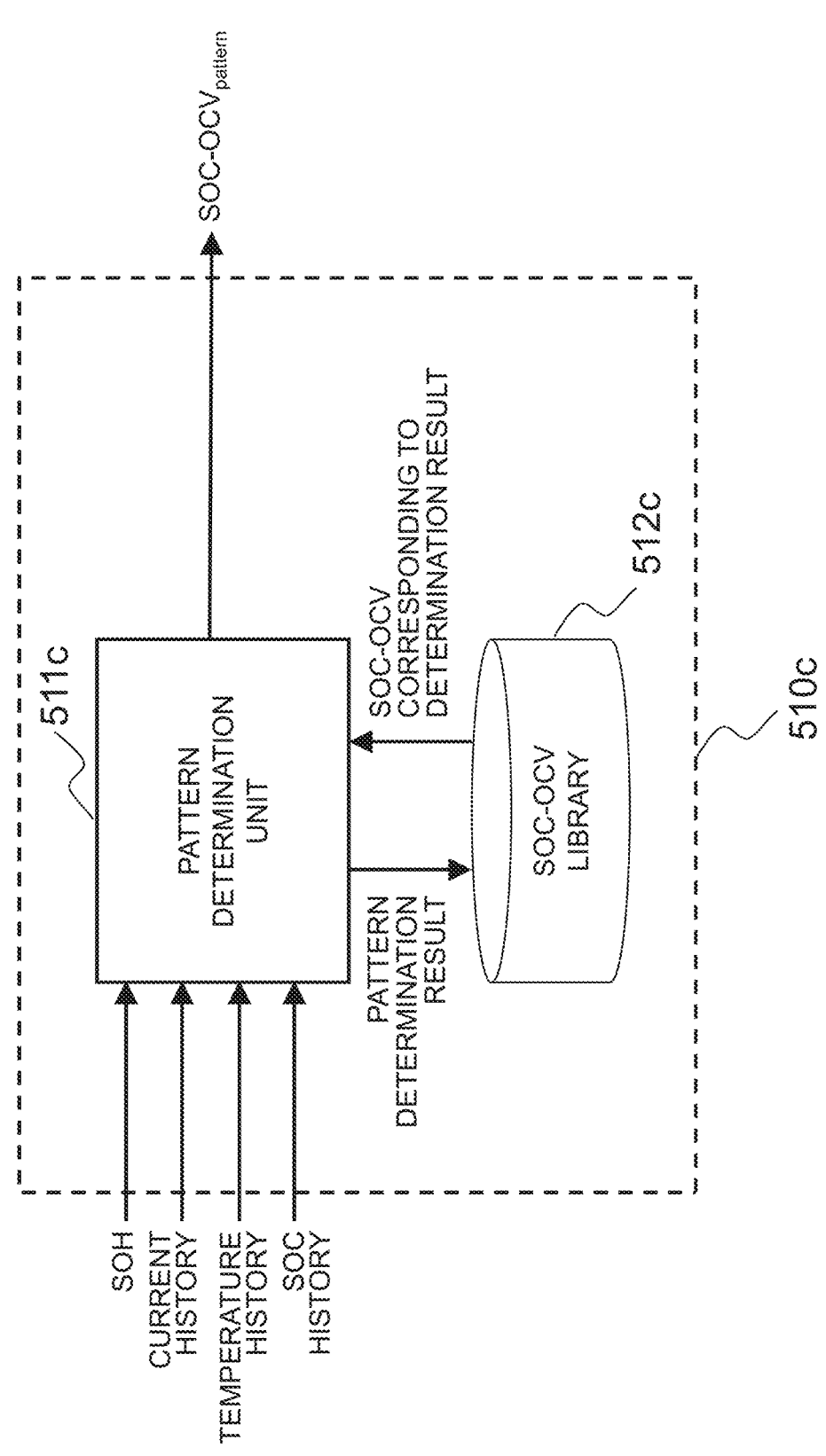
FIG. 22 is a diagram showing the configuration of the pattern calling unit according to the fourth embodiment of the present invention.

FIG. 22 is a diagram showing the configuration of the pattern calling unit 510c according to the fourth embodiment of the present invention. The pattern calling unit 510c includes a pattern determination unit 511c, and an SOC-OCV library 512c.

The pattern determination unit 511c performs pattern determination based on each piece of information that was input as the use history information of the battery; that is, based on the input SOH, current history, temperature history and SOC history, and calls the SOC-OCV characteristic corresponding to that pattern determination result by searching the SOC-OCV library 512c. The pattern determination unit 511c subsequently generates the $SOC\text{-}OCV_{pattern}$ from the called SOC-OCV characteristic and outputs the generated $SOC\text{-}OCV_{pattern}$.

The SOC-OCV library 512c has a database of the SOC-OCV characteristics for each combination of the values of each piece of information input to the pattern determination unit 511c; that is, the values of the SOH, the current history, the temperature history and the SOC history. For example, the foregoing information is associated respectively with four axes, and the result of associating the SOC-OCV characteristics for each coordinate value expressed with the four axes is stored as the database of the SOC-OCV characteristics. In the foregoing case, the pattern determination unit 511c acquires the SOC-OCV characteristic corresponding to the input use history information by identifying the coordinate value based on the pattern determination result and calling the SOC-OCV characteristic corresponding to the coordinate value by searching the SOC-OCV library 512c.

Figure 23:
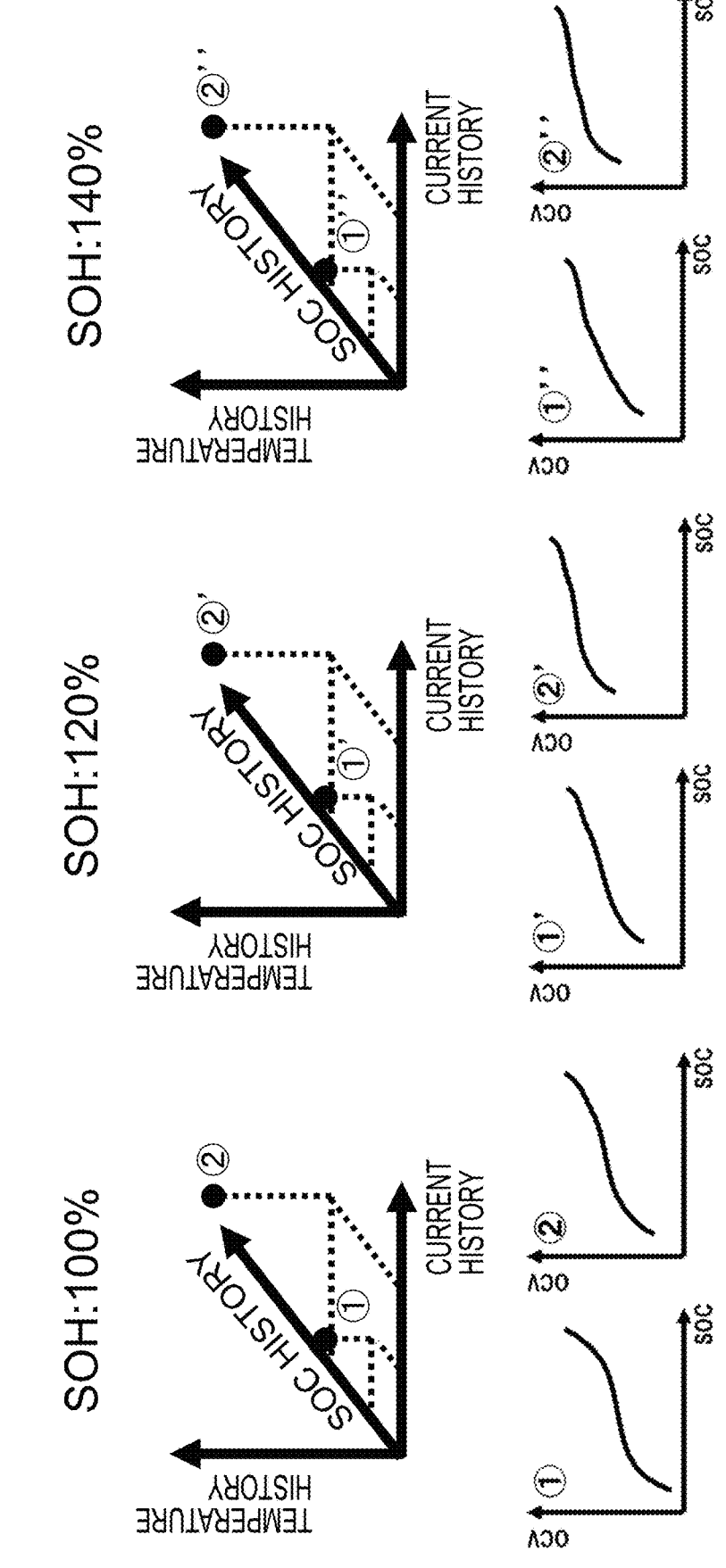
FIG. 23 is a diagram showing an example of the SOC-OCV characteristics of the SOC-OCV library according to the fourth embodiment of the present invention.

FIG. 23 is a diagram showing an example of the SOC-OCV characteristics of the SOC-OCV library 512c according to the fourth embodiment of the present invention. FIG. 23 shows that, in each case where the value of the SOH is 100%, 120%, 140%, . . . , respectively different SOC-OCV characteristics are stored in the SOC-OCV library 512c for each combination of values of the current history, the temperature history and the SOC history. Here, the SOC-OCV library 512c can be realized, for example, by conducting a degradation test of each single battery 111 by respectively changing the four conditions of the SOH, the current, the temperature, and the SOC and acquiring in advance the relationship of the SOC and the OCV when the degradation of each single battery 111 advances, and compiling a database of the relationship.

Note that, in the foregoing explanation, while a case was explained where the pattern calling unit 510c calls the SOC-OCV$_{pattern}$ corresponding to the state of health of the battery by using the SOH, the current history, the temperature history and the SOC history as the use history information of the battery, it is not necessary to use all of the foregoing information. In other words, the pattern calling unit 510c can call the SOC-OCV$_{pattern}$ corresponding to the state of health of the battery by using at least one piece of use history information of the battery among the SOH, the current history, the temperature history and the SOC history. Note that the SOC-OCV library 512c may store the SOC-OCV characteristics for each combination of information that is input to the pattern calling unit 510c as the use history information of the battery and used for the pattern determination in the pattern determination unit 511c. Here, the pattern calling unit 510 explained in the first embodiment corresponds to the case of using only the SOH as the use history information of the battery. Moreover, information other than the SOH, the current history, the temperature history and the SOC history may also be used as the use history information of the battery.

Figure 24:
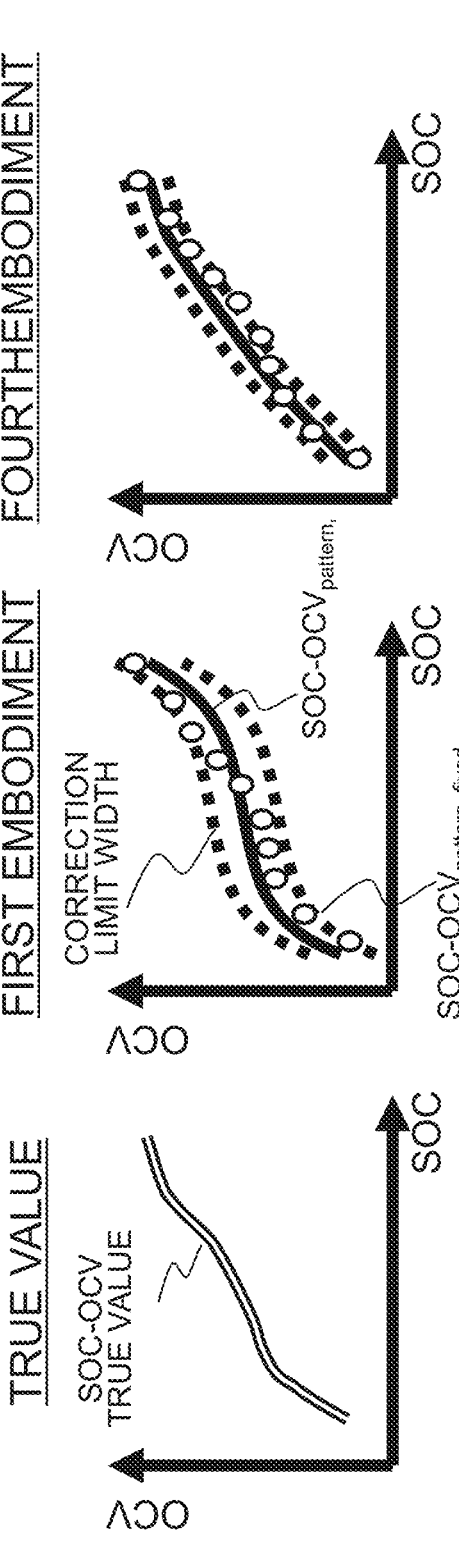
FIG. 24 is a diagram explaining the effect based on the fourth embodiment of the present invention in comparison to the effect of the first embodiment.

FIG. 24 is a diagram explaining the effect based on the fourth embodiment of the present invention in comparison to the effect of the first embodiment. Here, considered is a case where, in the first embodiment and the fourth embodiment, a different SOC-OCV$_{pattern}$ has been called as respectively shown in the center diagram and the right diagram of FIG. 24 relative to the SOC-OCV true value shown with a double line in the left diagram of FIG. 24.

In this embodiment, since a plurality of pieces of information are used as the use history information of the battery, the operating history of the battery can be captured in detail. Thus, as evident from FIG. 24, a SOC-OCV$_{pattern}$ that is closer to the SOC-OCV true value can be called in comparison to the first embodiment. Note that, since the SOC- OCV$_{pattern, fixed}$ is acquired from the SOC-OCV$_{pattern}$ with at least one point as the origin, generally speaking, these will not coincide if the SOC-OCV$_{pattern}$ is different. Accordingly, as shown in the respective points of the center diagram and the right diagram of FIG. 24, the SOC-OCV$_{pattern, fixed}$ is different in the first embodiment and in this embodiment.

In this embodiment, as a result of using a plurality of pieces of information as the use history information of the battery, it is possible to conduct a more detailed prediction of the degradation pattern, and call an SOC-OCV$_{pattern}$ that is closer to the true value. Thus, it is possible to set the correction limit width by reducing the estimation error margin of the degradation pattern, and cause the correction limit width to be narrow. Accordingly, even when an operational error occurs in which the points on the SOC-OCV$_{pattern, fixed}$ fall within the range of the correction limit width and the SOC-OCV$_{temp}$ is consequently overwritten in the first embodiment, this embodiment is able to prevent the overwriting of the SOC-OCV$_{temp}$. Consequently, this embodiment is able to obtain a more accurate SOC.

According to the fourth embodiment of the present invention explained above, the following operation and effect are yielded in addition to those explained in the first to third embodiments.

(8) As explained in FIG. 23 and FIG. 24, the pattern calling unit 510c calls the SOC-OCV$_{pattern}$ by using at least one among the state of health (SOH), the current history, the temperature history and the state of charge (SOC) history of the battery as the use history information of the battery. As a result of adopting the foregoing configuration, since it is possible to call a more appropriate SOC-OCV$_{pattern}$ according to the state of health of the battery, the SOC can be operated with a higher degree of accuracy.

Fifth Embodiment

The fifth embodiment of the present invention is now explained. The foregoing first to fourth embodiments explained an example of the direct detection correction unit 530 determining whether the SOC-OCV$_{pattern, fixed}$, which was obtained by correcting the SOC-OCV$_{pattern}$ based on the OCV and the SOC obtained based on direct detection, is within the correction limit width, and overwriting the SOC-OCV$_{temp}$ when the SOC-OCV$_{pattern, fixed}$ is within the correction limit width. Meanwhile, the following fifth embodiment explains a case of determining whether to overwrite the SOC-OCV$_{temp}$ by giving further consideration to the difference in comparison to the SOC-OCV$_{temp}$ being used in the present control.

FIG. 25 is a diagram showing the functional configuration of the SOC-OCV correction unit 151 according to the fifth embodiment of the present invention. The SOC-OCV correction unit 151 in this embodiment is configured in the same manner as the first embodiment other than the point of comprising a correction limit width designation unit 520d and a direct detection correction unit 530d in substitute for the correction limit width designation unit 520 and the direct detection correction unit 530, respectively.

As with the correction limit width designation unit 520 in the first embodiment, the correction limit width designation unit 520d calls and acquires the correction limit width corresponding to the degradation pattern of the battery among a plurality of correction limit widths stored in advance. The correction limit width designation unit 520d subsequently outputs, to the direct detection correction unit 530d, the acquired correction limit width as the correction limit width (pattern). In addition, the correction limit width designation unit 520$d$ outputs, as the correction limit width (previous value), the correction limit width when the SOC-OCV$_{temp}$ was overwritten in the previous processing. This correction limit width (previous value) is used as an index for detecting, in the direct detection correction unit 530$d$, the occurrence of a large fluctuation on a short-term basis due to a sensor error in the OCV and the SOC acquired based on direct detection or other reasons.

The direct detection correction unit 530$d$ corrects the SOC-OCV$_{pattern}$ output from the pattern calling unit 510 according to the correction limit width (pattern) and the correction limit width (previous value) designated by the correction limit width designation unit 520$d$ based on the current I and the OCV. The direct detection correction unit 530$d$ subsequently outputs the correction result as the SOC-OCV$_{temp}$.

Figure 26:
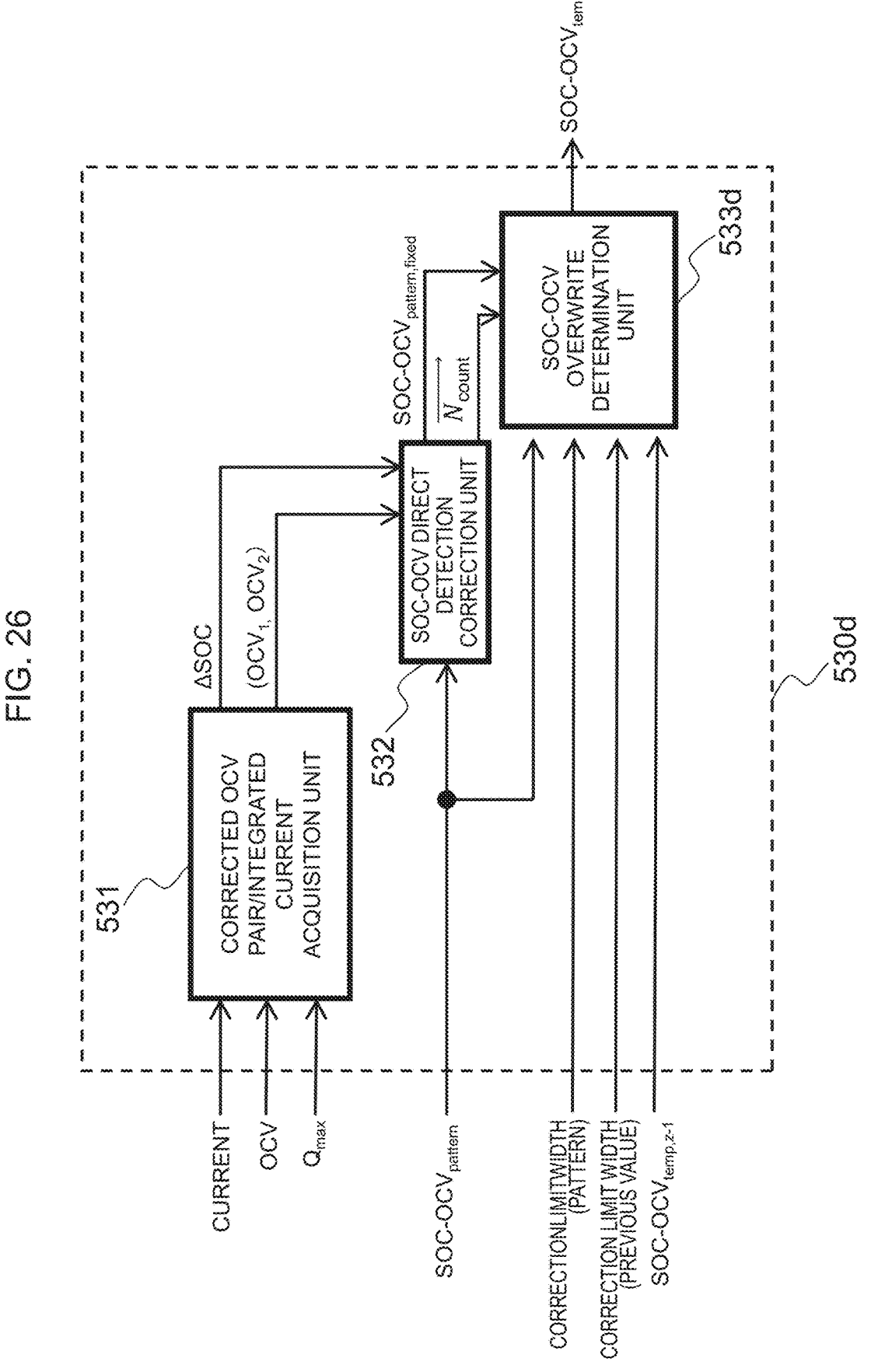
FIG. 26 is a diagram showing the functional configuration of the direct detection correction unit according to the fifth embodiment of the present invention.

FIG. 26 is a diagram showing the functional configuration of the direct detection correction unit 530$d$ according to the fifth embodiment of the present invention. The direct detection correction unit 530$d$ is configured in the same manner as the direct detection correction unit 530 explained in the first embodiment other than the point of comprising an SOC-OCV overwrite determination unit 533$d$ in substitute for the SOC-OCV overwrite determination unit 533.

The SOC-OCV overwrite determination unit 533$d$ determines the overwrite timing of the SOC-OCV characteristics by using the correction limit width (pattern) and the correction limit width (previous value) input from the correction limit width designation unit 520$d$, the sequence N$_{count}$ representing the correction count at the respective points input from the SOC-OCV direct detection correction unit 532, and the SOC-OCV$_{temp, z-1}$ as the value of the SOC-OCV$_{temp}$ in the previous processing. When it is determined that the overwrite timing has arrived, the SOC-OCV overwrite determination unit 533$d$ overwrites the SOC-OCV$_{temp}$ with the SOC-OCV$_{pattern, fixed}$ and outputs the result.

The SOC-OCV overwrite determination unit 533$d$ is now explained in detail with reference to the flowchart shown in FIG. 27. FIG. 27 is a flowchart showing the processing flow of the SOC-OCV correction unit 151 according to the fifth embodiment of the present invention.

In steps 601 to 609, the same processing as the flowchart of FIG. 12 explained in the first embodiment is performed. Here, in correction limit width determination step 609, the SOC-OCV overwrite determination unit 533$d$ performs the determination explained in the first embodiment by using the correction limit width (pattern) input from the correction limit width designation unit 520$d$. Consequently, the processing is advanced to step 619 when it is determined that the SOC-OCV$_{pattern, fixed}$ is within the range of the correction limit width (pattern), and the processing is advanced to step 610 when it is determined that the SOC-OCV$_{pattern, fixed}$ is outside the range of the correction limit width (pattern).

In previous correction limit width determination step 619, the SOC-OCV overwrite determination unit 533$d$ determines whether the SOC-OCV$_{pattern, fixed}$ is within the range of the correction limit width (previous value). Here, for example, upon substituting the OCV'$_{pattern, i}$ of Evaluation Formula (6) explained in the first embodiment with the OCV'$_{temp, z-1, i}$, with regard to a point on the SOC-OCV$_{pattern, fixed}$ and the intersection point of the perpendicular line drawn downward from such point and the line segment connecting two points on the SOC-OCV$_{temp, z-1}$, the squared difference of the OCV of these points is evaluated by being compared with the correction limit width (previous value) based on Evaluation Formula (7) below. Note that the value of the OCV'$_{temp, z-1, i}$ in Evaluation Formula (7) represents the value of the OCV of the foregoing intersection point.

[Math 7]

$$\sqrt{\left(OCV_{fixed,i} - OCV'_{temp,z-1,i}\right)^2} \leq 修正限界幅 \; (前回値) \qquad (7)$$

修正限界幅 (前回値): correction limit width (previous value)

When it is determined in step 619 that the SOC-OCV$_{pattern, fixed}$ is outside the range of the correction limit width (previous value), the processing is advanced to calculation reset step 610, the previously obtained values of the SOC-OCV$_{pattern, fixed}$ and the N$_{count}$ are reset in step 610, and the operation is thereafter re-performed from step 607. Meanwhile, the processing is advanced to subsequent step 611 when the SOC-OCV$_{pattern, fixed}$ is within the range of the correction limit width (previous value). In step 611 onward, the same processing as the flowchart of FIG. 12 explained in the first embodiment is performed.

In this embodiment, by performing the foregoing processing in step 619, whether the SOC-OCV$_{pattern, fixed}$ obtained based on direct detection has changed considerably from the SOC-OCV$_{temp, z-1}$; that is, the SOC-OCV$_{temp}$ obtained in the previous processing is determined. When the SOC-OCV$_{pattern, fixed}$ has changed considerably, it is determined that the SOC-OCV characteristic has fluctuated due to reasons that are not based on the state of the battery that arose from a sensor error or the like, and the processing is returned to step 607 and the operation is re-performed without executing SOC-OCV characteristic overwrite step 611. It is thereby possible to suppress the divergence of the operation result of the SOC even when the SOC-OCV characteristic changes suddenly in comparison to the first embodiment.

Note that, when the battery is not used for a long period, it is anticipated that the state of the battery will change considerably from the time that the previous processing was performed. Thus, when the elapsed time from the previous processing is longer than a predetermined threshold, the processing of step 619 may be omitted.

Figure 28:
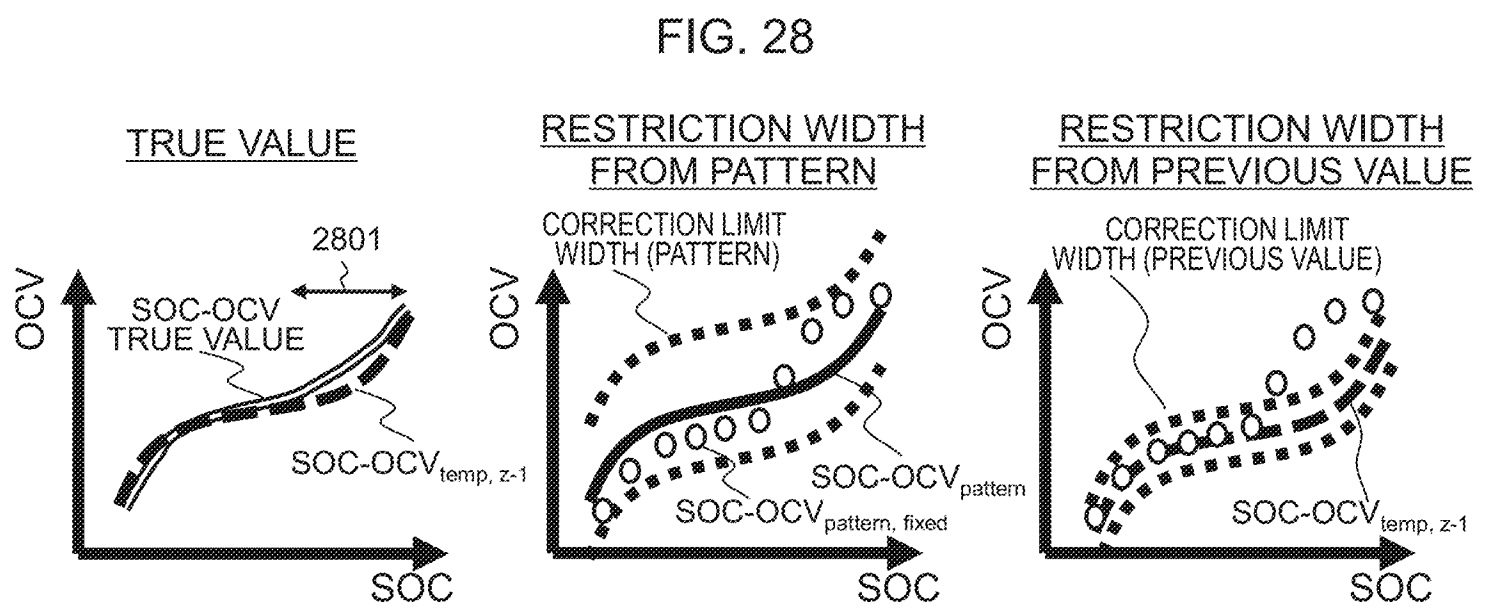

FIG. 28 is a diagram explaining the effect based on the fifth embodiment of the present invention. Here, considered is a case where the SOC-OCV characteristic shown with a broken line in the left diagram of FIG. 28 has been obtained in the previous processing relative to the SOC-OCV true value shown with a double line, and is used as the SOC-OCV$_{temp, z-1}$. Moreover, considered is a case where, in a region having a high SOC shown with reference numeral 2801 in the left diagram of FIG. 28, a combination of the OCV and the SOC having a higher OCV than the SOC-OCV$_{temp, z-1}$ has been detected as the SOC-OCV$_{pattern, fixed}$ as respectively shown with the respective points of the center diagram and right diagram of FIG. 28.

As shown in the center diagram of FIG. 28, when the points on the SOC-OCV$_{pattern, fixed}$ are within the range of the correction limit width (pattern), in the first to fourth embodiments, the correction of the SOC-OCV$_{pattern}$ is performed and the SOC-OCV$_{temp}$ is overwritten. Accordingly, if an OCV containing a gross error is detected in the foregoing region 2801 for some reason, the operational precision of the SOC in that region will deteriorate in comparison to the case of using the SOC-OCV$_{temp, z-1}$ obtained in the previous processing.

Meanwhile, in this embodiment, since the processing of step 619 explained in FIG. 27 is additionally performed, whether the points on the $\text{SOC-OCV}_{pattern,\ fixed}$ are within the range of the correction limit width (previous value) for the $\text{SOC-OCV}_{temp,\ z-1}$ is determined. Consequently, as shown in the right diagram of FIG. 28, when the points on the $\text{SOC-OCV}_{pattern,\ fixed}$ are outside the range of the correction limit width (previous value), the correction of the $\text{SOC-OCV}_{pattern}$ is not performed, and the $\text{SOC-OCV}_{temp}$ is not overwritten. Accordingly, this embodiment is able to improve the operational precision of the SOC.

According to the fifth embodiment of the present invention explained above, the following operation and effect are yielded in addition to those explained in the first to fourth embodiments.

(9) The correction limit width designation unit 520d designates the correction limit width (previous value) for prescribing the tolerance level of the correction to the $\text{SOC-OCV}_{temp,\ z-1}$, which is the $\text{SOC-OCV}_{temp}$ created by the direct detection correction unit 530d in the past (previously). As explained in FIG. 27 and FIG. 28, the direct detection correction unit 530d creates the $\text{SOC-OCV}_{temp}$ by using the correction limit width (pattern) designated by the correction limit width designation unit 520d for the present $\text{SOC-OCV}_{pattern}$, and the correction limit width (previous value) designated by the correction limit width designation unit 520d for the past $\text{SOC-OCV}_{temp,\ z-1}$. As a result of adopting the foregoing configuration, since it is possible to suppress the divergence of the operation result of the SOC even when the SOC-OCV characteristic changes suddenly due to a sensor error or other reasons, the SOC can be operated with a higher degree of accuracy.

Sixth Embodiment

The sixth embodiment of the present invention is now explained. The foregoing first to fifth embodiments explained an example of resetting the calculation result and re-performing the operation when the $\text{SOC-OCV}_{pattern,fixed}$, which was obtained from the OCV and the SOC obtained based on direct detection, is outside the range of the correction limit width. Meanwhile, the following sixth embodiment explains an example of determining that there was an error in the determination of the degradation pattern of the battery when the $\text{SOC-OCV}_{pattern,fixed}$ is converging outside the range of the correction limit width, and updating the operating history of the battery.

FIG. 29 is a diagram showing the functional configuration of the SOC-OCV correction unit 151 according to the sixth embodiment of the present invention. The SOC-OCV correction unit 151 in this embodiment is configured in the same manner as the first embodiment other than the point of comprising a direct detection correction unit 530e in substitute for the direct detection correction unit 530.

As with the direct detection correction unit 530 in the first embodiment, the direct detection correction unit 530e corrects the $\text{SOC-OCV}_{pattern}$ output from the pattern calling unit 510 according to the correction limit width designated by the correction limit width designation unit 520d based on the current I and the OCV. The direct detection correction unit 530e subsequently outputs the correction result as the $\text{SOC-OCV}_{temp}$. In addition, the direct detection correction unit 530e determines whether the $\text{SOC-OCV}_{pattern,\ fixed}$ determined to be outside the range of the correction limit width satisfies a predetermined convergence condition, and updates the operating history of the battery upon determining that the $\text{SOC-OCV}_{pattern,\ fixed}$ determined to be outside the range of the correction limit width satisfies a convergence condition.

Figure 30:
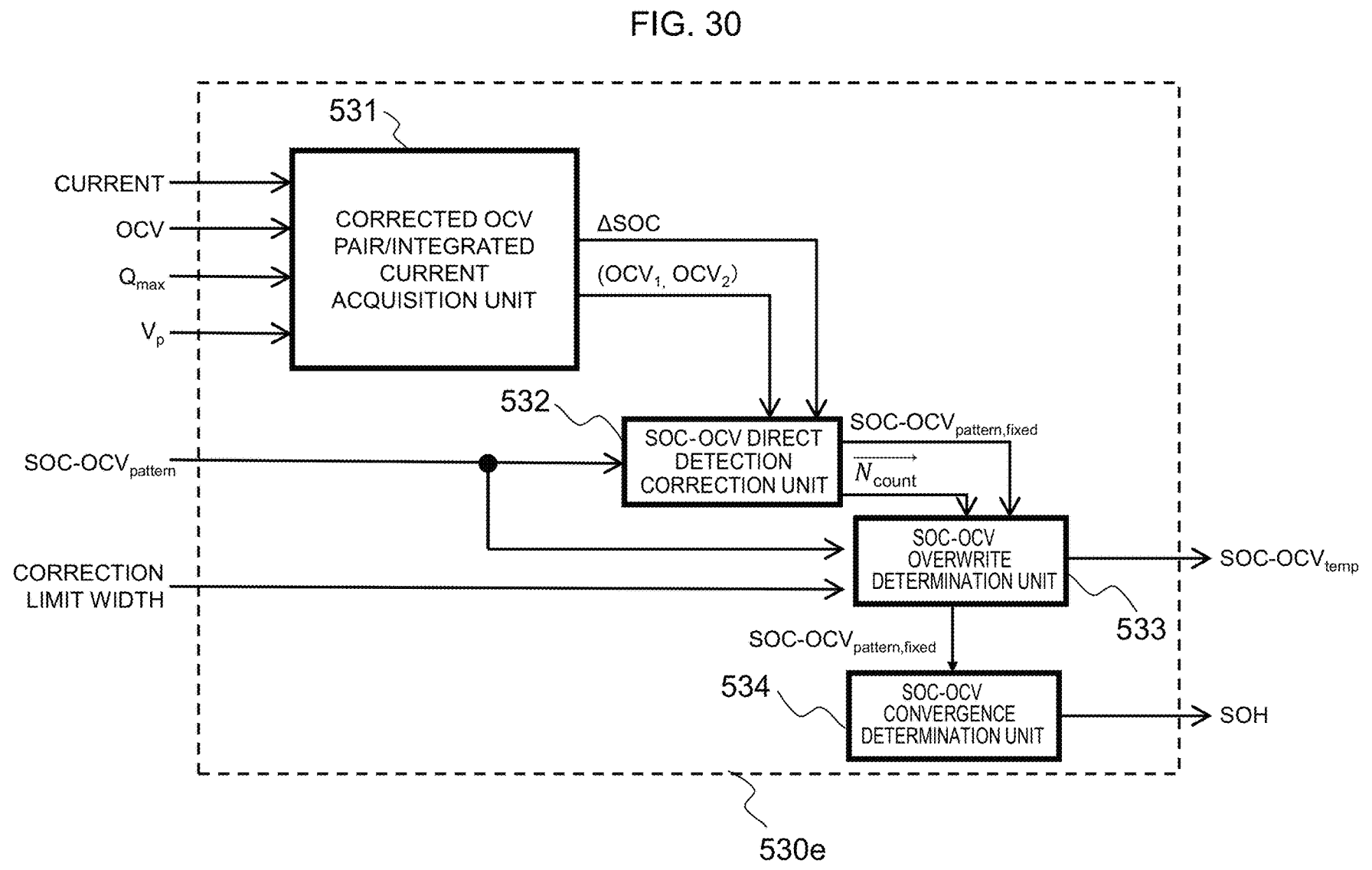

FIG. 30 is a diagram showing the functional configuration of the direct detection correction unit 530e according to the sixth embodiment of the present invention. The direct detection correction unit 530e is configured in the same manner as the direct detection correction unit 530 explained in the first embodiment other than the point of additionally comprising an SOC-OCV convergence determination unit 534.

Input to the SOC-OCV convergence determination unit 534 are, among the $\text{SOC-OCV}_{pattern,\ fixed}$ output from the SOC-OCV direct detection correction unit 532, those determined to be outside the range of the correction limit width by the SOC-OCV overwrite determination unit 533. The SOC-OCV convergence determination unit 534 stores the input $\text{SOC-OCV}_{pattern,\ fixed}$ a plurality of times, and determines whether these satisfy a predetermined convergence condition. When it is consequently determined that the convergence condition is satisfied, the SOC-OCV convergence determination unit 534 updates the SOH as the use history information of the battery based on the stored $\text{SOC-OCV}_{pattern,\ fixed}$, and outputs the updated SOH. Note that, as explained in the fourth embodiment, when information other than the SOH such as the current history, the temperature history, and the SOC history is to be used as the use history information of the battery, such information may also be updated.

Figure 31:
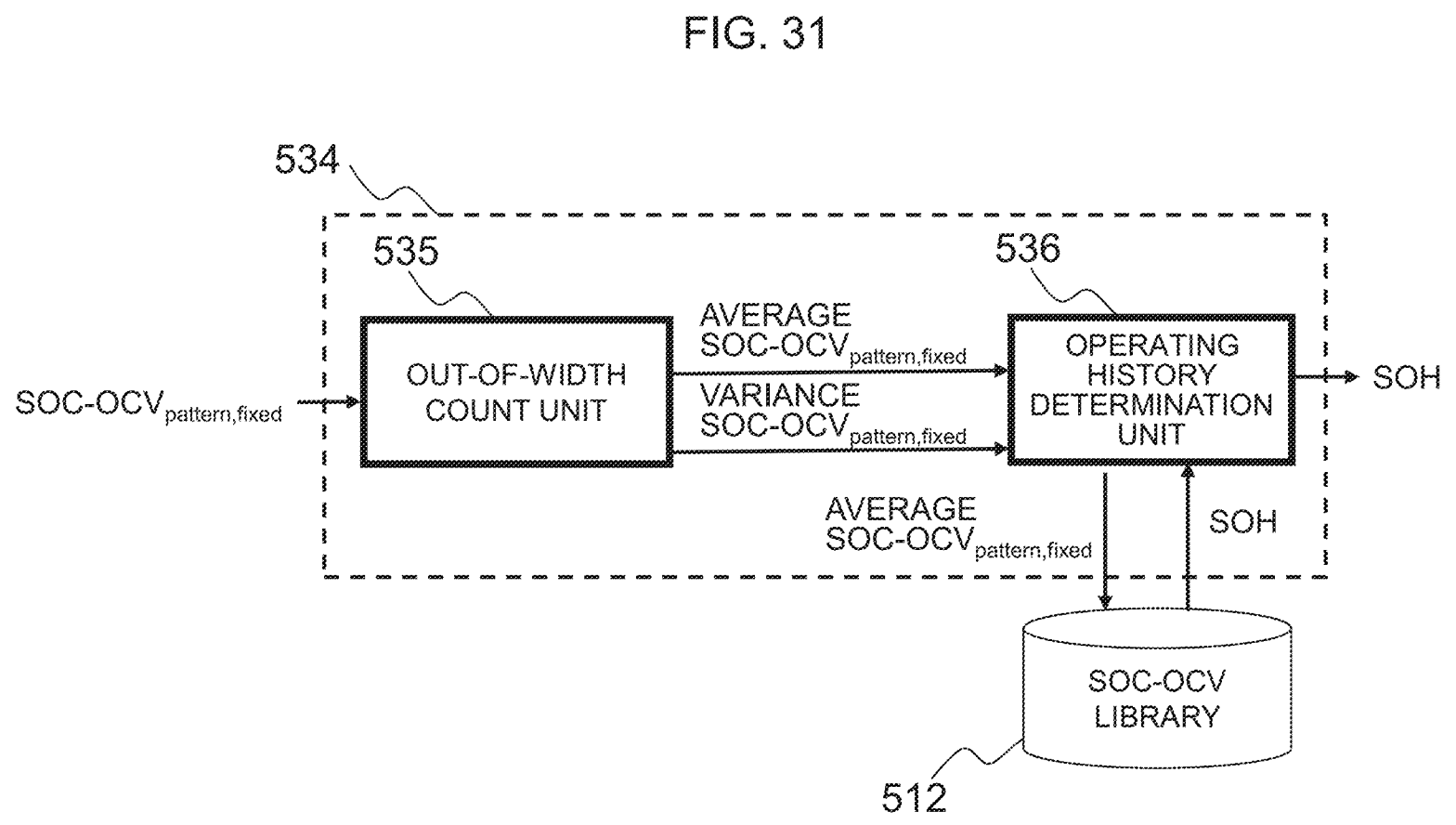

FIG. 31 is a diagram showing the functional configuration of the SOC-OCV convergence determination unit 534. The SOC-OCV convergence determination unit 534 includes an out-of-width count unit 535 and an operating history determination unit 536.

The out-of-width count unit 535 stores, a predetermined number of times, the immediate $\text{SOC-OCV}_{pattern,\ fixed}$ determined to be outside the range of the correction limit width by the SOC-OCV overwrite determination unit 533. The out-of-width count unit 535 subsequently counts the consecutive storage of the $\text{SOC-OCV}_{pattern,\ fixed}$; that is, the consecutive count $N_{error}$ in which the $\text{SOC-OCV}_{pattern,\ fixed}$ was determined to be outside the range of the correction limit width, and, when this consecutive count $N_{error}$ exceeds a predetermined threshold, the average and variance of previously stored multiple $\text{SOC-OCV}_{pattern,\ fixed}$ are calculated, and the respective calculation results thereof are output as the average $\text{SOC-OCV}_{pattern,\ fixed}$ and the variance $\text{SOC-OCV}_{pattern,\ fixed}$.

With the average $\text{SOC-OCV}_{pattern,\ fixed}$ and the variance $\text{SOC-OCV}_{pattern,\ fixed}$ calculated and output by the out-of-width count unit 535 as the inputs, the operating history determination unit 536 outputs the updated use history information (for example, SOH) of the battery based on the foregoing inputs. Specifically, the operating history determination unit 536 determines whether the variance $\text{SOC-OCV}_{pattern,\ fixed}$ is within a predetermined threshold and, when it is within the threshold, determines that the $\text{SOC-OCV}_{pattern,\ fixed}$ is converging outside the range of the correction limit width. The operating history determination unit 536 subsequently searches for the SOC-OCV characteristic that is most similar to the average $\text{SOC-OCV}_{pattern,fixed}$ from the SOC-OCV library 512, and outputs the SOH corresponding to that SOC-OCV characteristic as the updated use history information. Here, the search of the SOC-OCV characteristic that is most similar to the average $\text{SOC-OCV}_{pattern,\ fixed}$ can be performed, for example, based on the same method as Evaluation Formula (6) explained in the first embodiment. In other words, the SOC-OCV characteristic that is most similar to the average SOC-$OCV_{pattern,\ fixed}$ can be obtained by searching the SOC-OCV library 512 for the SOC-OCV characteristic in which the square sum of the OCV differences at the respective SOC points becomes smallest relative to the average SOC-$OCV_{pattern,\ fixed}$.

Figure 32:
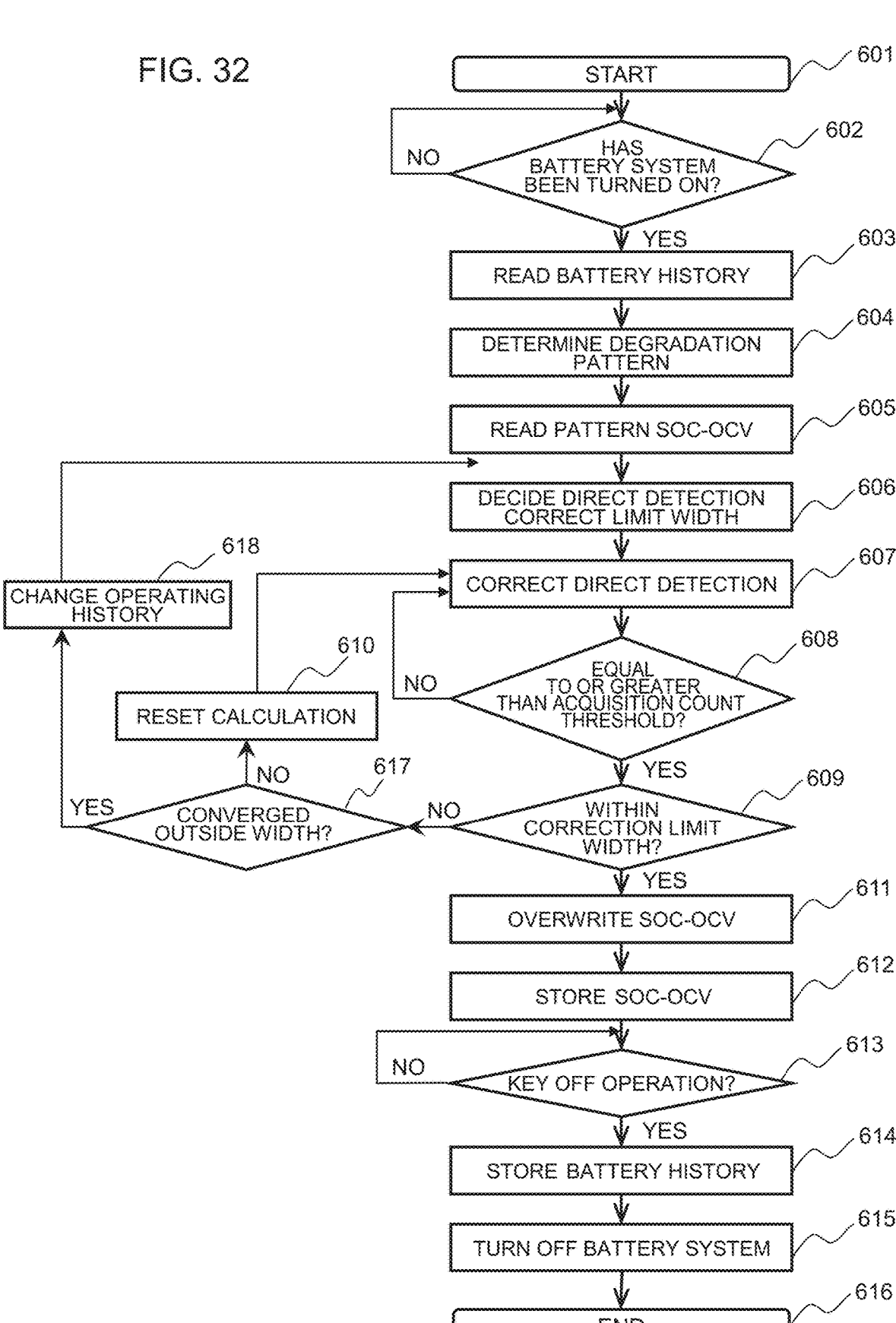
FIG. 32 is a flowchart showing the processing flow of the SOC-OCV correction unit according to the sixth embodiment of the present invention.

The SOC-OCV convergence determination unit 534 is now explained in detail with reference to the flowchart shown in FIG. 32. FIG. 32 is a flowchart showing the processing flow of the SOC-OCV correction unit 151 according to the sixth embodiment of the present invention.

In steps 601 to 609, the same processing as the flowchart of FIG. 12 explained in the first embodiment is performed. The processing is advanced to step 611 when it is determined in correction limit width determination step 609 that the $SOC\text{-}OCV_{pattern,\ fixed}$ is within the range of the correction limit width, and the processing is advanced to step 617 when it is determined in correction limit width determination step 609 that the $SOC\text{-}OCV_{pattern,\ fixed}$ is outside the range of the correction limit width. Upon proceeding to step 611, in step 611 onward, the same processing as the flowchart of FIG. 12 explained in the first embodiment is performed.

In convergence determination step 617, the out-of-width count unit 535 and the operating history determination unit 536 determine whether the $SOC\text{-}OCV_{pattern,\ fixed}$ has converged outside the range of the correction limit width. Here, convergence determination step 617 is performed using the convergence condition described above. In other words, the out-of-width count unit 535 compares the consecutive count $N_{error}$, which is the number of times that the $SOC\text{-}OCV_{pattern,\ fixed}$ Was consecutively determined as being outside the range of the correction limit width, with a predetermined threshold, and determines that the convergence condition has been satisfied when the consecutive count $N_{error}$ exceeds the threshold. Moreover, the operating history determination unit 536 compares the variance SOC-$OCV_{pattern,\ fixed}$ calculated by the out-of-width count unit 535 with a predetermined threshold, and determines that the convergence condition has been satisfied when the variance $SOC\text{-}OCV_{pattern,\ fixed}$ is within the threshold. Consequently, the processing is advanced to step 618 when the convergence condition is satisfied, and the processing is advanced to step 610 when the convergence condition is not satisfied. Upon advancing to step 610, the previously obtained values of the $SOC\text{-}OCV_{pattern,\ fixed}$ and the $N_{count}$ are reset in step 610, and the operation is thereafter re-performed from step 607.

In operating history change step 618, the operating history determination unit 536 changes the use history information representing the operating history of the battery. Here, as described above, the use history information is changed by searching for the SOC-OCV characteristic that is most similar to the average SOC-$OCV_{pattern,fixed}$ calculated by the out-of-width count unit 535 and outputting the SOH corresponding to that SOC-OCV characteristic. Once the change of the use history information is completed in step 618, the processing is returned to pattern SOC-OCV reading step 605, the SOC-OCV characteristic searched in step 618 is stored in the memory as the $SOC\text{-}OCV_{pattern}$, and the processing of step 606 onward is thereafter repeated.

In this embodiment, by performing the foregoing processing in step 617 and step 618, whether the SOC-$OCV_{pattern,\ fixed}$ is converging outside the range of the correction limit width is determined. Consequently, when the $SOC\text{-}OCV_{pattern,fixed}$ is converging outside the range of the correction limit width, it is determined that there was an error in the determination of the degradation pattern of the battery, and the operating history of the battery is updated. It is thereby possible to correct the estimation error of the degradation pattern of the battery while suppressing the divergence of the operation result of the SOC in comparison to the first embodiment. Moreover, as a result of adopting this method, it is possible to detect an unexpected degradation of the battery based on the difference between the degradation pattern of the battery determined from the operating history and the operating history anticipated from the $SOC\text{-}OCV_{pattern,\ fixed}$. Thus, it is possible to use this for determining the malfunction of a battery.

Figure 33:
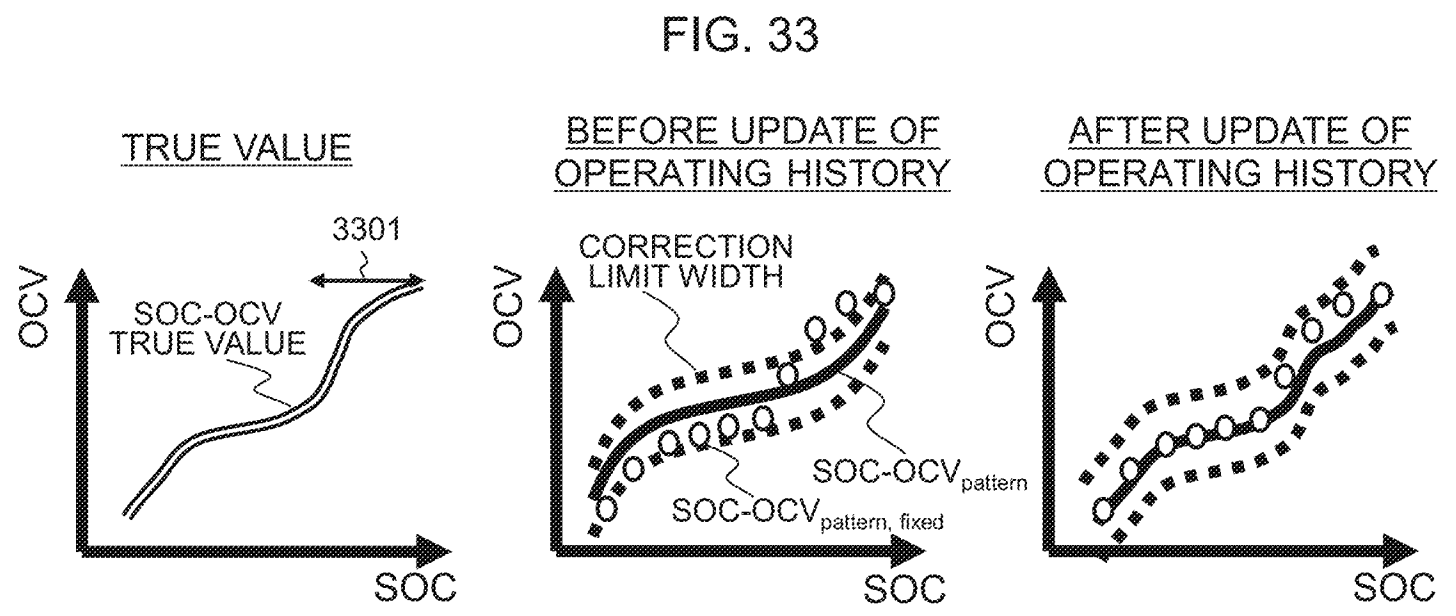

FIG. 33 is a diagram explaining the effect based on the sixth embodiment of the present invention. Here, considered is a case where, in a region having a high SOC shown with reference numeral 3301 in the left diagram of FIG. 33, a combination of the OCV and the SOC outside the range of the correction limit width has been detected as the SOC-$OCV_{pattern,\ fixed}$ relative to the SOC-OCV true value shown with a double line.

As shown in the center diagram of FIG. 33, when the points on the $SOC\text{-}OCV_{pattern,\ fixed}$ are outside the range of the correction limit width, in the first to fifth embodiments, the correction of the $SOC\text{-}OCV_{pattern}$ is not performed, and the $SOC\text{-}OCV_{temp}$ is not overwritten. Here, when the difference between the $SOC\text{-}OCV_{pattern}$ and the SOC-$OCV_{pattern,\ fixed}$ was not caused by a short-term fluctuation due to a measurement error or other reasons and was rather caused by a determination error of the degradation pattern caused by an error or insufficiency of the operating history of the battery, a negative determination will be repeatedly obtained in step 609 in FIG. 12 and FIG. 27. Consequently, the cycle of steps 607 to 610 will be repeated, and this may result in the suspension of the update of the $SOC\text{-}OCV_{temp}$.

Meanwhile, in this embodiment, when a negative determination is obtained in step 609, whether the SOC-$OCV_{pattern,\ fixed}$ has converged outside the range of the correction limit width is determined as a result of the processing of step 617 explained in FIG. 32 being performed. As a result of the processing of step 618 being additionally performed when it is determined that the SOC-$OCV_{pattern,\ fixed}$ has converged outside the range of the correction limit width, the operating history of the battery is updated based on the previously detected SOC-$OCV_{pattern,\ fixed}$. Consequently, as shown in the right diagram of FIG. 33, the $SOC\text{-}OCV_{pattern,\ fixed}$ will fall within the range of the correction limit width that was set according to the updated operating history, the $SOC\text{-}OCV_{temp}$ is updated, and the operation of the SOC can be continued.

Note that the $SOC\text{-}OCV_{pattern,\ fixed}$ is acquired with at least one point on the $SOC\text{-}OCV_{pattern}$ as the origin. Thus, generally speaking, the $SOC\text{-}OCV_{pattern,\ fixed}$ will not coincide before the update and after the update of the operating history. Accordingly, the SOC-OCV characteristic can be corrected based on the update of the operating history, and the operational precision of the SOC can thereby be improved.

According to the sixth embodiment of the present invention explained above, the following operation and effect are yielded in addition to those explained in the first to fifth embodiments.

(10) The direct detection correction unit 530e updates the use history information of the battery based on the $SOC\text{-}OCV_{pattern}$ after correction including parts outside the range of the correction limit width; that is, based on the $SOC\text{-}OCV_{pattern,\ fixed}$. Specifically, as explained in FIG. 32 and FIG. 33, the direct detection correction unit 530e determines whether the SOC-$OCV_{pattern,\ fixed}$ is within the range of the correction limit width (step 609), and, when the SOC-OCV$_{pattern, fixed}$ determined to be outside the range of the correction limit width satisfies a predetermined convergence condition (step 617: YES), updates the use history information of the battery (step 618). As a result of adopting the foregoing configuration, since the SOC-OCV characteristics can be corrected and the operation of the SOC can be continued even when the degradation pattern of the battery is erroneously determined, the operational precision of the SOC can be improved.

(11) The convergence condition used in the determination of step 617 includes at least one of either a first condition in which a number of times that the SOC-OCV$_{pattern, fixed}$ was continuously determined to be outside the range of the correction limit width is equal to or greater than a predetermined number of times, or a second condition in which a variance in the SOC-OCV$_{pattern, fixed}$ (variance SOC-OCV$_{pattern, fixed}$) is equal to or less than a predetermined threshold. As a result of adopting the foregoing configuration, it is possible to accurately determine whether the SOC-OCV$_{pattern, fixed}$ determined to be outside the range of the correction limit width satisfies a predetermined convergence condition.

Note that the respective embodiments and various modified examples explained above are merely examples, and the present invention is not limited to the subject matter thereof so as long as the features of the present invention are not impaired. Moreover, the respective embodiments explained above may also be used by being arbitrarily combined. In addition, while various embodiments and modified examples were explained above, the present invention is not limited to the subject matter thereof. Other modes considered to fall within the scope of the technical concept of the present invention are also included in the scope of the present invention.

The disclosure of the following priority application is incorporated herein by reference. Japanese Patent Application No. 2018-201527 (filed on Oct. 26, 2018)

REFERENCE SIGNS LIST

100: battery system
110: assembled battery
111: single battery
112: single battery group
120: single battery management unit
121: single battery control unit
122: voltage detection circuit
123: control circuit
124: signal input/output circuit
125: temperature detection unit
130: current detection unit
140: voltage detection unit
150: assembled battery control unit
151: SOC-OCV correction unit
152: SOC operation unit
153: OCV operation unit
154: capacity calculation unit
155: SOC operation system
160: signal communication means
170: insulation element
180: storage unit
200: vehicle control unit
300 to 330: relay
400: inverter
410: motor generator

420: charger
510, 510b, 510c: pattern calling unit
511, 511c: pattern determination unit
512, 512c: SOC-OCV library
520, 520a, 520b, 520d: correction limit width designation unit
521: correction limit width library
530, 530d, 530e: direct detection correction unit
531: corrected OCV pair/integrated current acquisition unit
532: SOC-OCV direct detection correction unit
533, 533d: SOC-OCV overwrite determination unit
534: SOC-OCV convergence determination unit
535: out-of-width count unit
536: operating history determination unit

The invention claimed is:

1. A battery control device which obtains a state of charge of a secondary battery from characteristics representing a relationship of a state of charge and a voltage of the secondary battery, comprising:

a calling circuit which calls a first characteristic among a plurality of the characteristics stored in advance based on use history information of the secondary battery;

a correction limit width designation circuit which designates a correction limit width for prescribing a tolerance level of correcting the first characteristic;

a direct detection correction circuit structured to acquire data indicative of a current value and a voltage value in the secondary battery and create a second characteristic in which the first characteristic has been corrected based on a current value and a voltage value of the secondary battery, wherein when the first characteristic after correction is outside a range of the correction limit width, the detection correction circuit limits the first characteristic after correction to be within the range of the correction limit width; and a control circuit structured to provide an instruction to an inverter coupled to the secondary battery to control at least one of a power input to or a power output from the secondary battery based on the state of charge, wherein the state of charge of the secondary battery is obtained using the second characteristic.

2. The battery control device according to claim 1, wherein the calling circuit calls the first characteristic by using at least one among a state of health, a current history, a temperature history and a state of charge history of the secondary battery as the use history information.

3. The battery control device according to claim 1, wherein the correction limit width designation circuit designates, as the correction limit width, a certain voltage width for each state of charge or a certain state of charge width for each voltage.

4. The battery control device according to claim 1, wherein the correction limit width designation circuit designates, as the correction limit width, a voltage width which differs for each predetermined state of charge or a state of charge width which differs for each predetermined voltage.

5. The battery control device according to claim 1, wherein the correction limit width designation circuit changes the correction limit width according to an operating history of the secondary battery.

6. The battery control device according to claim 5, wherein the correction limit width designation circuit changes the correction limit width according to the operating history of the secondary battery by selecting one correction limit width among a plurality of the correction limit widths stored in advance based on the first characteristic.

7. The battery control device according to claim 1, further comprising:

a voltage operation circuit which calculates an open voltage value and a polarization voltage value of the secondary battery based on a current value and a voltage value of the secondary battery, wherein the direct detection correction circuit acquires, a plurality of times within a predetermined time range, an open voltage value of the secondary battery when the current value and the polarization voltage value are respectively smaller than a predetermined threshold, and creates the second characteristic by using each of the acquired open voltage values, a current integrated value in an acquisition period of each of the open voltage values, and the first characteristic.

8. The battery control device according to claim 1, wherein:

the correction limit width designation circuit designates a second correction limit width for prescribing a tolerance level of correcting the second characteristic created in a past by the direct detection correction circuit; and the direct detection correction circuit creates the second characteristic by using the correction limit width designated by the correction limit width designation circuit for a present first characteristic and the second correction limit width designated by the correction limit width designation circuit for a past second characteristic.

9. The battery control device according to claim 1, wherein the direct detection correction circuit updates the use history information based on the first characteristic after correction including parts outside the range of the correction limit width.

10. The battery control device according to claim 9, wherein the direct detection correction circuit determines whether the first characteristic after correction is within the range of the correction limit width, and updates the use history information when the first characteristic after correction determined to be outside the range of the correction limit width satisfies a predetermined convergence condition.

11. The battery control device according to claim 10, wherein the convergence condition includes at least one of either a first condition in which a number of times that the first characteristic after correction was continuously determined to be outside the range of the correction limit width is equal to or greater than a predetermined number of times, or a second condition in which a variance in the first characteristic after correction is equal to or less than a predetermined threshold.

* * * * *